(12) United States Patent
Watanabe et al.

(10) Patent No.: US 6,312,869 B1
(45) Date of Patent: Nov. 6, 2001

(54) CHEMICALLY AMPLIFIED POSITIVE RESIST COMPOSITION, PATTERN FORMING METHOD, AND METHOD FOR PREPARING POLYMER HAVING A CROSSLINKING GROUP

(75) Inventors: Satoshi Watanabe; Osamu Watanabe, both of Nakakubiki-gun; Tomoyoshi Furihata, Usui-gun; Yoshihumi Takeda, Nakakubiki-gun; Shigehiro Nagura, Nakakubiki-gun; Toshinobu Ishihara, Nakakubiki-gun; Tsuguo Yamaoka, Funabashi, all of (JP)

(73) Assignee: Shin-Etsu Chemical, Co., Ltd., Tokyo (JP)

( * ) Notice: Subject to any disclaimer, the term of this patent is extended or adjusted under 35 U.S.C. 154(b) by 0 days.

(21) Appl. No.: 09/592,419

(22) Filed: Jun. 12, 2000

Related U.S. Application Data

(62) Division of application No. 09/302,304, filed on Apr. 30, 1999, which is a division of application No. 08/839,107, filed on Apr. 23, 1997, now Pat. No. 5,942,367.

(30) Foreign Application Priority Data

| Apr. 24, 1996 | (JP) | ................................................. 8-127930 |
| Nov. 25, 1996 | (JP) | ................................................. 8-329228 |
| Apr. 11, 1997 | (JP) | ................................................. 9-110395 |
| Apr. 11, 1997 | (JP) | ................................................. 9-110396 |

(51) Int. Cl.$^7$ ............................... G03F 7/039; G03F 7/30
(52) U.S. Cl. ..................... 430/270.1; 430/326; 430/905; 525/219; 525/298; 525/312; 525/333.3
(58) Field of Search ..................... 430/270.1, 905, 430/326, 219, 333.3; 525/298, 312

(56) References Cited

U.S. PATENT DOCUMENTS

| 4,678,737 | 7/1987 | Schneller et al. | 430/270.1 |
| 5,332,651 | 7/1994 | Dickinson et al. | 430/270.1 |
| 5,354,643 | 10/1994 | Cabrera et al. | 430/270.1 |
| 5,498,506 | 3/1996 | Wengenroth et al. | 430/270.1 |
| 5,679,496 | 10/1997 | Ohsawa et al. | 430/270.1 |
| 5,691,101 | 11/1997 | Ushirogouchi et al. | 430/270.1 |
| 5,712,078 | 1/1998 | Huang et al. | 430/270.1 |
| 5,731,125 | 3/1998 | Yamachika et al. | 430/270.1 |
| 5,736,296 | 4/1998 | Sato et al. | 430/905 |
| 5,849,808 | 12/1998 | Schacht et al. | 522/31 |
| 6,114,462 * | 9/2000 | Watanabe et al. | 525/298 |
| 6,136,502 * | 10/2000 | Satoshi et al. | 430/270.1 |
| 6,136,504 * | 10/2000 | Tan et al. | 430/270.1 |
| 6,156,477 * | 12/2000 | Motomi et al. | 430/270.1 |

\* cited by examiner

*Primary Examiner*—John S. Chu
(74) *Attorney, Agent, or Firm*—Millen, White, Zelano & Branigan, P.C.

(57) ABSTRACT

A chemically amplified positive resist composition contains (A) an organic solvent, (B) a base resin in the form of a polymer having at least one acid labile group and crosslinked within a molecule and/or between molecules with a crosslinking group having a C—O—C linkage, the polymer having a weight average molecular weight of 1,000–500,000, (C) a photoacid generator, (D) a basic compound, and (E) an aromatic compound having a group ≡C—COOH in a molecule. The composition has a high alkali dissolution contrast, high sensitivity and high resolution.

18 Claims, No Drawings

CHEMICALLY AMPLIFIED POSITIVE RESIST COMPOSITION, PATTERN FORMING METHOD, AND METHOD FOR PREPARING POLYMER HAVING A CROSSLINKING GROUP

This is a divisional, of prior application Ser. No. 09/302,304 filed Apr. 30, 1999; which is a divisional of application Ser. No. 08/839,107 filed Apr. 23, 1997 now U.S. Pat. No. 5,942,367.

BACKGROUND OF THE INVENTION

1. Field of the Invention

This invention relates to a chemically amplified positive resist composition having blended therein a base resin in the form of a polymer having at least one acid labile group and crosslinked within a molecule and/or between molecules with a crosslinking group having a C—O—C linkage, the resist composition having a high alkali dissolution contrast, high sensitivity and high resolution and being improved in reproducibility as a fine patterning material for use in the manufacture of LSIs. It also relates to a pattern forming method and a method for preparing a polymer useful as the base resin of such a resist composition.

2. Prior Art

As the LSI technology tends toward higher integration and higher speed, further refinement of pattern rules is required. Deep-ultraviolet lithography is regarded promising as the next generation of fine patterning technology. The deep-UV lithography is capable of working on the order of less than 0.5 μm and makes it possible to form a resist pattern having a side wall nearly perpendicular to the substrate if a less light absorbing resist material is used.

From this point of view, a number of chemically amplified positive working resist materials using acid catalysts were recently developed as disclosed in JP-B 27660/1990, JP-A 27829/1988, U.S. Pat. No. 4,491,628 and 5,310,619. These materials have high sensitivity, resolution and dry etching resistance and are promising as resist materials especially suited for deep-UV lithography.

Known chemically amplified positive working resist materials include a two-component system comprising a base resin and a photoacid generator and a three-component system comprising a base resin, a photoacid generator, and a dissolution controller having an acid labile group. For example, JP-A 115440/1987 discloses a resist composition comprising poly-4-tert-butoxystyrene and a photoacid generator. There are proposed analogous resist compositions. JP-A 223858/1991 discloses a two-component resist composition comprising a resin having a tert-butoxy group in a molecule and a photoacid generator. JP-A 211258/1992 discloses a two-component resist composition comprising a polyhydroxystyrene having a methyl, isopropyl, tert-butyl, tetrahydropyranyl or trimethylsilyl group and a photoacid generator. Further, JP-A 100488/1994 discloses a resist composition comprising a polydihydroxystyrene derivative such as poly(3,4-bis(2-tetrahydropyranyloxy)styrene), poly (3,4-bis(tert-butoxycarbonyloxy)styrene), and poly(3,5-bis (2-tetrahydropyranyloxy)styrene) and a photoacid generator.

However, the base resins used in these resist compositions have an acid labile group in their side chain.

If acid labile groups such as tert-butyl and tert-butoxycarbonyl groups are decomposable only with strong acid, decomposition of acid labile groups is retarded because they are deactivated through reaction with air-borne basic compounds. As a result, resist material tends to form a pattern of T-top profile. On the other hand, alkoxyalkyl groups such as ethoxyethyl are decomposable with weak acid. Base resins having such alkoxyalkyl groups are little influenced by air-borne basic compounds, but suffer from problems including significant thinning of the pattern shape with the lapse of time from exposure to heat treatment, low heat resistance due to the presence of bulky groups in a side chain, and unsatisfactory sensitivity and resolution. None of these resins have been fully acceptable in practice. There is a desire to overcome these problems.

It is noted that the polymer described in JP-A 305025/1996 aims to overcome the above-mentioned problems. Due to some restrictions on the preparation method, it is difficult to design a desired percent substitution of an acid labile group and a crosslinking group. The preparation method often results in formation of undesirable crosslinking groups as described in JP-A 253534/1996. More particularly, on the design of a resist composition, a variety of polymers having a varying alkali dissolution rate are required so as to comply with the type and amount of a particular photoacid generator and additive. It is also required to prepare such a polymer in a reproducible manner. The preparation method described in the above-cited patent reference is restricted with respect to the selection of an acid labile group and crosslinking group and the percent substitution thereof.

Under the circumstances, attention is now paid to crosslinked polymers as a base resin.

In the prior art, as typified by negative resist materials, crosslinking reaction is generally carried out by crosslinking a resin comprising hexamethoxymethylmelamine and polyvinyl phenol with an acid for insolubilizing the resin. That is, crosslinking reaction aims to insolubilize the resin. Where a resin is used as a positive resist material, however, the resin must be soluble in a solvent. Since conventional crosslinking reaction is to insolubilize resins, the crosslinked products cannot be used as a positive resist material.

For use as a positive resist material, exposed areas must become soluble. However, conventional crosslinking reaction with hexamethoxymethylmelamine, etc. cannot produce a resin which is decomposed to be alkali soluble.

Yamaoka et al. report in Polymers for Advanced Technologies, vol. 5, 499–506; and Chem. Mater., vol. 6, No. 10 (1994), 1854, that by heat crosslinking of a mixed system of a polyvinyl phenol derivative and a divinyl ether compound PAG, there are obtained products which are decomposable by exposure and thus suitable for use as a positive resist material. The heat crosslinking reaction between a polyvinyl phenol derivative and a divinyl ether compound, however, has several problems of a long reaction time, difficult control of a crosslinking rate, and unreacted divinyl ether compound as a residue.

As to crosslinking reaction of an acetal group, it is known to carry out reaction in the presence of an acid, vinyl ether compound, and diol. In this method, both crosslinking reaction and acetal-forming reaction of a side chain occur. It is impossible to select either one of the reactions. Because of the competitive reaction between crosslinking reaction and acetal-forming reaction of a side chain, it is very difficult to control a rate of reaction. It is also a problem that a crosslinked reaction product which is least decomposable with acid forms in this reaction process.

SUMMARY OF THE INVENTION

An object of the present invention is to provide a chemically amplified positive resist composition which is improved in sensitivity, resolution, latitude of exposure, and process adaptability over the conventional resist compositions and forms a heat resistant resist pattern.

Another object of the present invention is to provide a method for preparing a polymer which is soluble in solvents, has an acid labile group and a crosslinking group in a controlled percent substitution, and is thus suitable as a base resin of a chemically amplified positive resist composition.

We have found that a novel polymer bearing at least one acid labile group, crosslinked within a molecule and/or between molecules with a crosslinking group having a C—O—C linkage, and having a weight average molecular weight of 1,000 to 500,000 can be produced by a method to be described later and is useful as a base resin. By blending this novel polymer as a base resin with a photoacid generator, a basic compound, and an aromatic compound having a group ≡C—COOH in a molecule, there is obtained a chemically amplified positive resist composition which is improved in that the dissolution contrast of a resist film is increased, especially a dissolution rate after exposure is increased, the resist is improved in PED stability, and edge roughness on a nitride film substrate is improved. By blending an acetylene alcohol derivative, the resist composition is improved in coating and storage stability, forms resists having high resolution, improved latitude of exposure, and improved process adaptability, and is well suited for practical use and advantageously used in precise fine patterning, especially in ultra-LSI manufacture.

In a first aspect, the present invention provides chemically amplified positive resist compositions as defined below.

(I) A chemically amplified positive resist composition comprising (A) an organic solvent,
(B) a base resin in the form of a polymer having at least one acid labile group and crosslinked within a molecule and/or between molecules with a crosslinking group having a C—O—C linkage, the polymer having a weight average molecular weight of 1,000 to 500,000,
(C) a photoacid generator,
(D) a basic compound, and
(E) an aromatic compound having a group ≡C—COOH in a molecule.

(II) The resist composition of (I) wherein said base resin (B) is a polymer having recurring units of the following general formula (1), wherein the hydrogen atom of some phenolic hydroxyl groups is replaced by at least one acid labile group, the polymer is crosslinked within a molecule and/or between molecules with a crosslinking group having a C—O—C linkage resulting from reaction between some of the remaining phenolic hydroxyl groups and an alkenyl ether compound or a halogenated alkyl ether compound, the amount of said acid labile group and said crosslinking group combined is on the average more than 0 mol % to 80 mol % of the entire hydrogen atoms of phenolic hydroxyl groups in formula (1), the polymer having a weight average molecular weight of 1,000 to 500,000,

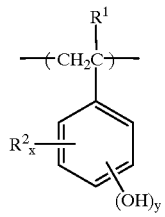

(1)

wherein $R^1$ is a hydrogen atom or methyl group, $R^2$ is a normal, branched or cyclic alkyl group having 1 to 8 carbon atoms, letter x is 0 or a positive integer, and y is a positive integer satisfying $x+y\leq 5$.

(III) The resist composition of (II) wherein said base resin (B) is a polymer having recurring units of the following general formula (2), wherein the polymer is crosslinked within a molecule and/or between molecules with a crosslinking group having a C—O—C linkage resulting from reaction between a phenolic hydroxyl group represented by R and an alkenyl ether compound or a halogenated alkyl ether compound, the amount of said acid labile group and said crosslinking group combined is on the average more than 0 mol % to 80 mol % of the entire hydrogen atoms of phenolic hydroxyl groups in formula (1), the polymer having a weight average molecular weight of 1,000 to 500,000,

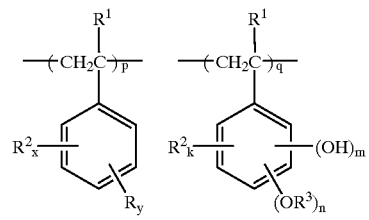

(2)

wherein R is a hydroxyl group or $OR^3$ group, at least one of R groups is a hydroxyl group, $R^1$ is a hydrogen atom or methyl group, $R^2$ is a normal, branched or cyclic alkyl group having 1 to 8 carbon atoms, $R^3$ is an acid labile group, letter x is 0 or a positive integer, y is a positive integer satisfying $x+y\leq 5$, k is 0 or a positive integer, m is 0 or a positive integer, n is a positive integer satisfying $k+m+n\leq 5$, p and q are positive numbers satisfying $p+q=1$. When n is 2 or more, $R^3$s may be identical or different.

(IV) The resist composition of (III) wherein said base resin (B) is a polymer having recurring units of the following general formula (3), wherein the polymer is crosslinked within a molecule and/or between molecules through the mechanism that hydrogen atoms are eliminated from phenolic hydroxyl groups represented by R to leave oxygen atoms which are connected by a crosslinking group having a C—O—C linkage of the following general formula (4a) or (4b), the amount of said acid labile group and said crosslinking group combined is on the average more than 0 mol % to 80 mol % of the entire hydrogen atoms of phenolic hydroxyl groups in formula (1), the polymer having a weight average molecular weight of 1,000 to 500,000,

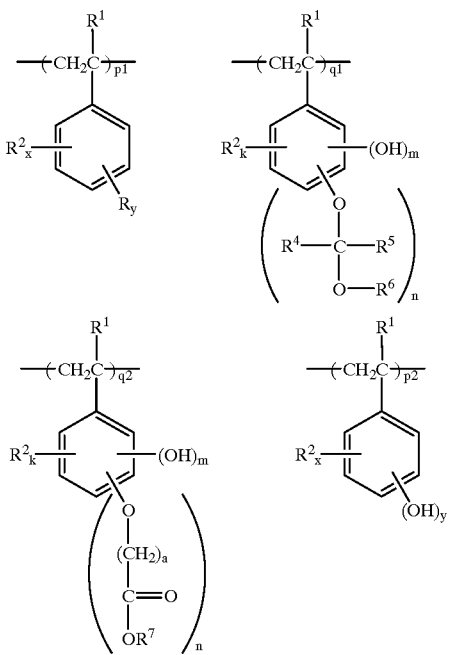

(3)

wherein R is a hydroxyl group or $OR^3$ group, at least one of R groups is a hydroxyl group, $R^1$ is a hydrogen atom or methyl group, $R^2$ is a normal, branched or cyclic alkyl group having 1 to 8 carbon atoms, $R^3$ is an acid labile group, $R^4$ and $R^5$ each are a hydrogen atom or normal, branched or cyclic alkyl group having 1 to 8 carbon atoms, $R^6$ is a monovalent hydrocarbon group of 1 to 18 carbon atoms which may have a hetero atom, or $R^4$ and $R^5$, $R^4$ and $R^6$, and $R^5$ and $R^6$, taken together, may form a ring, with the proviso that $R^4$, $R^5$ and $R^6$ each are a normal or branched alkylene having 1 to 8 carbon atoms when they form a ring, $R^7$ is a tertiary alkyl group having 4 to 12 carbon atoms, letters p1 and p2 each are a positive number, q1 and q2 each are 0 or a positive number, satisfying $0<p1/(p1+q1+q2+p2)\leq0.8$, $0\leq q1/(p1+q1+q2+p2)\leq0.8$, $0\leq q2/(p1+q1+q2+p2)\leq0.8$, and $p1+q1+q2+p2=1$, q1 and q2 are not equal to 0 at the same time, a is 0 or a positive integer of 1 to 6, x, y, k, m, and n are as defined above,

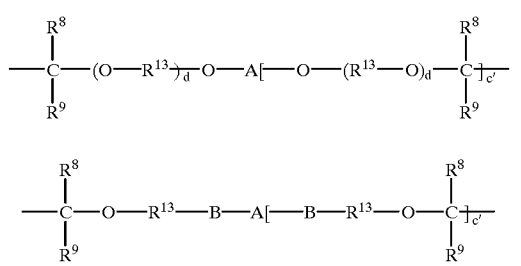

wherein $R^8$ and $R^9$ each are a hydrogen atom or normal, branched or cyclic alkyl group having 1 to 8 carbon atoms, or $R^8$ and $R^9$, taken together, may form a ring, with the proviso that $R^8$ and $R^9$ each are a normal or branched alkylene having 1 to 8 carbon atoms when they form a ring, $R^{13}$ is a normal or branched alkylene having 1 to 10 carbon atoms, A is a c-valent aliphatic saturated hydrocarbon, alicyclic saturated hydrocarbon, aromatic hydrocarbon or heterocyclic group having 1 to 50 carbon atoms, which may have an intervening hetero atom and in which some of the hydrogen atoms attached to carbon atoms may be replaced by hydroxyl groups, carboxyl groups, carbonyl groups or fluorine atoms, B is —CO—O—, —NHCO—O— or —NHCONH—, letter c is an integer of 2 to 8, c' is an integer of 1 to 7, and d is 0 or an integer of 1 to 10.

(V) The resist composition of (IV) wherein c' in formula (4a) or (4b) is 1 or 2.

(VI) The resist composition of any one of (I) to (V) wherein component (C) is an onium salt, a diazomethane derivative or a mixture thereof.

(VII) The resist composition of any one of (I) to (VI) wherein component (D) is an aliphatic amine.

(VIII) The resist composition of any one of (I) to (VII) further comprising (F) another base resin in the form of a polymer having recurring units of the following general formula (1), wherein the hydrogen atom of a phenolic hydroxyl group is partially replaced by at least one acid labile group in an average proportion of more than 0 mol % to 80 mol % of the entire phenolic hydroxyl groups, the polymer having a weight average molecular weight of 3,000 to 300,000,

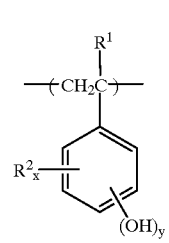

(1)

wherein $R^1$ is a hydrogen atom or methyl group, $R^2$ is a normal, branched or cyclic alkyl group having 1 to 8 carbon atoms, letter x is 0 or a positive integer, and y is a positive integer satisfying $x+y\leq5$.

(IX) The resist composition of any one of (I) to (VIII) wherein component (F) is a polymer having recurring units represented by the following general formula (10) and having a weight average molecular weight of 3,000 to 300,000,

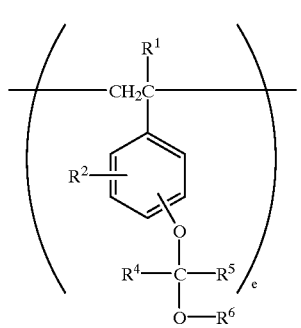

(10)

-continued

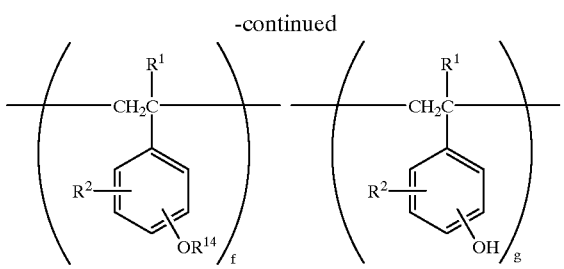

wherein $R^1$, $R^2$, $R^4$, $R^5$, and $R^6$ are as defined above, $R^{14}$ is an acid labile group different from $-CR^4R^5OR^6$, letters e and f each are 0 or a positive number, g is a positive number satisfying $e+f+g=1$, $0 \leq e/(e+f+g) \leq 0.5$ and $0.4 \leq g/(e+f+g) \leq 0.9$.

(X) The resist composition of any one of (I) to (IX) further comprising (G) a dissolution controller.

(XI) The resist composition of any one of (I) to (X) further comprising (H) a UV absorber.

(XII) The resist composition of any one of (I) to (XI) further comprising (I) an acetylene alcohol derivative.

The invention also provides a pattern forming method.

(XIII) A method for forming a resist pattern comprising the steps of:
  (i) applying a chemically amplified positive resist composition according to any one of claims 1 to 12 onto a substrate,
  (ii) heat treating the coated film and then exposing it to actinic radiation having a wavelength of up to 300 nm or electron beams through a photo mask, and
  (iii) optionally heat treating the exposed film and developing it with a developer.

When a polymer as defined above is blended in a resist composition as a base resin, advantages of a significant dissolution inhibitory effect and a greater dissolution contrast after exposure are obtained especially by virtue of crosslinking through a crosslinking group having a C—O—C linkage.

In the case of a polymer having an alkoxyalkyl group attached simply to a side chain, formation of a T-top profile is avoided because deblocking reaction takes place with weak acid. However, since the polymer is sensitive to acid, the pattern configuration is significantly thinned with the lapse of time from exposure to heat treatment. Since the alkali dissolution inhibitory effect is low, a high substitution product must be used to insure dissolution contrast at the sacrifice of heat resistance. On the other hand, a polymer wherein a phenolic hydroxyl group on a side chain is protected with a tert-butoxycarbonyl group, when blended in a resist material, has advantages that the alkali dissolution inhibitory effect is improved, a high dissolution contrast is obtained with a low degree of substitution, and heat resistance is good. In order to eliminate the protective group to render the polymer alkali soluble, a photoacid generator capable of generating a strong acid such as trifluoromethanesulfonic acid is necessary. The use of such acid leads to the undesirable tendency to form a T-top profile.

In contrast to these polymers, a polymer crosslinked within a molecule and/or between molecules with a crosslinking group having a C—O—C linkage as obtained by reacting some phenolic hydroxyl groups with an alkenyl ether compound or halogenated alkyl ether compound is advantageous in that a resist composition having the crosslinked polymer blended therein overcomes the drawback of low heat resistance of a polymer having a side chain protected with an acetal group and the drawback of T-top profile forming tendency of a polymer protected with a tert-butoxycarbonyl group.

The polymer used in the chemically amplified positive resist composition according to the invention has further advantages. Since the inventive polymer is crosslinked with a crosslinking group having an acid labile C—O—C linkage and protected with an acid labile group, unexposed areas of a resist film remain unchanged with respect to weight average molecular weight and solubility in alkaline developer whereas the weight average molecular weight of exposed areas is restored to the weight average molecular weight of alkali soluble base resin prior to crosslinking and protection with the acid labile group through decomposition by the generated acid and further through elimination of the acid labile group. Then the rate of alkali dissolution in the exposed areas is significantly increased as compared with the unexposed areas, resulting in an increased dissolution contrast. As a consequence, high resolution is achieved.

When a crosslinking group having a C—O—C linkage is decomposed with an acid, alcohol compounds (including diol, triol and polyol compounds) are formed. Hydrophilic groups of alcohol compounds improve affinity to alkali developer. As a consequence, high resolution is achieved.

Further, on the design of a resist composition, a variety of polymers having a varying alkali dissolution rate are required so as to comply with the type and amount of a particular photoacid generator and additive. It is also required to prepare such a polymer in a reproducible manner. The use of the inventive polymer allows a freedom of design by eliminating the limit on the selection of an acid labile group and crosslinking group and the limit on a degree of substitution.

More specifically, a chemically amplified positive resist composition using the inventive polymer as a base resin minimizes the problems of T-top profile forming tendency, pattern configuration thinning and low heat resistance found in the prior art and increases the dissolution contrast of a resist film. As a consequence, the chemically amplified positive resist composition has high sensitivity, high resolution, allows the size and configuration of a pattern to be controlled in terms of composition, and offers improved process adaptability and reproducibility.

We have also found an effective method for preparing a polymer having a crosslinking group as defined above. By reacting an alkali soluble polymer comprising recurring units of the following general formula (1') and having a weight average molecular weight of 1,000 to 500,000 with an alkenyl ether compound of the following general formula (8a) or (9a) or a halogenated alkyl ether compound of the following general formula (8b) or (9b), there can be obtained a crosslinked polymer of the general formula (7a) or (7b) wherein phenolic hydroxyl groups of the polymer of formula (1') are crosslinked within a molecule and/or between molecules with a crosslinking group represented by Q. This crosslinking group is eliminated with an acid to form an alkali soluble polymer of formula (1'). By properly determining the amount of the alkenyl ether compound or halogenated alkyl ether compound used, the amount of the acid labile crosslinking group introduced into the polymer of formula (1') can be easily controlled. The problems of the prior art are solved in this way. Along with the introduction of the acid labile crosslinking group, a compound of the following general formula (10a) can be concurrently reacted to thereby introduce an acid labile group of the following general formula (11). Then a polymer having a crosslinking group and an acid labile group of the following general formula (5a) or (5b) can be obtained by a simple procedure. Further a polymer having the above-mentioned crosslinking group and various acid labile groups can be obtained in an industrially advantageous manner.

In a second aspect, the present invention provides methods for preparing polymers as defined below.

(XIV) A method for preparing a polymer having recurring units of the general formula (5a) or (5b), comprising the step of reacting a polymer comprising recurring units of the following general formula (1') and having a weight average molecular weight of 1,000 to 500,000 with an alkenyl ether compound of the following general formula (8a) or (9a) and a compound of the following general formula (10a),

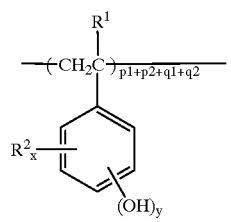
(1')

wherein $R^1$ is a hydrogen atom or methyl group, $R^2$ is a normal, branched or cyclic alkyl group having 1 to 8 carbon atoms, letter x is 0 or a positive integer and y is a positive integer satisfying $x+y \leq 5$, p1 and p2 each are a positive number, q1 and q2 each are 0 or a positive number satisfying $0 < p1/(p1+q1+q2+p2) \leq 0.8$, $0 \leq q1/(p1+q1+q2+p2) \leq 0.8$, $0 \leq q2/(p1+q1+q2+p2) \leq 0.8$, and $p1+q1+q2+p2=1$, q1 and q2 are not equal to 0 at the same time,

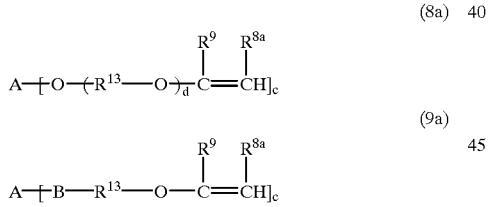
(8a)
(9a)

wherein $R^{8a}$ is a hydrogen atom or normal, branched or cyclic alkyl group having 1 to 7 carbon atoms, $R^9$ is a hydrogen atom or normal, branched or cyclic alkyl group having 1 to 8 carbon atoms, or $R^{8a}$ and $R^9$, taken together, may form a ring with the proviso that $R^{8a}$ is a normal or branched alkylene group having 1 to 7 carbon atoms and $R^9$ is a normal or branched alkylene group having 1 to 8 carbon atoms when they form a ring, $R^{13}$ is a normal or branched alkylene group having 1 to 10 carbon atoms, A is a c-valent aliphatic saturated hydrocarbon, alicyclic saturated hydrocarbon, aromatic hydrocarbon or heterocyclic group having 1 to 50 carbon atoms, which may have an intervening hetero atom and in which some of the hydrogen atoms attached to carbon atoms may be replaced by hydroxyl groups, carboxyl groups, carbonyl groups or fluorine atoms, B is —CO—O—, —NHCO—O— or —NHCONH—, letter c is an integer of 2 to 8, and d is 0 or an integer of 1 to 10,

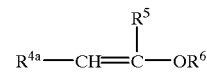
(10a)

wherein $R^{4a}$ is a hydrogen atom or normal, branched or cyclic alkyl group having 1 to 7 carbon atoms, $R^5$ is a hydrogen atom or normal, branched or cyclic alkyl group having 1 to 8 carbon atoms, $R^6$ is a monovalent hydrocarbon group of 1 to 18 carbon atoms which may have a hetero atom, or $R^{4a}$ and $R^5$, $R^{4a}$ and $R^6$, and $R^5$ and $R^6$, taken together, may form a ring with the proviso that $R^{4a}$ is a normal or branched alkylene group having 1 to 7 carbon atoms and $R^5$ and $R^6$ each are a normal or branched alkylene group having 1 to 8 carbon atoms when they form a ring, the hydrogen atoms of some phenolic hydroxyl groups in the polymer of formula (1') being reacted with p1 mol of the compound of formula (8a) or (9a) and q1 mol of the compound of formula (10a) per mol of the entire phenolic hydroxyl groups in the polymer of formula (1'), thereby forming a polymer having recurring units of the general formula (5a) or (5b): is a positive integer satisfying m+n=y, and p1, p2, q1, and q2 are as defined above. Q is a group represented by the above formula (4a) or (4b).

(XV) A method for preparing a polymer having recurring units of the general formula (5a) or (5b), comprising the step of reacting a polymer comprising recurring units of the following general formula (1') and having a weight average molecular weight of 1,000 to 500,000 with a halogenated alkyl ether compound of the following general formula (8b) or (9b) and a compound of the following general formula (10b),

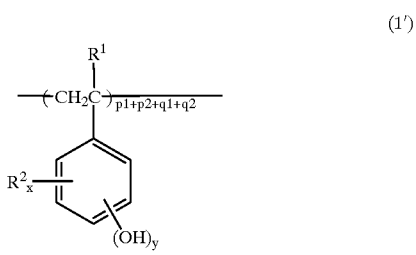
(1')

wherein $R^1$, $R^2$, x, y, p1, p2, q1, and q2 are as defined above,

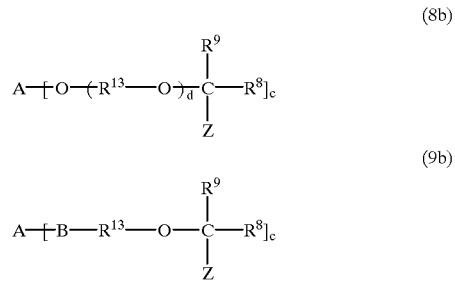
(8b)
(9b)

wherein $R^8$, $R^9$, $R^{13}$, A, B, c, and d are as defined above, and Z is a halogen atom,

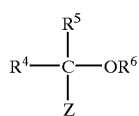

wherein $R^4$, $R^5$, $R^6$, and Z are as defined above,
the hydrogen atoms of some phenolic hydroxyl groups in the polymer of formula (1') being reacted with p1 mol of the compound of formula (8b) or (9b) and q1 mol of the compound

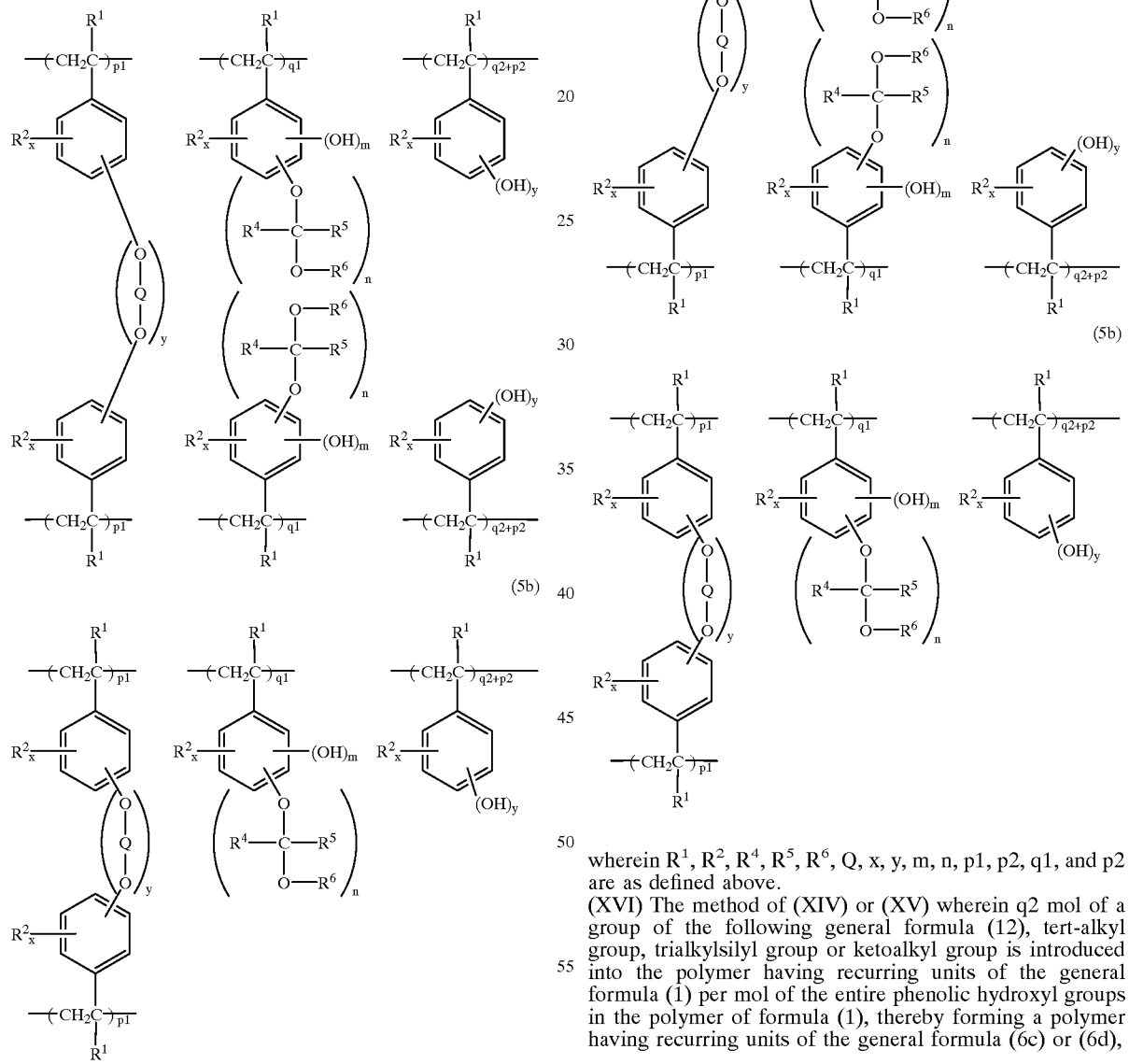

integer, n of formula (10b) per mol of the entire phenolic hydroxyl groups in the polymer of formula (1'), thereby forming a polymer having recurring units of the general formula (5a) or (5b):

wherein $R^1$, $R^2$, $R^4$, $R^5$, $R^6$, Q, x, y, m, n, p1, p2, q1, and p2 are as defined above.

(XVI) The method of (XIV) or (XV) wherein q2 mol of a group of the following general formula (12), tert-alkyl group, trialkylsilyl group or ketoalkyl group is introduced into the polymer having recurring units of the general formula (1) per mol of the entire phenolic hydroxyl groups in the polymer of formula (1), thereby forming a polymer having recurring units of the general formula (6c) or (6d),

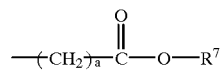

wherein $R^1$ and $R^2$ are as defined above, $R^4$ is a hydrogen atom or normal, branched or cyclic alkyl group having 1 to 8 carbon atoms, $R^5$ and $R^6$ are as defined above, or $R^4$ and $R^5$, $R^4$ and $R^6$, and $R^5$ and $R^6$, taken together, may form a ring, with the proviso that $R^4$, $R^5$ and $R^6$ each are a normal or branched alkylene having 1 to 8 carbon atoms when they form a ring, x and y are as defined above, m is 0 or a positive wherein $R^7$ is a hydrogen atom or tertiary alkyl group having 4 to 12 carbon atoms, and letter a is 0 or an integer of 1 to 6,

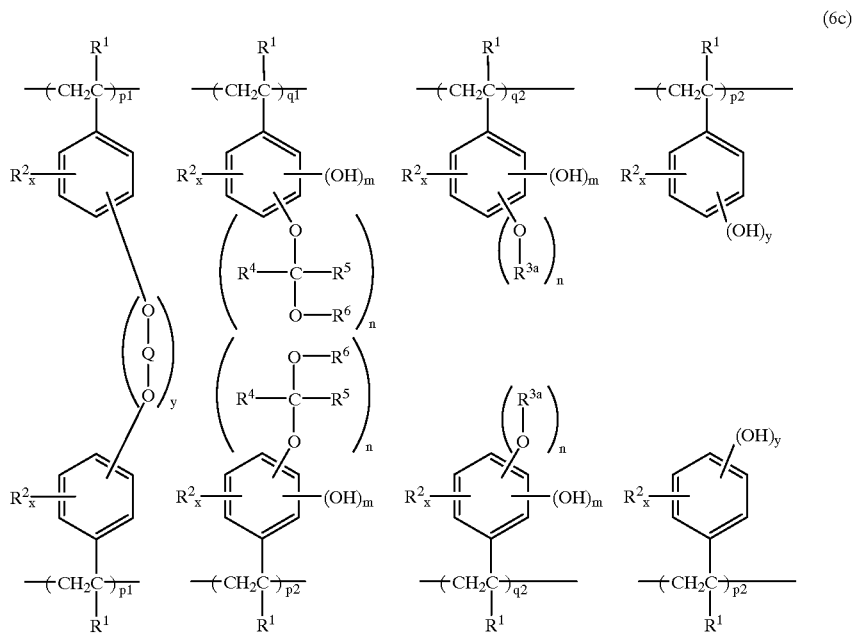

(6c)

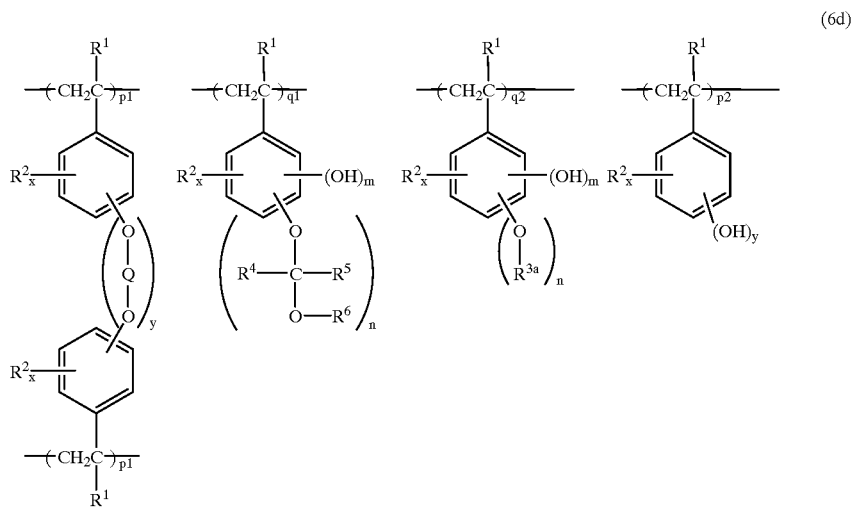

(6d)

wherein $R^{3a}$ is a group of formula (7), tert-alkyl group, trialkylsilyl group or ketoalkyl group, and $R^1$, $R^2$, $R^4$, $R^5$, $R^6$, $R^7$, Q, x, y, m, n, p1, p2, q1, and q2 are as defined above.

(XVII) The method of (XV) wherein q2 mol of a group of the following general formula (12) is introduced into the polymer having recurring units of the general formula (1') per mol of the entire phenolic hydroxyl groups in the polymer of formula (1'), thereby forming a polymer having recurring units of the general formula (6a) or (6b),

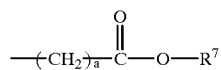

(12)

wherein $R^7$ and a are as defined above,

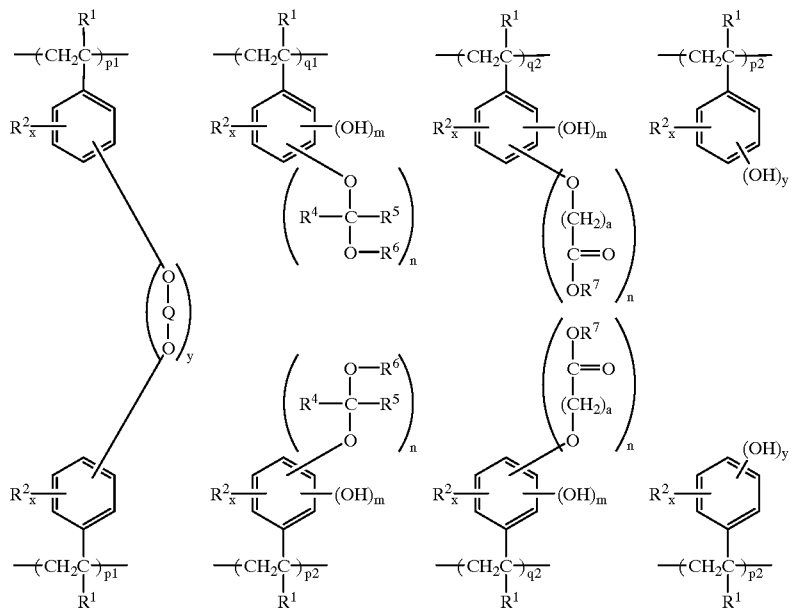

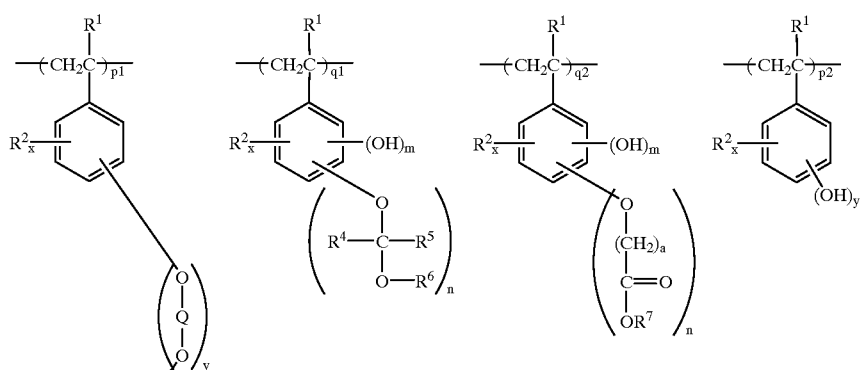

wherein $R^1, R^2, R^4, R^5, R^6, R^7, Q, x, y, m, n, p1, p2, q1$, and $q2$ are as defined above.

(XVIII) A method for preparing a polymer having recurring units of the general formula (7a) or (7b), comprising the step of reacting a polymer comprising recurring units of the following general formula (1') and having a weight average molecular weight of 1,000 to 500,000 with an alkenyl ether compound of the following general formula (8a) or (9a) or a halogenated alkyl ether compound of the following general formula (8b) or (9b),

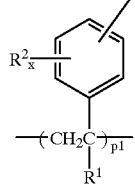

(1')

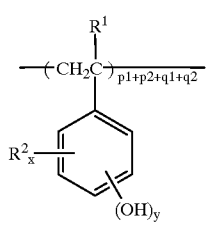

wherein $R^1, R^2, x, y, p1, p2, q1$, and $q2$ are as defined above,

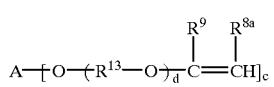

(8a)

(9a)

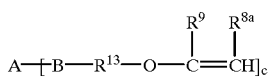

wherein $R^{8a}$, $R^9$, $R^{13}$, A, B, c, and d are as defined above, (8b)

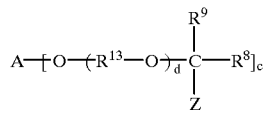

(9b)

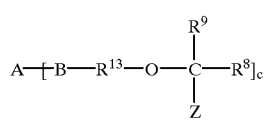

wherein $R^8$, $R^9$, $R^{13}$, A, B, Z, c, and d are as defined above, the hydrogen atoms of some phenolic hydroxyl groups in the polymer of formula (1') being reacted with p1 mol of the compound of formula (8a), (9a), (8b) or (9b) per mol of the entire phenolic hydroxyl groups in the polymer of formula (1'), thereby forming a polymer having recurring units of the general formula (7a) or (7b):

(7a)

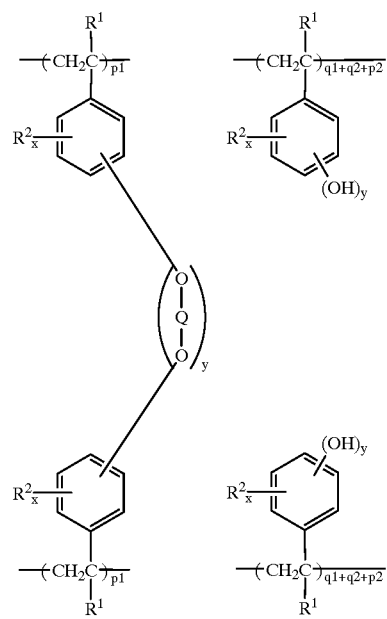

(7b)

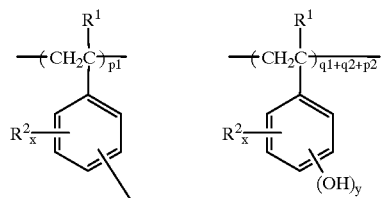

wherein $R^1$, $R^2$, Q, x, y, p1, p2, q1, and q2 are as defined above.

(XIX) The method of (XVII) wherein q1 mol of a group of the following general formula (11) is introduced into the polymer having recurring units of the general formula (1') per mol of the entire phenolic hydroxyl groups in the polymer of formula (1'), thereby forming a polymer having recurring units of the general formula (5a) or (5b):

(11)

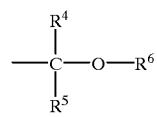

wherein $R^4$, $R^5{}_1$ and $R^6$ are as defined above.

(XX) The method of (XVII) wherein q2 mol of a group of the general formula (12), tert-alkyl group, trialkylsilyl group or ketoalkyl group is introduced into the polymer having recurring units of the general formula (1') per mol of the entire phenolic hydroxyl groups in the polymer of formula (1'), thereby forming a polymer having recurring units of the general formula (5c) or (5d):

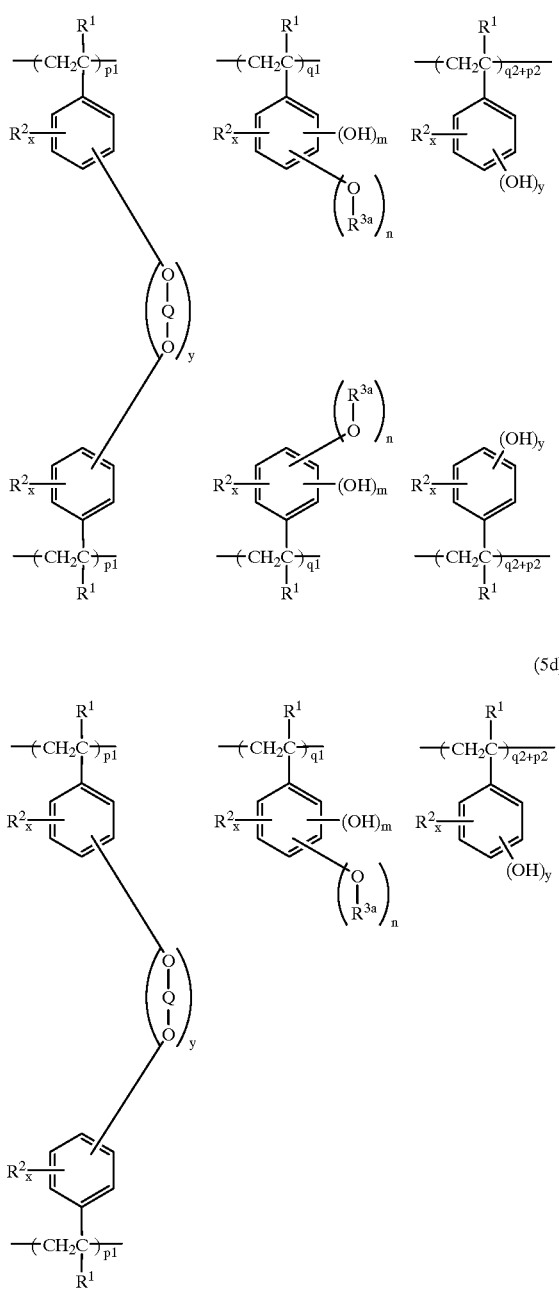

(5c)

(5d)

wherein $R^1$, $R^2$, $R^{3a}$, Q, x, y, m, n, p1, p2, q1 and q2 are as defined above.

(XXI) The method of (XVIII) wherein q2 mol of a group of the general formula (12), tert-alkyl group, trialkylsilyl group or ketoalkyl group is introduced into the polymer having recurring units of the general formula (1') per mol of the entire phenolic hydroxyl groups in the polymer of formula (1'), thereby forming a polymer having recurring units of the general formula (6c) or (6d).

It is understood that formulae (5a), (6a) and (8a) show intermolecular linkages and formulae (5b), (6b) and (8b) show intramolecular linkages.

According to the method of the invention, a crosslinked polymer which is soluble in solvents and whose crosslinking group and acid labile group can be eliminated with acid to render the polymer alkali soluble can be produced in an industrially advantageous manner because the amounts of crosslinking group and acid labile group introduced can be easily controlled.

DETAILED DESCRIPTION OF THE INVENTION

The polymer used as a base resin in a chemically amplified positive resist composition according to the present invention is a polymer which has at least one acid labile group, is crosslinked within a molecule and/or between molecules with a crosslinking group having a C—O—C linkage, and has a weight average molecular weight of 1,000 to 500,000.

In one preferred embodiment, the polymer is a polymer having recurring units of the following general formula (1), wherein the hydrogen atom of some phenolic hydroxyl groups is partially replaced by an acid labile group. The polymer is crosslinked within a molecule and/or between molecules with a crosslinking group having a C—O—C linkage resulting from reaction between some of the remaining phenolic hydroxyl groups and an alkenyl ether compound or a halogenated alkyl ether compound.

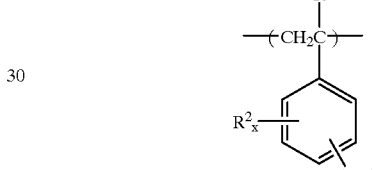

(1)

In formula (1), $R^1$ is a hydrogen atom or methyl group. $R^2$ is a normal, branched or cyclic alkyl group having 1 to 8 carbon atoms, preferably 1 to 5 carbon atoms, more preferably 1 to 3 carbon atoms. Examples of the normal, branched or cyclic alkyl group include methyl, ethyl, propyl, isopropyl, n-butyl, iso-butyl, tert-butyl, cyclohexyl and cyclopentyl. Letter x is 0 or a positive integer, and y is a positive integer satisfying $x+y \leq 5$. Preferably y is 1 to 3, more preferably 1 or 2.

Specifically, the inventive polymer is a polymer having recurring units of the following general formula (2) which is crosslinked within a molecule and/or between molecules with a crosslinking group having a C—O—C linkage resulting from reaction between a phenolic hydroxyl group represented by R and an alkenyl ether compound or a halogenated alkyl ether compound.

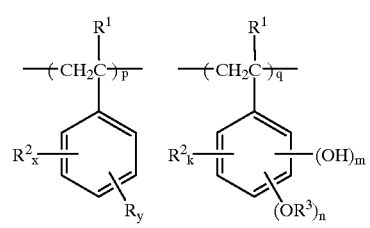

(2)

In formula (2), R is a hydroxyl group or $OR^3$ group, at least one of R groups is a hydroxyl group. $R^1$ is a hydrogen atom or methyl group. $R^2$ is a normal, branched or cyclic alkyl group having 1 to 8 carbon atoms. $R^3$ is an acid labile group. Letter x is 0 or a positive integer, y is a positive integer satisfying $x+y \leq 5$, k is 0 or a positive integer, m is 0 or a positive integer, n is a positive integer satisfying $k+m+n \leq 5$, p and q are positive numbers satisfying $p+q=1$. Examples of the alkyl group represented by $R^2$ and the preferred range of y are as described above. Preferably, n is 1 or 2, and m is 0 to 1. When n is 2 or more, $R^3$s may be identical or different.

The acid labile group which substitutes for the hydrogen atom of a phenolic hydroxyl group or which is represented by $R^3$ may be selected from a variety of acid labile groups, preferably groups of the following formulae (11) and (12), tert-alkyl groups, trialkylsilyl groups and ketoalkyl groups.

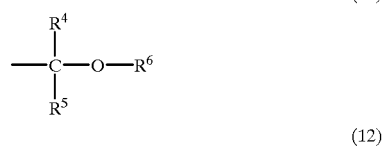

(11)

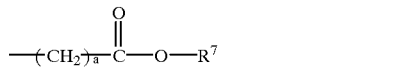

(12)

In formulae (11) and (12), $R^4$ and $R^5$ each are a hydrogen atom or normal, branched or cyclic alkyl group having 1 to 8 carbon atoms, preferably 1 to 6 carbon atoms, more preferably 1 to 5 carbon atoms. $R^6$ is a monovalent hydrocarbon group of 1 to 18 carbon atoms, preferably 1 to 10 carbon atoms, more preferably 1 to 8 carbon atoms, which may have a hetero atom such as oxygen. Alternatively, $R^4$ and $R^5$, $R^4$ and $R^6$, and $R^5$ and $R^6$, taken together, may form a ring, with the proviso that $R^4$, $R^5$ and $R^6$ each are a normal or branched alkylene having 1 to 18 carbon atoms, preferably 1 to 10 carbon atoms, more preferably 1 to 8 carbon atoms, when they form a ring. $R^7$ is a tertiary alkyl group having 4 to 12 carbon atoms, preferably 4 to 8 carbon atoms, more preferably 4 to 6 carbon atoms. Letter a is an integer of 0 to 6.

Examples of the normal, branched or cyclic alkyl group of 1 to 8 carbon atoms represented by $R^4$ and $R^5$ are as described for $R^2$.

Examples of the hydrocarbon group represented by $R^6$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

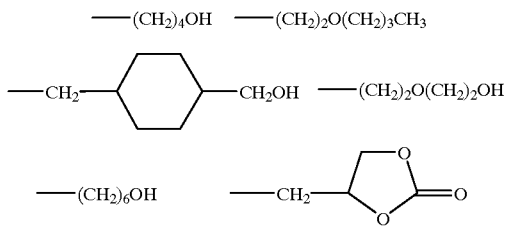

Examples of the tertiary alkyl group represented by $R^7$ include tert-butyl, 1-methylcyclohexyl, 2-(2-methyl) adamantly and tert-amyl groups.

Examples of the acid labile group of formula (5) include linear or branched acetal groups such as 1-methoxyethyl, 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl, with the ethoxyethyl, butoxyethyl and ethoxypropyl groups being preferred. Examples of the acid labile group of formula (6) include tert-butoxycarbonyl, tert-butoxycarbonylmethyl, tert-amyloxycarbonyl, and tert-amyloxycarbonylmethyl groups. Examples of the tert-alkyl group include tert-butyl, tert-amyl, and 1-methylcyclohexyl groups. The trialkylsilyl groups are preferably those whose alkyl moiety has 1 to 6 carbon atoms, for example, such as trimethylsilyl, triethylsilyl and dimethyl-tert-butylsilyl groups. Examples of the ketoalkyl group include 3-oxocyclohexyl and groups represented by the following formulae.

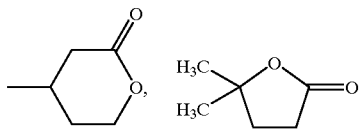

The crosslinking group having a C—O—C linkage is exemplified by groups of the following general formula (4a) or (4b).

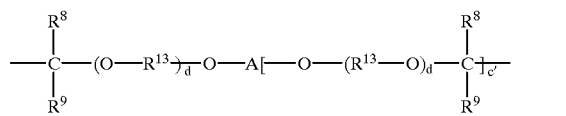

(4a)

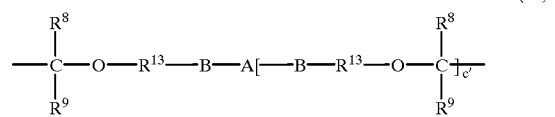

(4b)

wherein $R^8$ and $R^9$ each are a hydrogen atom or normal, branched or cyclic alkyl group having 1 to 8 carbon atoms, or $R^8$ and $R^9$, taken together, may form a ring, with the proviso that $R^8$ and $R^9$ each are a normal or branched alkylene having 1 to 8 carbon atoms when they form a ring, $R^{13}$ is a normal or branched alkylene having 1 to 10 carbon atoms, A is a c-valent aliphatic saturated hydrocarbon, alicyclic saturated hydrocarbon, aromatic hydrocarbon or heterocyclic group having 1 to 50 carbon atoms, which may have an intervening hetero atom and in which some of the hydrogen atoms attached to carbon atoms may be replaced by hydroxyl groups, carboxyl groups, carbonyl groups or fluorine atoms, B is —CO—O—, —NHCO—O— or —NHCONH—, letter c is an integer of 2 to 8, c' is an integer of 1 to 7, and d is 0 or an integer of 1 to 10.

The normal, branched or cyclic alkyl groups of 1 to 8 carbon atoms are as exemplified above. Examples of A are described later. The crosslinking group (4a) or (4b) is derived from the alkenylether compounds or halogenated alkylether compounds described later.

As understood from the value of c' in formula (4a) or (4b), the crosslinking group is not limited to a divalent one and trivalent to octavalent groups are acceptable. Preferably, c' is 1 or 2. For example, the divalent crosslinking group is exemplified by the following formula (4a') or (4b'), and the trivalent crosslinking group is exemplified by the following formula (4a") or (4b").

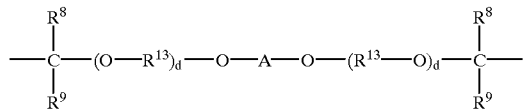

(4a')

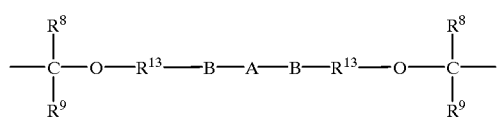

(4b')

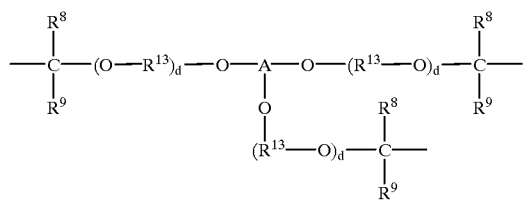

(4a")

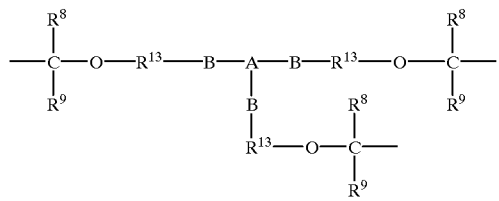

(4b")

More specifically, the inventive polymer is a polymer having recurring units of the following general formula (3) which is crosslinked within a molecule and/or between molecules through the mechanism that hydrogen atoms are eliminated from phenolic hydroxyl groups represented by R to leave oxygen atoms which are connected by a crosslinking group having a C—O—C linkage of the general formula (4a) or (4b).

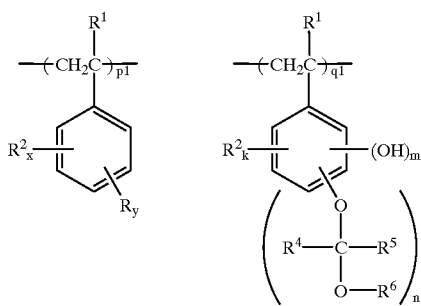

(3)

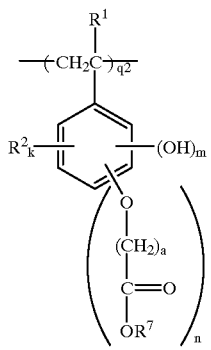

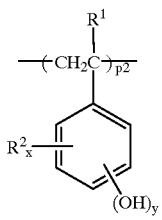

In formula (3), R is a hydroxyl group or $OR^3$ group, at least one of R groups is a hydroxyl group. $R^1$ is a hydrogen atom or methyl group. $R^2$ is a normal, branched or cyclic alkyl group having 1 to 8 carbon atoms. $R^3$ is an acid labile group. $R^4$ and $R^5$ each are a hydrogen atom or normal, branched or cyclic alkyl group having 1 to 8 carbon atoms. $R^6$ is a monovalent hydrocarbon group of 1 to 18 carbon atoms which may have a hetero atom. Alternatively, $R^4$ and $R^5$, $R^4$ and $R^6$, and $R^5$ and $R^6$, taken together, may form a ring, with the proviso that $R^4$, $R^5$ and $R^6$ each are a normal or branched alkylene having 1 to 8 carbon atoms when they form a ring. $R^7$ is a tertiary alkyl group having 4 to 12 carbon atoms. Letters p1 and p2 each are a positive number, q1 and q2 each are 0 or a positive number, satisfying $0<p1/(p1+q1+q2+p2)\leq 0.8$, $0\leq q1/(p1+q1+q2+p2)\leq 0.8$, $0\leq q2/(p1+q1+q2+p2)\leq 0.8$, and p1+q1+q2+p2=1, q1 and q2 are not equal to 0 at the same time, a is 0 or a positive integer of 1 to 6, x, y, k, m, and n are as defined above. It is noted that p1+p2=p and q1+q2=q.

Examples of R and $R^1$ to $R^7$ and the preferred ranges of x, y, k, m, n, and a are as described above. The preferred ranges of p1, p2, q1, and q2 are shown below.

Preferred range $0<p1/(p1+q1+p2+q2)\leq 0.4$, $0\leq q1/(p1+q1+p2+q2)\leq 0.6$, $0\leq q2/(p1+q1+p2+q2)\leq 0.6$, $0.4\leq p2/(p1+q1+p2+q2)<1$, $0<(q1+q2)/(p1+q1+p2+q2)\leq 0.6$ More preferred range $0.01\leq p1/(p1+q1+p2+q2)\leq 0.2$, $0\leq q1/(p1+q1+p2+q2)\leq 0.4$, $0\leq q2/(p1+q1+p2+q2)\leq 0.4$, $0.5\leq p2/(p1+q1+p2+q2)\leq 0.9$, $0.1\leq (q1+q2)/(p1+q1+p2+q2)\leq 0.4$ Is is further desired that $0\leq q1/(q1+q2)\leq 1$, more desirably $0.5\leq q1/(q1+q2)\leq 1$, most desirably $0.7\leq q1/q1+q2)\leq 1$.

Illustrative examples of the inventive polymer are represented by the following formulae (3a) and (3b).

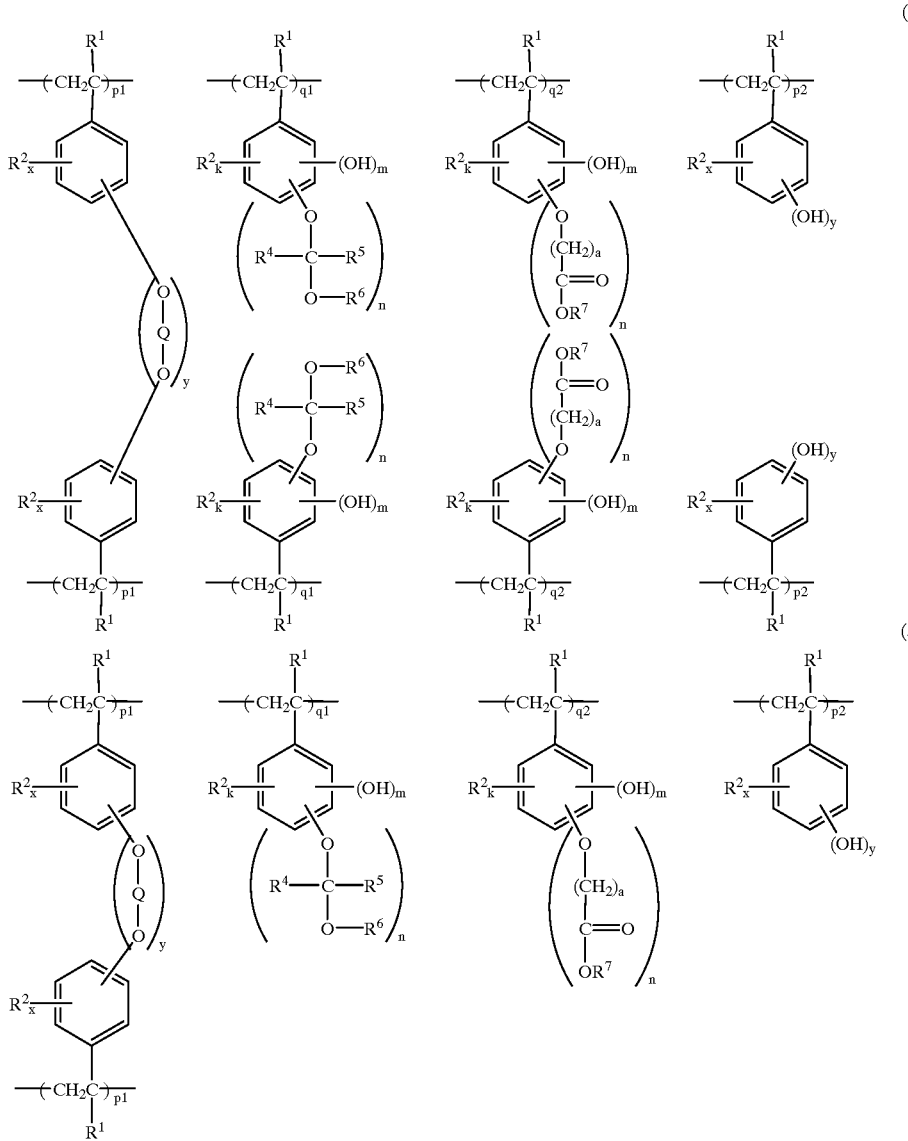

It is noted that formula (3a) shows an intermolecular linkage and formula (3b) shows an intramolecular linkage. They may be present alone or in admixture.

In the above formulae, Q is the crosslinking group having a C—O—C linkage, typically the crosslinking group represented by formula (4a) or (4b), especially (4a'), (4b'), (4a") or (4b").

When Q is a trivalent crosslinking group or more, the Q is connected to three or more units represented by the following formula:

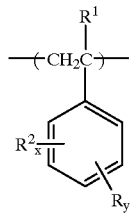

in the above formula (3a) or (3b).

In the polymer of the present invention, the hydrogen atoms of some phenolic hydroxyl groups are replaced by an acid labile group and a crosslinking group having a C—O—C linkage as mentioned above. Preferably, the amount of the acid labile group and the crosslinking group combined is on the average more than 0 mol % to 80 mol %, especially 2 to 50 mol % of the entire hydrogen atoms of phenolic hydroxyl groups in formula (1).

In this regard, the average proportion of the crosslinking group having a C—O—C linkage is more than 0 mol % to 80 mol %, especially 1 to 20 mol %. With 0 mol %, no benefits of the crosslinking group are obtained, resulting in a reduced contrast of alkali dissolution rate and low resolution. With more than 80 mol %, a too much crosslinked polymer will gel, become insoluble in alkali, induce a film thickness change, internal stresses or bubbles upon alkali development, and lose adhesion to the substrate due to less hydrophilic groups.

The average proportion of the acid labile group is more than 0 mol % to 80 mol %, especially 10 to 50 mol %. With 0 mol %, no benefits of the acid labile group are obtained, resulting in a reduced contrast of alkali dissolution rate and low resolution. With more than 80 mol %, alkali solubility will be lost and the affinity to an alkaline developer becomes low, resulting in low resolution.

By properly selecting the amounts of the crosslinking group having a C—O—C linkage and the acid labile group within the above-defined ranges, the size and configuration of a resist pattern can be controlled as desired. In the polymer according to the invention, the contents of the crosslinking group having a C—O—C linkage and the acid labile group have substantial influence on the dissolution rate of a resist film and govern the properties of a resist composition relating to the size and configuration of a resist pattern.

The polymer according to the invention should have a weight average molecular weight of 1,000 to 500,000, preferably 3,000 to 30,000 (the measurement of weight average molecular weight will be described later). With a weight average molecular weight of less than 1,000, resists would be less resistant to heat. With a weight average molecular weight of more than 500,000, alkali solubility and resolution lowers.

It is understood that prior to crosslinking, a polymer having a wide molecular weight dispersity (Mw/Mn) contains more polymers of low molecular weight and high molecular weight. Such a wide dispersity obstructs the design of the number of crosslinks and it is rather difficult to produce resist materials having the same properties. The influence of a molecular weight and its dispersity becomes greater as the pattern rule becomes finer. In order that a resist material be advantageously used in patterning features to a finer size, the polymer should preferably be a monodisperse one having a molecular weight dispersity of 1.0 to 1.5, especially 1.0 to 1.3. However, the invention is not limited thereto, and it is, of course, acceptable to use a polymer having a dispersity of more than 1.5.

The polymer according to the invention may be prepared in various ways, for example, by a method of introducing an acid labile group of formula (11) into a phenolic hydroxyl group of a polymer having recurring units of formula (1'), isolating the polymer, and reacting it with an alkenyl ether compound or halogenated alkyl ether compound whereby the polymer is crosslinked within a molecule and/or between molecules with a crosslinking group having a C—O—C linkage; a method of reacting a polymer having recurring units of formula (1') with an alkenyl ether compound or halogenated alkyl ether compound whereby the polymer is crosslinked within a molecule and/or between molecules with a crosslinking group having a C—O—C linkage, isolating the polymer, and introducing an acid labile group of formula (11) therein; or a method of carrying out reaction with an alkenyl ether compound or halogenated alkyl ether compound and introduction of an acid labile group of formula (11) together. The last-mentioned combination method is preferred. It is possible to further introduce into the thus obtained polymer an acid labile group of formula (12), tert-alkyl, trialkylsilyl or ketoalkyl group, if necessary.

Now a method for preparing polymers according to the invention is described in detail.

The method for preparing crosslinked polymers according to the invention starts with an alkali soluble polymer comprising recurring units of the following general formula (1') and having a weight average molecular weight of 1,000 to 500,000.

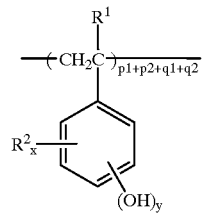

In formula (1'), $R^1$, $R^2$, x, y, p1, p2, q1, and q2 are as defined above.

In a first method, the polymer of formula (1') is reacted with an alkenyl ether compound of the following general formula (8a) or (9a) and a compound of the following general formula (10a), thereby forming a polymer having recurring units of the general formula (5a) or (5b).

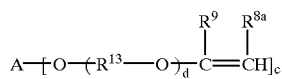

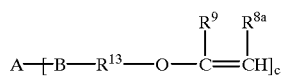

In formula (8a) or (9a), $R^{8a}$ is a hydrogen atom or normal, branched or cyclic alkyl group having 1 to 7 carbon atoms, preferably 1 to 4 carbon atoms, more preferably 1 to 2 carbon atoms. $R^9$ is a hydrogen atom or normal, branched or cyclic alkyl group having 1 to 8 carbon atoms, preferably 1 to 5 carbon atoms, more preferably 1 to 3 carbon atoms. Alternatively, $R^{8a}$ and $R^9$, taken together, may form a ring with the proviso that $R^{8a}$ is a normal or branched alkylene group having 1 to 7 carbon atoms and $R^9$ is a normal or branched alkylene group having 1 to 8 carbon atoms when they form a ring. $R^{13}$ is a normal or branched alkylene group having 1 to 10 carbon atoms. A is a c-valent aliphatic saturated hydrocarbon, alicyclic saturated hydrocarbon, aromatic hydrocarbon or heterocyclic group having 1 to 50 carbon atoms, which may have an intervening hetero atom such as oxygen, nitrogen and sulfur and in which some of the hydrogen atoms attached to carbon atoms may be replaced by hydroxyl groups, carboxyl groups, carbonyl groups or fluorine atoms. B is —CO—O—, —NHCO—O— or —NHCONH—. Letter c is an integer of 2 to 8, and d is 0 or an integer of 1 to 10.

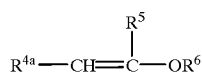

In formula (10a), $R^{4a}$ is a hydrogen atom or normal, branched or cyclic alkyl group having 1 to 7 carbon atoms, preferably 1 to 5 carbon atoms, more preferably 1 to 4 carbon atoms. $R^5$ is a hydrogen atom or normal, branched or cyclic alkyl group having 1 to 8 carbon atoms, preferably 1 to 6 carbon atoms, more preferably 1 to 5 carbon atoms. $R^6$ is a monovalent hydrocarbon group of 1 to 18 carbon atoms, preferably 1 to 10 carbon atoms, more preferably 1 to 8 carbon atoms, which may have a hetero atom. Alternatively, $R^{4a}$ and $R^5$, $R^{4a}$ and $R^6$, and $R^5$ and $R^6$, taken together, may form a ring with the proviso that $R^{4a}$ is a normal or branched alkylene group having 1 to 17 carbon atoms, preferably 1 to 9 carbon atoms, more preferably 1 to 7 carbon atoms and $R^5$ and $R^6$ each are a normal or branched alkylene group having 1 to 18 carbon atoms, preferably 1 to 10 carbon atoms, more preferably 1 to 8 carbon atoms when they form a ring.

The normal, branched or cyclic alkyl group represented by $R^{4a}$, etc. and the hydrocarbon group represented by $R^6$ are as exemplified previously.

The c-valent (divalent to octavalent) organic groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms, a combination of an alkylene group and an arylene group, and covalent groups obtained by eliminating one hydrogen atom attached to a carbon atom from the foregoing groups wherein c" is an integer of 3 to 8; and c-valent heterocyclic groups, and a combination of a heterocyclic group with any one of the foregoing hydrocarbon groups. In the alkylene and arylene groups, a hetero atom such as o, NH, N(CH$_3$), S and SO$_2$ may intervene and where substituted, the substituent is a hydroxyl, carboxyl, carbonyl group or fluorine atom.

The organic groups represented by A are exemplified below.

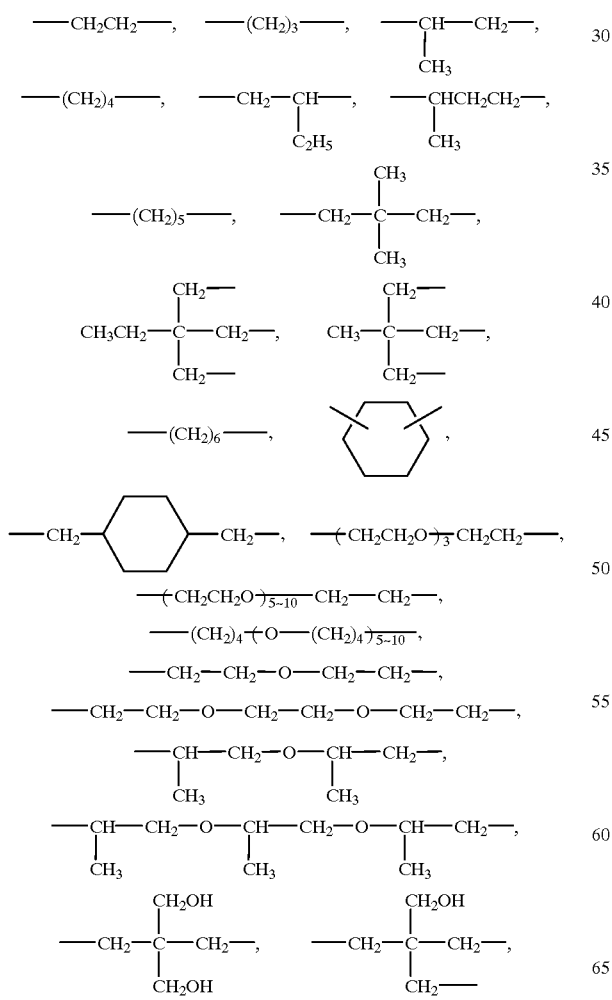

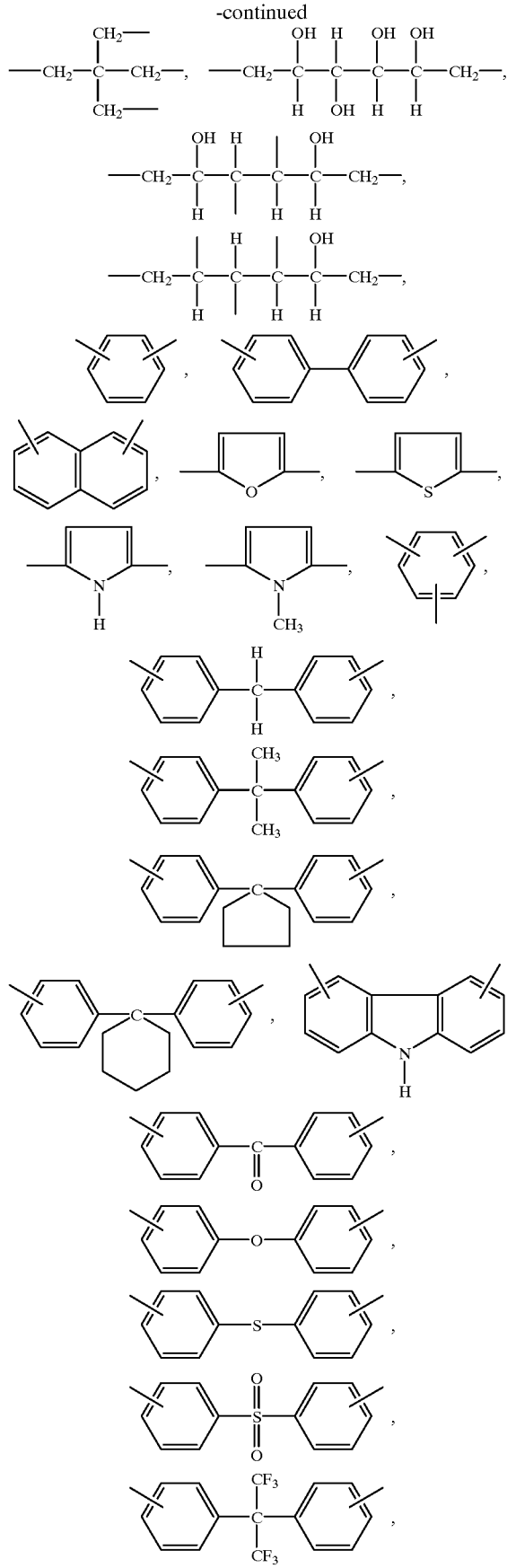

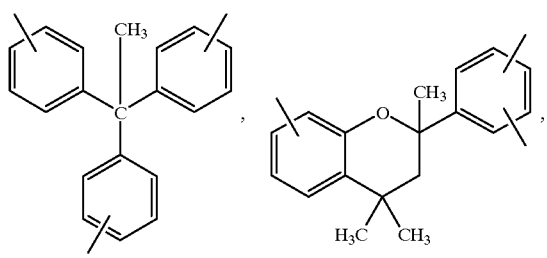

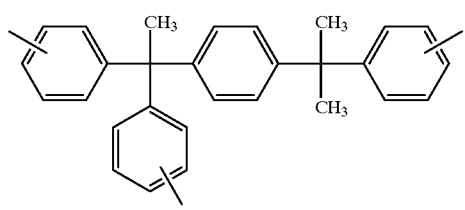

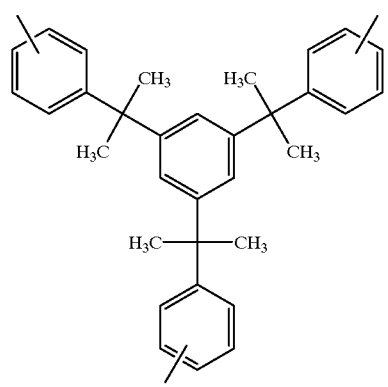

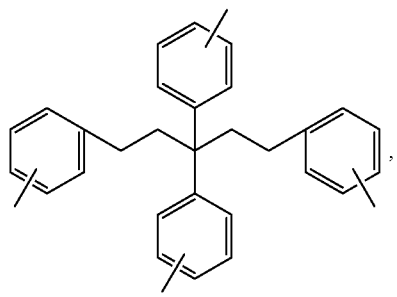

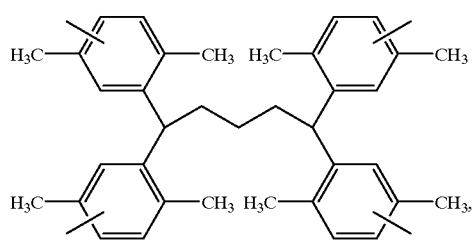

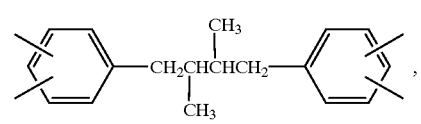

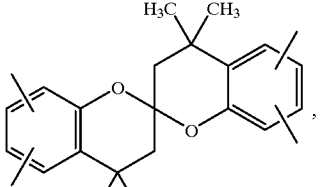

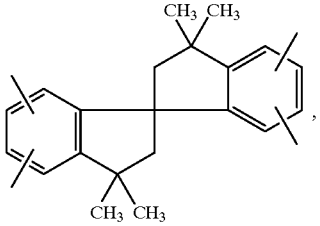

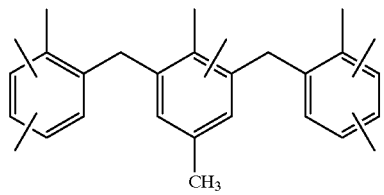

The compounds of formula (8a) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers.

Illustrative, non-limiting examples of the compound of formula (8a) include ethylene glycol divinyl ether, triethylene glycol divinyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, 1,4-divinyloxymethyl cyclohxane tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

(I-1)

(I-2)
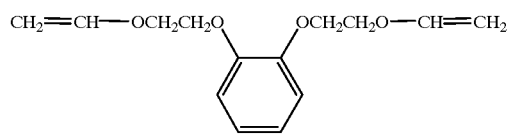
(I-12)
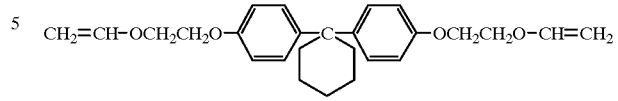
(I-3)
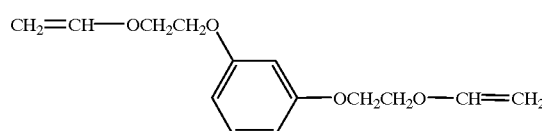
(I-13)
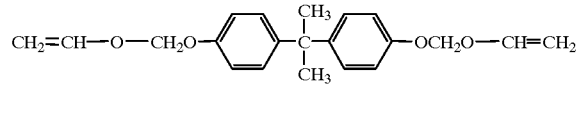
(I-4)
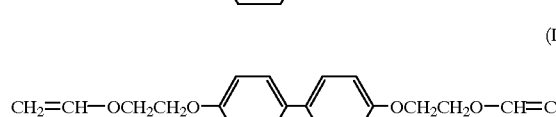
(I-14)
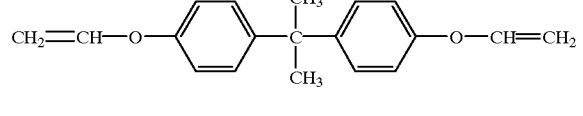
(I-5)
(I-15)
(I-6)
(I-16)
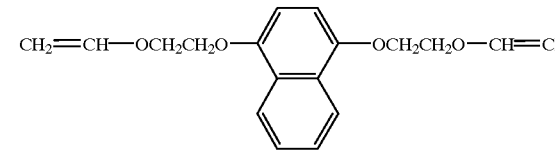
(I-7)
(I-17)
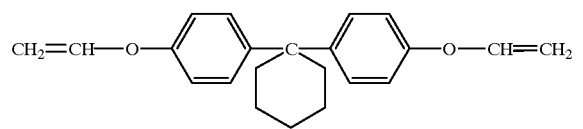
(I-8)
(I-18)
(I-9)
(I-19)
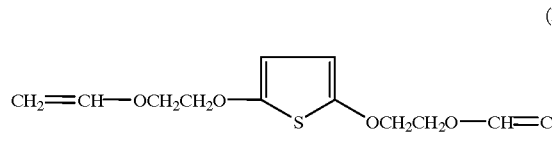
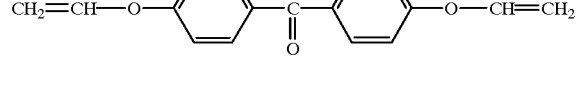
(I-10)
(I-20)
(I-11)
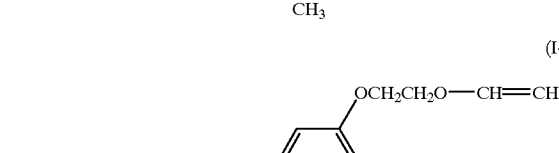
(I-21)
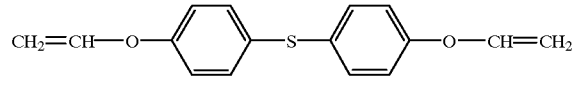
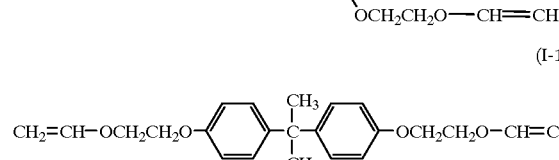
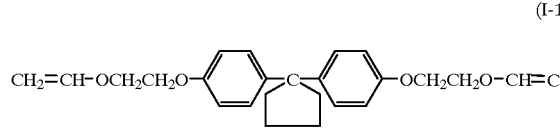
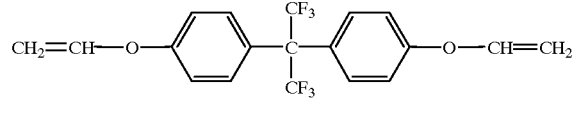

(I-22) 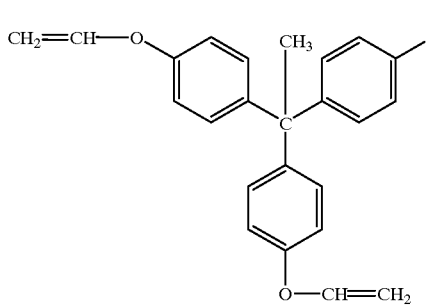

(I-23) 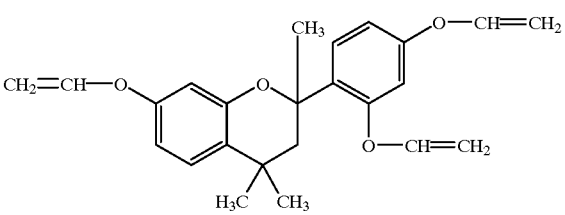

(I-24) 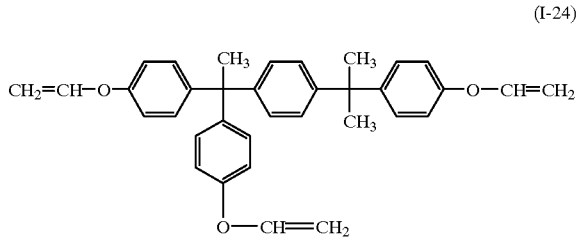

(I-25) 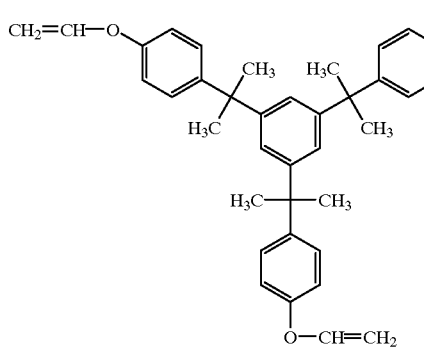

(I-26) 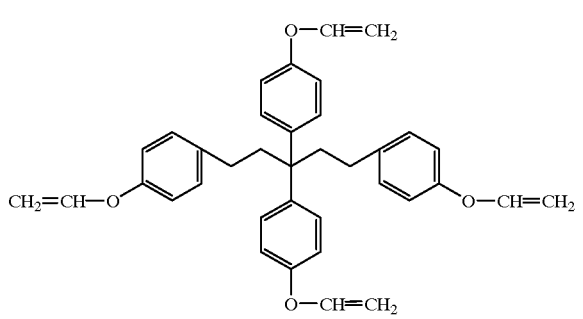

(I-27) 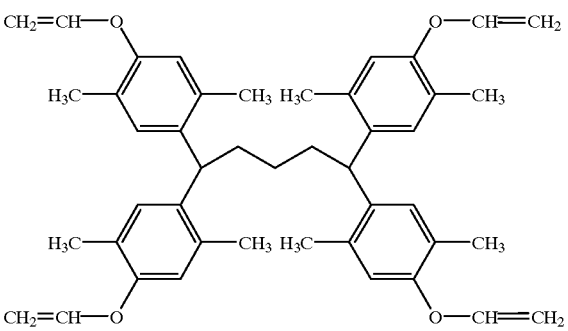

(I-28) 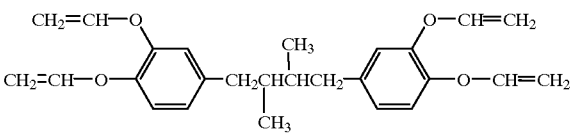

(I-29) 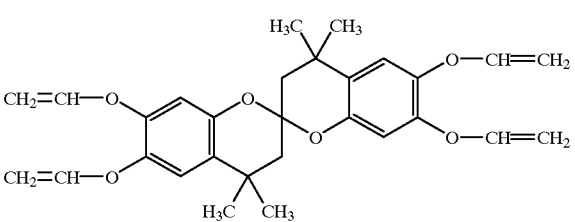

(I-30) 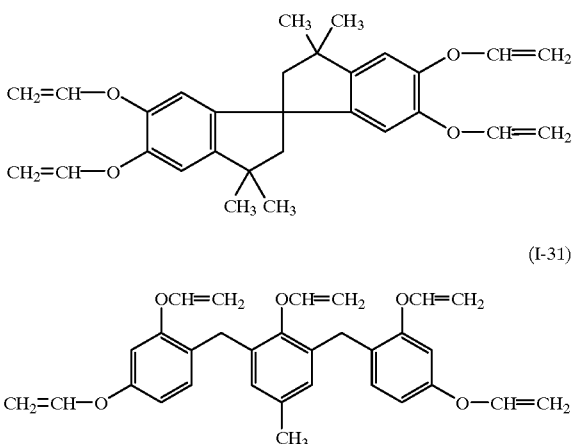

(I-31) 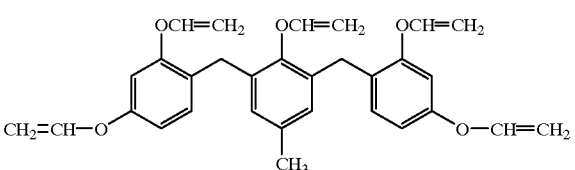

The compounds of formula (9a) wherein B is —CO—O— can be synthesized by reacting polyvalent carboxylic acids with halogenated alkyl vinyl ethers. Illustrative, non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful alkenyl ether group-containing compounds which can be used herein are alkenyl ether group-containing compounds which are synthesized by reacting alkenyl ether compounds having active hydrogen as represented by the following formulae (III), (IV), and (V) with compounds having an isocyanato group.

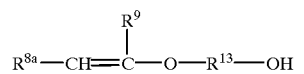

(III)

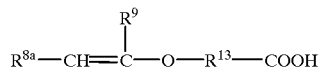

(IV)

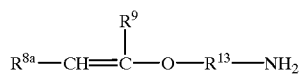

(V)

$R^{8a}$, $R^9$, and $R^{13}$ are as defined above.

Where B is —NHCO—O— or —NHCONH—, the compounds of formula (9a) can be prepared by using compounds including those described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing vinyl ether compounds, there are obtained various compounds having an alkenyl ether group at an end. These compounds are exemplified by the following formulae (II-1) through (II-11), though not limited thereto.

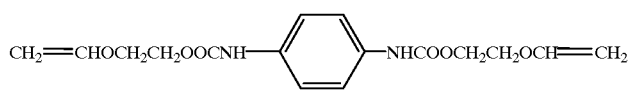

(II-1)

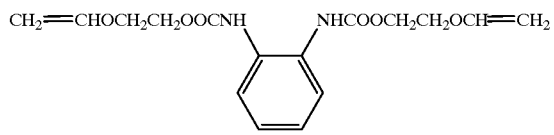

(II-2)

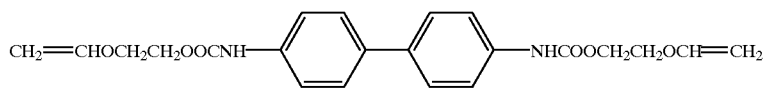

(II-3)

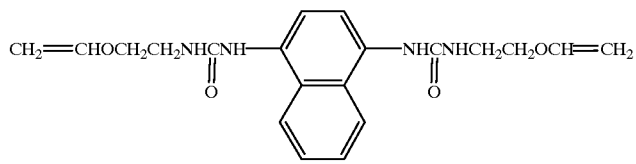

(II-4)

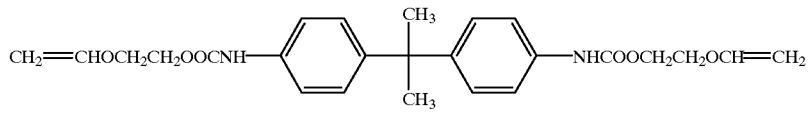

(II-5)

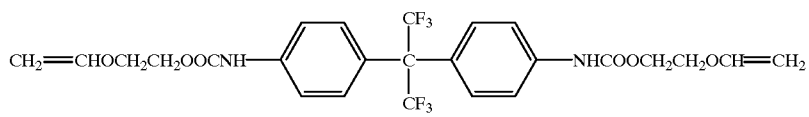

(II-6)

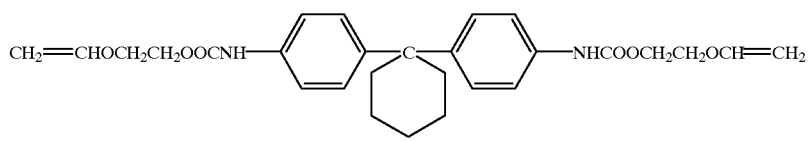

(II-7)

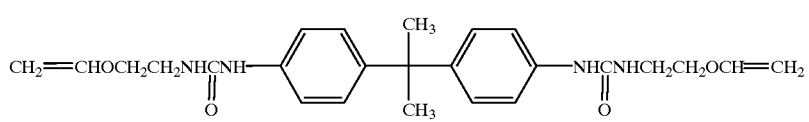

(II-8)

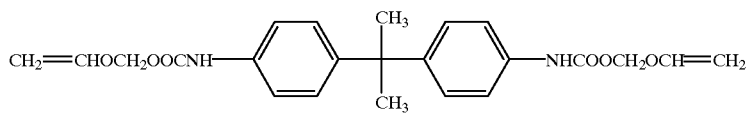

(II-9)

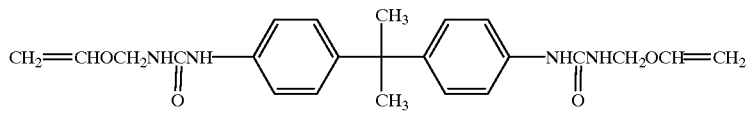

(II-10)

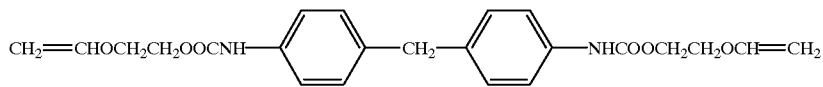

(II-11)

More particularly, in the first method, a polymer of formula (1') having a weight average molecular weight of 1,00 to 500,000 and preferably a dispersity of 1.0 to 1.5 is reacted with an alkenyl ether compound of formula (8a) or (9a) and a compound of formula (10a) such that the hydrogen atoms of some phenolic hydroxyl groups in the polymer of formula (1') may be reacted with p1 mol of the compound of formula (8a) or (9a) and q1 mol of the compound of formula (10a) per mol of the entire phenolic hydroxyl groups in the polymer of formula (1'), thereby forming a polymer having recurring units of the general formula (5a) or (5b).

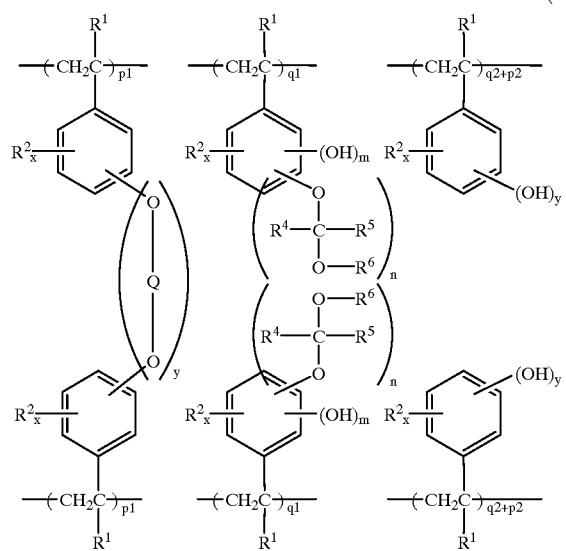

(5a)

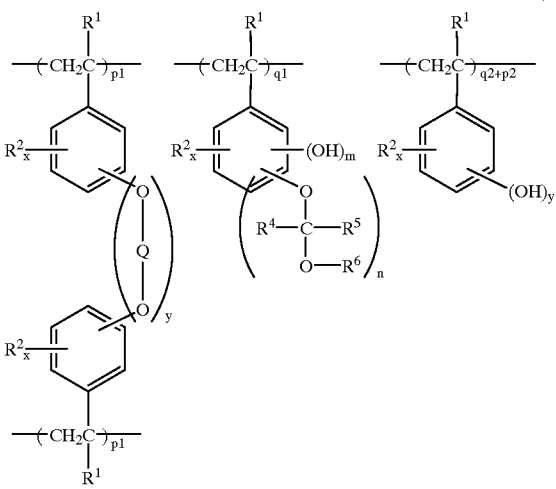

(5b)

In the formulae (5a) and (5b), $R^1$ and $R^2$ are as defined above. $R^4$ is a hydrogen atom or normal, branched or cyclic alkyl group having 1 to 8 carbon atoms, preferably 1 to 6 carbon atoms, more preferably 1 to 5 carbon atoms. $R^5$ and $R^6$ are as defined above. Alternatively, $R^4$ and $R^5$, $R^4$ and $R^6$, and $R^5$ and $R^6$, taken together, may form a ring, with the proviso that $R^4$, $R^5$ and $R^6$ each are a normal or branched alkylene having 1 to 18 carbon atoms, preferably 1 to 10 carbon atoms, more preferably 1 to 8 carbon atoms when they form a ring. Q is a group represented by the following formula (4a) or (4b). $R^8$ is a hydrogen atom or normal, branched or cyclic alkyl group having 1 to 8 carbon atoms, preferably 1 to 5 carbon atoms, more preferably 1 to 3 carbon atoms. $R^9$ is as defined above. Alternatively, $R^8$ and $R^9$, taken together, may form a ring, with the proviso that $R^8$ and $R^9$ each are a normal or branched alkylene having 1 to 8 carbon atoms when they form a ring. $R^{13}$, A, B, and d are as defined above, c' is an integer of 1 to 7. Letters x and y are as defined above, m is 0 or a positive integer, n is a positive integer satisfying m+n=y, and p1, p2, q1, and q2 are as defined above.

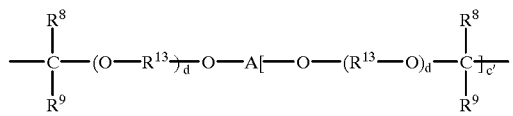
(4a)

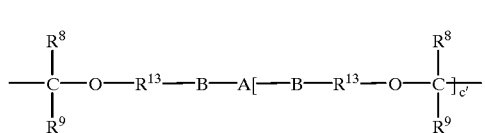
(4b)

In the first method, reaction is preferably carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid catalyst used herein is preferably selected from hydrochloric acid, sulfuric acid, trifluoromethanesulfonic acid, p-toluenesulfonic acid, methanesulfonic acid, and pyridinium p-toluenesulfonate. The amount of the acid catalyst used is preferably 0.1 to 10 mol % based on the moles of the phenolic hydroxyl group in the polymer of formula (1'). Reaction is preferably carried out at a temperature of −20° C. to 100° C., more preferably 0° C. to 60° C. The reaction time is generally about 10 minutes to 100 hours, preferably ½ to 20 hours.

Where two types of reaction are carried out in a contiguous manner without once isolating an intermediate product, the order of addition of the alkenyl ether compound of formula (8a) or (9a) and the compound of formula (10a) is not critical. Preferably, the compound of formula (10a) is first added and after reaction proceeds to a full extent, the alkenyl ether compound of formula (8a) or (9a) is added. If the alkenyl ether compound of formula (8a) or (9a) and the compound of formula (10a) are simultaneously added or if the alkenyl ether compound of formula (8a) or (9a) is first added, then some of reactive sites of the alkenyl ether compound of formula (8a) or (9a) can be hydrolyzed with water in the reaction system whereby there is formed a polymer of complex structure which is difficult to control its physical properties.

In a second method, a polymer comprising recurring units of the general formula (1') and having a weight average molecular weight of 1,000 to 500,000 is reacted with a halogenated alkyl ether compound of the following general formula (8b) or (9b) and a compound of the following general formula (10b), thereby producing a polymer having recurring units of the general formula (5a) or (5b).

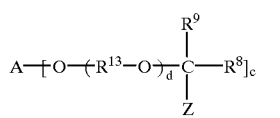
(8b)

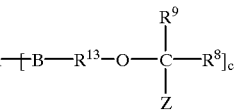
(9b)

In formulae (8b) and (9b), $R^8$, $R^9$, $R^{13}$, A, B, c, and d are as defined above, and Z is a halogen atom such as Cl, Br and I.

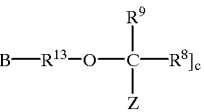
(10b)

In formula (10b), $R^4$, $R^5$, $R^6$, and Z are as defined above.

The compounds of formulae (8b), (9b) and (10b) can be produced by reacting the compounds of formulae (8a), (9a) and (10a) with hydrogen chloride, hydrogen bromide or hydrogen iodide, respectively.

More particularly, in the second method, a polymer of formula (1') having a weight average molecular weight of 1,000 to 500,000 and preferably a dispersity of 1.0 to 1.5 is reacted with a halogenated alkyl ether compound of formula (8b) or (9b) and a compound of formula (10b) such that the hydrogen atoms of some phenolic hydroxyl groups in the polymer of formula (1') are reacted with p1 mol of the compound of formula (8b) or (9b) and q1 mol of the compound of formula (10b) per mol of the entire phenolic hydroxyl groups in the polymer of formula (1'), thereby forming a polymer having recurring units of the general formula (5a) or (5b). With respect to the order of addition of the compound of formula (8b) or (9b) and the compound of formula (10b), the same as in the first method applies.

In the second method, reaction is preferably carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, diisopropylamine and potassium carbonate. The amount of the base used is preferably at least (p1+q1) mol per mol of the phenolic hydroxyl group in the polymer of formula (1'). Reaction is preferably carried out at a temperature of −50° C. to 100° C., more preferably 0° C. to 60° C. The reaction time is generally about ½ to 100 hours, preferably 1 to 20 hours.

It is acceptable to take a reaction sequence of first reacting a polymer having recurring units of formula (1') with a compound of formula (10a) or (10b) to form a compound of the following general formula (13), isolating the compound of formula (13), and then crosslinking the compound of formula (13) using a compound of formula (8a), (9a), (8b) or (9b).

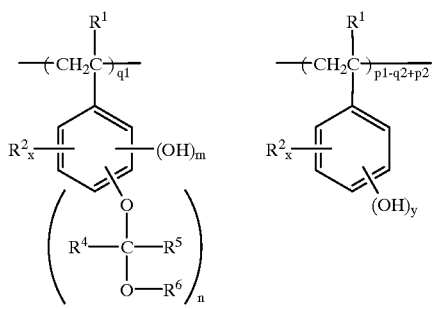

(13)

Furthermore, by introducing another acid labile group into the polymer of formula (5a) or (5b) obtained by the first or second method, a polymer having recurring units of the following general formula (6c) or (6d) can be produced if necessary. This is done by reacting the polymer of formula (5a) or (5b) with q2 mol of a dialkyl dicarbonate compound or alkoxycarbonylalkyl halide per mol of the phenolic hydroxyl group in the polymer to introduce an acid labile group of the following general formula (12); or by reacting the polymer of formula (5a) or (5b) with q2 mol of a tert-alkyl halide, trialkylsilyl halide or ketoalkyl compound per mol of the phenolic hydroxyl group in the polymer to introduce an acid labile group different from $-CR^4R^5OR^6$, for example, a group of formula (12), tert-alkyl, trialkylsilyl and ketoalkyl group.

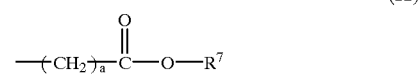

(12)

In formula (12), $R^7$ is a hydrogen atom or tertiary alkyl group having 4 to 12 carbon atoms, preferably 4 to 8 carbon atom, more preferably 4 to 6 carbon atoms, and letter a is an integer of 0 to 6.

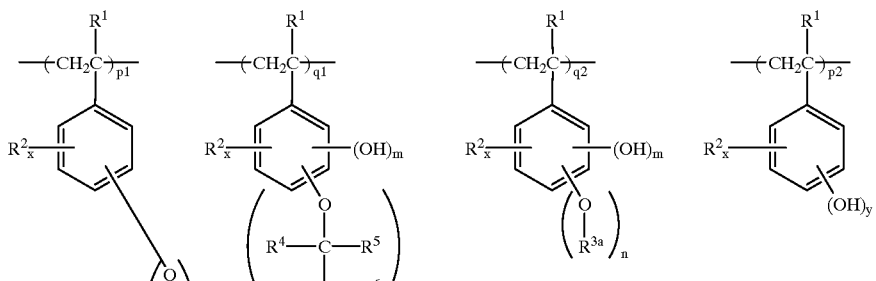

(6c)

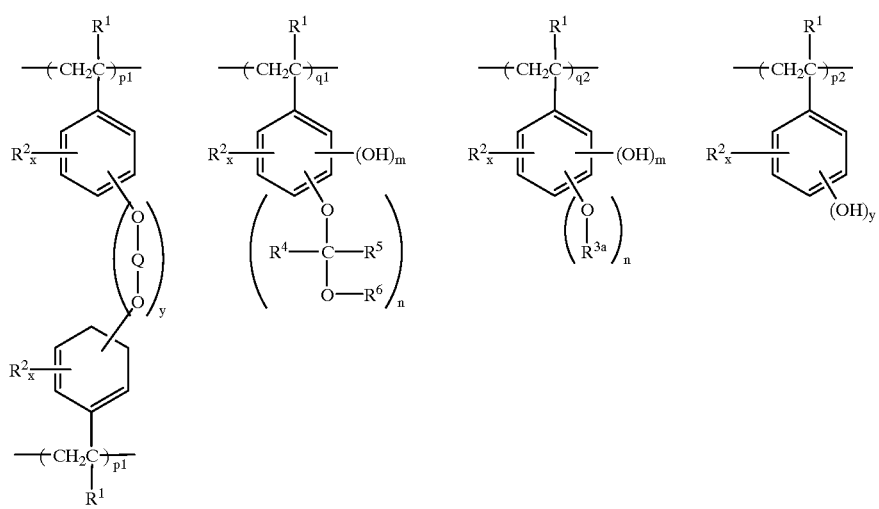

(6d)

In formulae (6c) and (6d), $R^{3a}$ is a group of formula (7), tert-alkyl group, trialkylsilyl group or ketoalkyl group, $R^1$, $R^2$, $R^4$, $R^5$, $R^6$, $R^7$, Q, x, y, m, n, p1, p2, q1, and q2 are as defined above.

More illustratively, by introducing a group of formula (12) into the polymer of formula (5a) or (5b), there is obtained a polymer having recurring units of the following general formula (6a) or (6b).

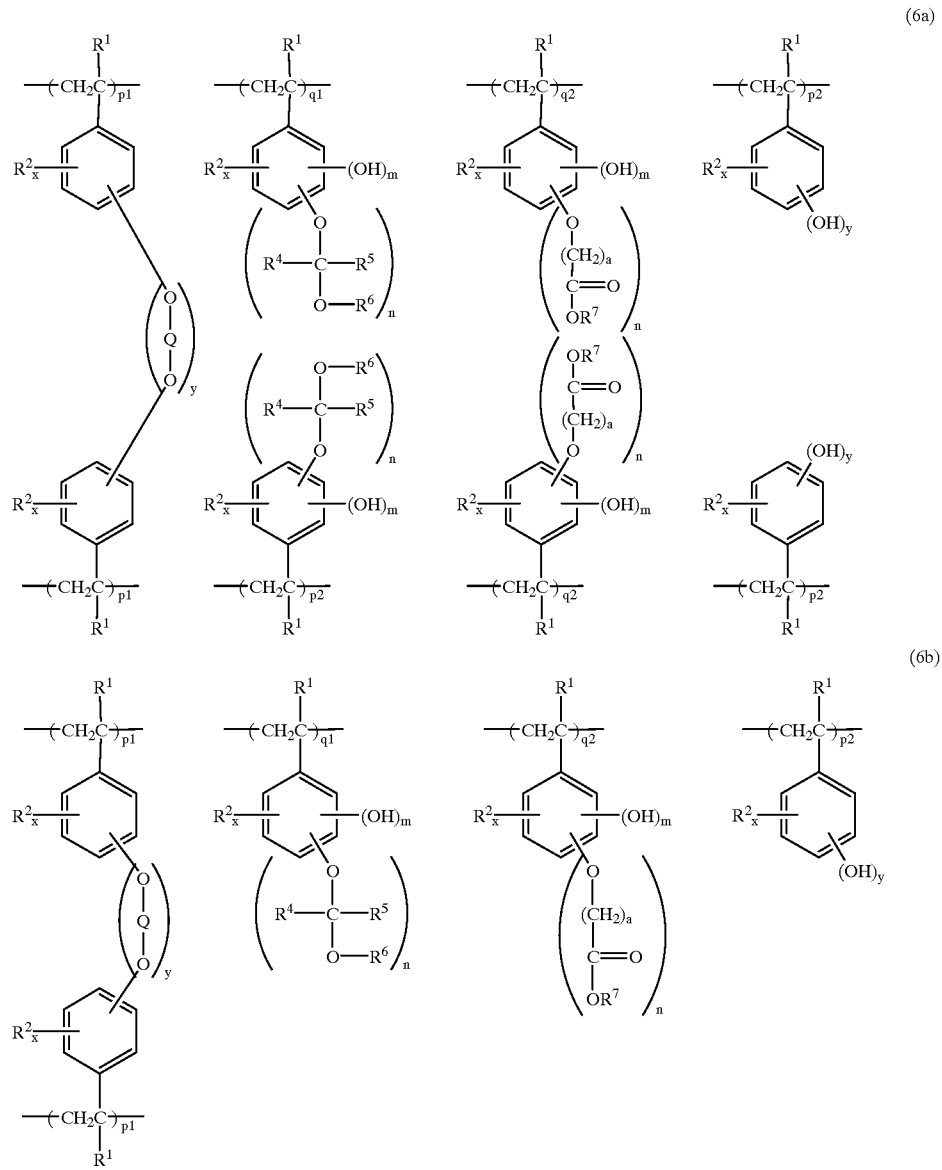

In formulae (6a) and (6b), $R^1$, $R^2$, $R^4$, $R^5$, $R^6$, $R^7$, Q, x, y, m, n, p1, p2, q1, and q2 are as defined above.

Preferably the introduction of an acid labile group of formula (12) is carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, imidazole, diisopropylamine and potassium carbonate. The amount of the base used is preferably at least q2 mol per mol of the phenolic hydroxyl group in the polymer of formula (1'). Reaction is preferably carried out at a temperature of 0° C. to 100° C., more preferably 0° C. to 60° C. The reaction time is generally about 10 minutes to 100 hours, preferably 1 to 10 hours.

Examples of the dialkyl dicarbonate compound include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, and tert-butoxycarbonylethyl chloride. Examples of the trialkylsilyl halide include trimethylsilyl chloride, triethylsilyl chloride, and dimethyl-tert-butylsilyl chloride.

Furthermore, if necessary, the polymer of formula (5a) or (5b) obtained by the first or second method can be tert-alkylated or ketoalkylated by reacting the polymer with q2 mol of a tert-alkylating compound or ketoalkyl compound per mol of the phenolic hydroxyl group in the polymer.

Preferably this reaction is carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid used herein is preferably selected from hydrochloric acid, sulfuric acid, trifluoromethanesulfonic acid, p-toluenesulfonic acid, methanesulfonic acid, and pyridinium p-toluenesulfonate. The amount of the acid catalyst used is preferably 0.1 to 10 mol % based on the moles of the phenolic hydroxyl group in the polymer of formula (1'). Reaction is preferably carried out at a temperature of −20° C. to 100° C., more preferably 0° C. to 60° C. The reaction time is generally about 10 minutes to 100 hours, preferably ½ to 20 hours.

Examples of the tert-alkylating compound include isobutene, 2-methyl-1-butene, and 2-methyl-2-butene. Examples of the ketoalkyl compound include a-angelica lactone, 2-cyclohexen-1-one, and 5,6-dihydro-2H-pyran-2-one.

In a third method, a polymer comprising recurring units of the general formula (1') and having a weight average molecular weight of 1,000 to 500,000 is reacted with an alkenyl ether compound of the following general formula (8a) or (9a) or a halogenated alkyl ether compound of the following general formula (8b) or (9b), thereby forming a polymer having recurring units of the general formula (7a) or (7b).

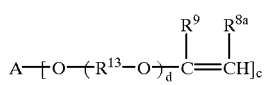
(8a)

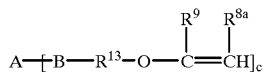
(9a)

In formulae (8a) and (9a), $R^{8a}$, $R^9$, $R^{13}$, A, B, c, and d are as defined above.

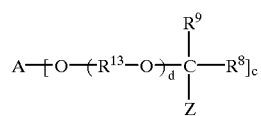
(8b)

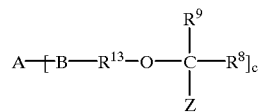
(9b)

In formulae (8b) and (9b), $R^8$, $R^9$, $R^{13}$, A, B, Z, c, and d are as defined above.

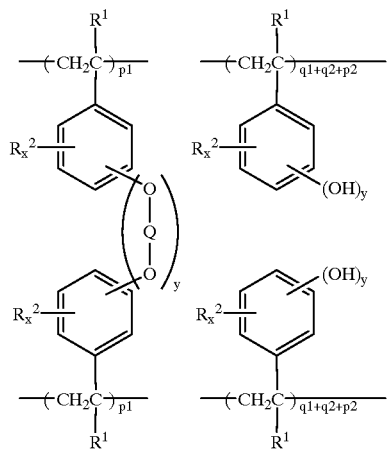
(7a)

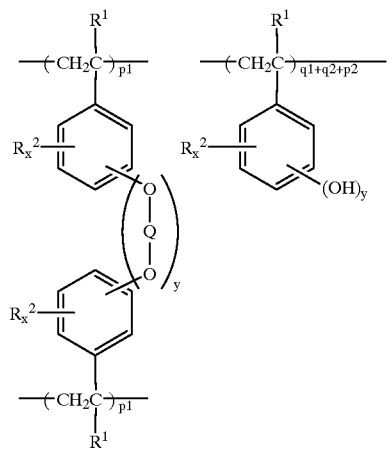
(7b)

In formulae (7a) and (7b), $R^1$, $R^2$, Q, x, y, p1, p2, q1, and q2 are as defined above.

More specifically, a polymer of formula (1') is reacted with a compound of formula (8a), (9a), (8b) or (9b) such that the hydrogen atoms of some phenolic hydroxyl groups in the polymer of formula (1') are reacted with p1 mol of the compound of formula (8a), (9a), (8b) or (9b) per mol of the entire phenolic hydroxyl groups in the polymer, thereby forming a polymer having recurring units of the general formula (7a) or (7b). Reaction conditions may be the same as in the first and second methods.

Furthermore, the polymer of formula (7a) or (7b) obtained by the third method can be converted into a polymer having recurring units of the general formula (6a) or (6b) by reacting the polymer of formula (7a) or (7b) with q1 mol of a compound of formula (10a) or (10b) per mol of the phenolic hydroxyl group in the polymer of formula (1'), thereby introducing q1 mol of a group of the following general formula (11). Alternatively, the polymer of formula (7a) or (7b) obtained by the third method can be converted into a polymer having recurring units of the following general formula (5c) or (5d) by introducing in the polymer of formula (7a) or (7b) q2 mol of a group of formula (12), tert-alkyl, trialkylsilyl or ketoalkyl group per mol of the phenolic hydroxyl group in the polymer of formula (1'). The introduction of these acid labile groups may be carried out as previously mentioned.

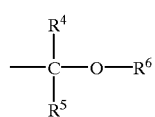
(11)

In formula (11), $R^4$, $R^5$, and $R^6$ are as defined above.

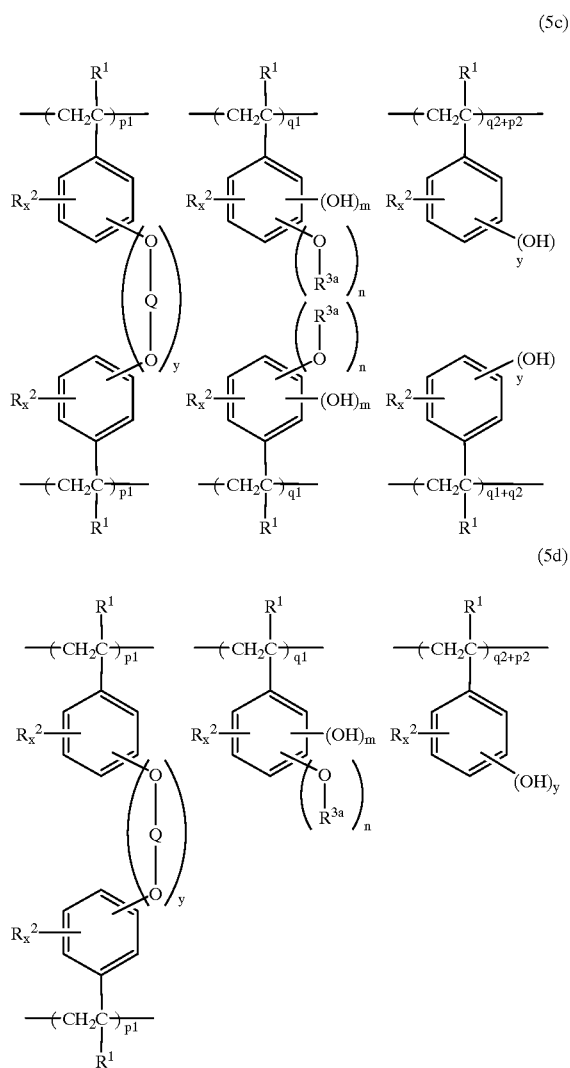

In formulae (5c) and (5d), $R^1$, $R^2$, $R^{3a}$, Q, x, Y, m, n, p1, p2, q1, and q2 are as defined above.

Moreover, by introducing qi mol of a group of formula (11) and q2 mol of a group of formula (12), tert-alkyl, trialkylsilyl or ketoalkyl group into the polymer of formula (7a) or (7b), there is obtained a polymer having recurring units of the general formula (6c) or (6d).

The present invention provides a chemically amplified positive resist composition using the above-defined polymer as a base resin. Illustratively, the resist composition contains (A) an organic solvent,
(B) a base resin in the form of a polymer having at least one acid labile group and crosslinked within a molecule and/or between molecules with a crosslinking group having a C—O—C linkage, the polymer having a weight average molecular weight of 1,000 to 500,000, specifically a polymer of formula (1), preferably formula (2), more preferably formula (3),
(C) a photoacid generator,
(D) a basic compound, and
(E) an aromatic compound having a group ≡C—COOH in a molecule.

In addition to these components, the resist composition of the invention may further contain at least one of the following components (F) to (I):

(F) another base resin in the form of a polymer different from the crosslinked polymer as component (B),
(G) a dissolution controller,
(H) a UV absorber, and
(I) an acetylene alcohol derivative.

The organic solvent (A) used herein may be any desired one of organic solvents in which the photoacid generator, base resin, and dissolution controller are soluble. Illustrative, non-limiting examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate alone or in admixture of two or more. The preferred solvents are diethylene glycol dimethyl ether, 1-ethoxy-2-propanol, and ethyl lactate ensuring maximum solubility of photoacid generators and propylene glycol monomethyl ether acetate ensuring safety. These solvents may be used alone or in admixture of two or more.

The amount of the organic solvent used is preferably about 200 to 1,000 parts, more preferably about 400 to 800 parts by weight per 100 parts by weight of the base resin consisting of components (B) and (F) combined.

Typical examples of the photoacid generator (C) are onium salts including: diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate.

Other useful photoacid generators include β-ketosulfone derivatives such as 2-cyclohexylcarbonyl-2-(p-toluenesulfonyl)propane and 2-isopropylcarbonyl-2-(p-toluenesulfonyl)propane; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(iso-butylsulfonyl)diazomethane, bis(sec-butylsulfonyl)diazomethane, bis(n-propylsulfonyl)diazomethane, bis(iso-propylsulfonyl)diazomethane, and bis(tert-butylsulfonyl)diazomethane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris (trifluoromethanesulfonyloxy)benzene, and 1,2,3-tris(p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among others are onium salts such as triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate and diazomethane derivatives such as bis(benzenesulfonyl)-diazomethane, bis(p-toluenesulfonyl)diazomethane, bis (cyclohexylsulfonyl)diazomethane, bis(n-butylsulfonyl)-diazomethane, bis(iso-butylsulfonyl)diazomethane, bis(sec-butylsulfonyl)diazomethane, bis(n-propylsulfonyl)-diazomethane, bis (iso-propylsulfonyl)diazomethane, and bis(tert-butylsulfonyl)diazomethane. The photoacid generators may be used alone or in admixture of two or more. The onium salts are effective for improving rectangularity while the diazomethane derivatives are effective for reducing standing waves. A combination of an onium salt with a diazomethane derivative allows for finer profile adjustment.

Desirably, the photoacid generator is added in an amount of about 0.5 to 15 parts, especially about 1 to 8 parts by weight per 100 parts by weight of the base resin. Sensitivity would be low with less than 0.5 part of the photoacid generator. More than 15 parts of the photoacid generator would lower an alkali dissolution rate to detract from resolution. Additionally heat resistance lowers because monomeric components become excessive.

Component (F) is another base resin in the form of a high molecular weight compound or polymer different from the crosslinked polymer defined as component (B). That is, component (F) is a polymer having recurring units of the following general formula (1), wherein the hydrogen atom of a phenolic hydroxyl group is partially replaced by an acid labile group in an average proportion of more than 0 mol % to 80 mol % of the entire phenolic hydroxyl groups. The polymer has a weight average molecular weight of 3,000 to 300,000.

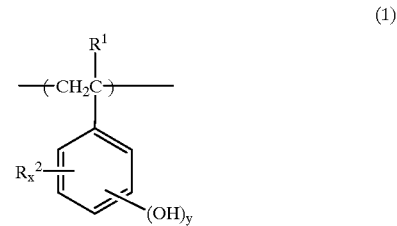

(1)

$R^1$ is a hydrogen atom or methyl group, $R^2$ is a normal, branched or cyclic alkyl group having 1 to 8 carbon atoms, letter x is 0 or a positive integer, and y is a positive integer satisfying $x+y \leq =5$.

By blending component (F), it becomes easier to control the size and configuration of a resist pattern.

The polymer as component (F) is preferably a polymer having recurring units represented by the following general formula (10) and having a weight average molecular weight of 3,000 to 300,000.

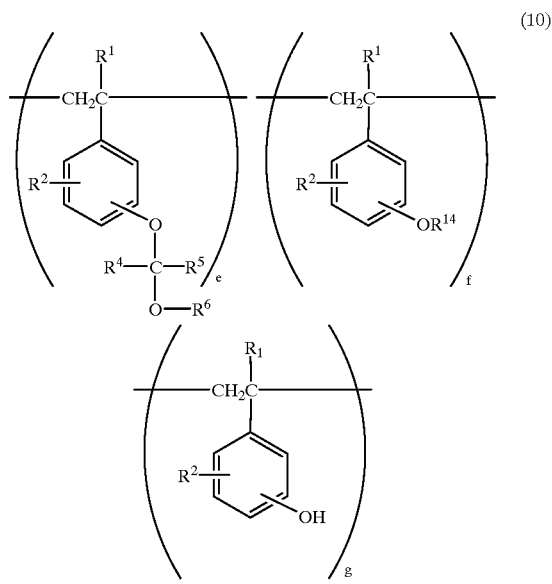

(10)

In formula (10), $R^1$, $R^2$, $R^4$, $R^5$, and $R^6$ are as defined above. $R^{14}$ is an acid labile group different from a group $—CR^4R^5OR^6$ (that is, formula (11)), for example, a group of the general formula (12), tert-alkyl group, trialkylsilyl group or ketoalkyl group. Letters e and f each are 0 or a positive number, e and f can be 0 at the same time, g is a positive number satisfying $e+f+g=1$, $0 \leq e/(e+f+g) \leq 0.5$, $0 \leq f/(e+f+g) \leq 0.5$ and $0.4 \leq g/(e+f+g) \leq 0.9$, preferably $0.1 \leq e/(e+f+g) \leq 0.4$, $0 \leq f/(e+f+g) \leq 0.2$ and $0.6 \leq g/(e+f+g) \leq 0.8$. If the proportion of e to the total (e+f+g) is more than 0.5, if the proportion of f to the total is more than 0.5, or if the proportion of g to the total is more than 0.9 or less than 0.4, then the a contrast between alkali dissolution rates would lower to detract from resolution. By properly selecting the values of e, f and g within the above-defined range, the size and shape of a resist pattern can be controlled.

The polymer has a weight average molecular weight (Mw) of 3,000 to 300,000, preferably 5,000 to 30,000. With Mw<3,000, a resist composition is less resistant to heat. With Mw>300,000, a resist composition becomes low in alkali dissolution and hence, resolution.

In the base resin as component (F), a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 2.5, especially 1.0 to 1.5.

Preferably the base resin (F) is blended with the base resin (B) in the form of a crosslinked polymer in a weight ratio of from 0:100 to 90:10, more preferably from 0:100 to 50:50. If the base resin (F) is blended in excess of this weight ratio range relative to the base resin (B), the desired effect of the crosslinked polymer as based resin (B) is somewhat lost.

In the resist composition of the invention, a dissolution controller may be added as component (G) for further improving contrast.

The dissolution controller (G) is a compound having an average molecular weight of 100 to 1,000, preferably 150 to 800 and at least two phenolic hydroxyl groups in a molecule, the hydrogen atom of the phenolic hydroxyl group being replaced by an acid labile group in an average proportion of 0% to 100% of the entire phenolic hydroxyl groups. The percent average replacement of the hydrogen atom of phenolic hydroxyl group by an acid labile group is 0 to 100 mol %, preferably 30 to 80 mol % of the entire phenolic hydroxyl groups.

The compound having at least two phenolic hydroxyl groups in a molecule as dissolution controller (G) is exemplified by compounds of the following general formulae (i) to (xi):

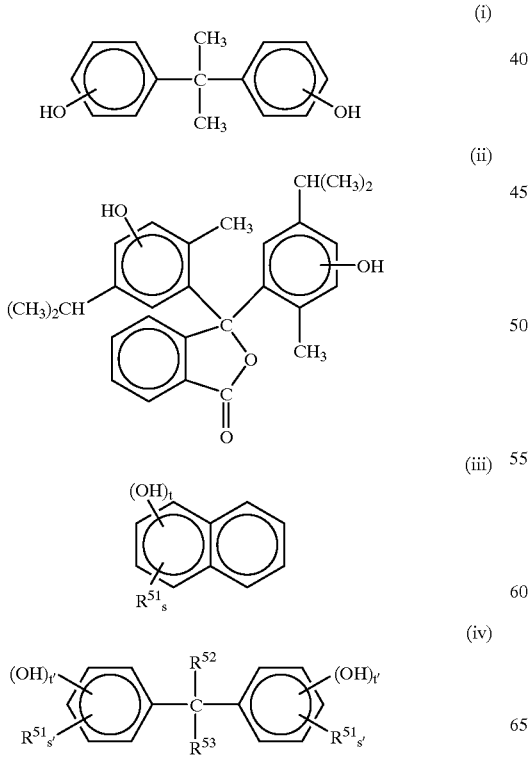

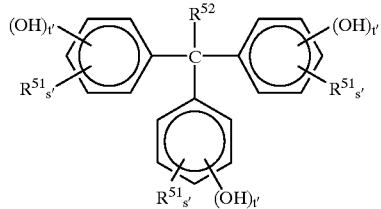

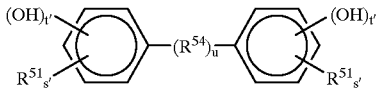

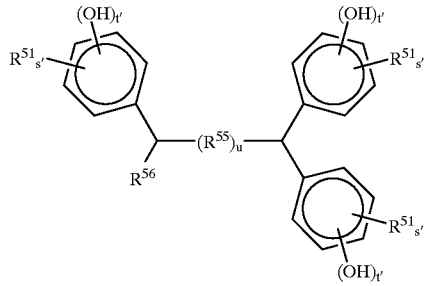

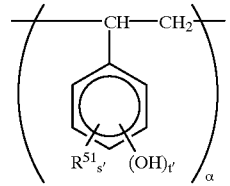

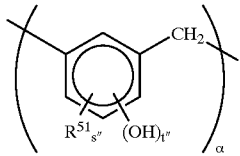

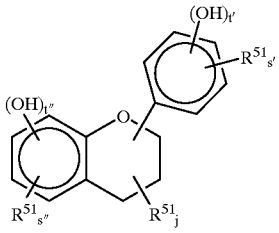

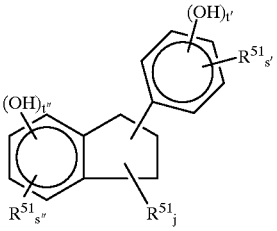

In the formulae, $R^{51}$ and $R^{52}$ are independently a hydrogen atom or normal or branched alkyl or alkenyl group having 1 to 8 carbon atoms. $R^{53}$ is a hydrogen atom, normal or branched alkyl or alkenyl group having 1 to 8 carbon atoms, or —$(R^{57})_h$—COOH. $R^{54}$ is a group —$(CH_2)_i$— wherein i is 2 to 10, arylene group having 6 to 10 carbon atoms, carbonyl group, sulfonyl group, oxygen atom or sulfur atom. $R^{55}$ is an alkylene group having 1 to 10 carbon atoms, arylene group having 6 to 10 carbon atoms, carbonyl group, sulfonyl group, oxygen atom or sulfur atom. $R^{56}$ is a hydrogen atom, normal or branched alkyl group having 1 to 8 carbon atoms, alkenyl group, hydroxyl-substituted phenyl group or hydroxyl-substituted naphthyl group. $R^{57}$ is a normal or branched alkylene group having 1 to 10 carbon atoms. Letter j is an integer of 0 to 5, h and u are 0 or 1, and s, t, s', t', s", and t" are numbers satisfying s+t=8, s'+t'=5, and s"+t"=4 such that at least one hydroxyl group is attached to each phenyl skeleton. α is such a number that the compound of formula (viii) or (ix) may have a molecular weight of 100 to 1,000.

Exemplary groups represented by $R^{51}$ and $R^{52}$ are hydrogen, methyl, ethyl, propyl, butyl, ethynyl, and cyclohexyl groups. Exemplary groups represented by $R^{53}$ are as exemplified for $R^{51}$ and $R^{52}$ as well as —COOH and —$CH_2COOH$. Exemplary groups represented by $R^{54}$ are ethylene, phenylene, carbonyl, and sulfonyl groups, oxygen and sulfur atoms. Exemplary groups represented by $R^{55}$ are methylene and as exemplified for $R^{54}$. Exemplary groups represented by $R^{56}$ are hydrogen, methyl, ethyl, propyl, butyl, ethynyl, cyclohexyl, and hydroxylsubstituted phenyl and naphthyl groups.

The acid labile group in the dissolution controller includes groups of formulae (11) and (12), tert-alkyl, trialkylsilyl and β-ketoalkyl groups.

The dissolution controller in the form of a compound whose phenolic hydroxyl group is partially replaced by an acid labile group is preferably blended in the resist composition in an amount of 0 to about 50 parts, more preferably about 5 to 50 parts, most preferably 10 to 30 parts by weight per 100 parts by weight of the base resin. At least 5 parts of the dissolution controller would be necessary to be effective for improving resolution whereas more than 50 parts would induce pattern thinning and detract from resolution.

The dissolution controller mentioned above can be synthesized by chemically reacting an acid labile group with a compound having a phenolic hydroxyl group as in the preparation of the base resin.

As dissolution controller (G), a compound having a weight average molecular weight of more than 1,000 to 3,000 and a phenolic hydroxyl group in a molecule wherein the hydrogen atom of the phenolic hydroxyl group being partially replaced by an acid labile group in an average proportion of 0% to 60% may be blended in addition to or instead of the above-mentioned compound. This compound is referred to as second compound or dissolution controller.

The second compound in which the hydrogen atom of a phenolic hydroxyl group is partially replaced by an acid labile group is preferably selected from compounds comprising recurring units of the following general formula (15) and having a weight average molecular weight of more than 1,000 to 3,000.

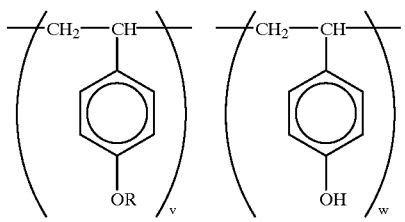

In formula (15), R is an acid labile group, letters v and w are numbers satisfying $0 \leq v/(v+w) \leq 0.6$.

The acid labile group in the second dissolution controller includes groups of formulae (11) and (12), tert-alkyl, trialkylsilyl and ketoalkyl groups.

The blending amount of the first and second dissolution controllers combined is preferably 0 to 50 parts, more preferably 0 to 30 parts, especially 1 to 30 parts by weight per 100 parts by weight of the base resin.

The second dissolution controller can be synthesized by chemically reacting an acid labile group with a compound having a phenolic hydroxyl group as in the preparation of the base resin.

In the resist composition of the invention, a basic compound (D) is blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives. Inter alia, aliphatic amines are preferably used.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pyridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide. Preferred among others are triethylamine, N,N-dimethylaniline, N-methyl-pyrrolidone, pyridine, quinoline, nicotinic acid, triethanolamine, piperidine ethanol, N,N-dimethylacetamide, and succinimide.

Preferably the basic compound is blended in an amount of 0.01 to about 2 parts, especially about 0.01 to 1 part by weight. Less than 0.01 part of the basic compound is ineffective whereas more than 2 parts would adversely affect sensitivity.

Component (E) blended in the resist composition of the invention is an aromatic compound having a group ≡C—COOH in a molecule. It may be at least one compound selected from the following classes I and II although the invention is not limited thereto. By blending component (E), resist is improved in PED stability and edge roughness on a nitride film substrate.

Class I

Compounds of the following general formulae (16) to (25) wherein some or all of the hydrogen atoms of phenolic hydroxyl groups are replaced by —$R^{57}$—COOH wherein $R^{57}$ is a normal or branched alkylene group having 1 to 10 carbon atoms and the molar fraction of the phenolic hydroxyl group (C mol) in the molecule to the group ≡C—COOH (D mol) is C/(C+D)=0.1 to 1.0.

Class II

Compounds of the following general formulae (26) to (27)

Class I

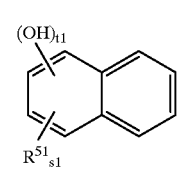

(16)

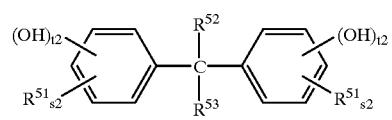

(17)

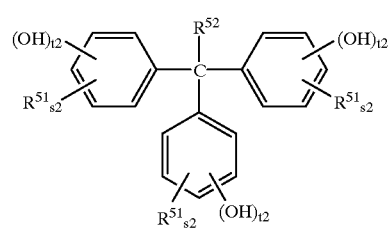

(18)

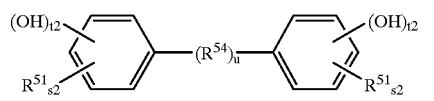
(19)

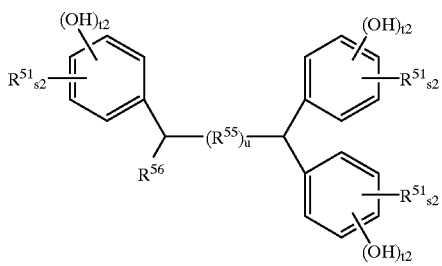
(20)

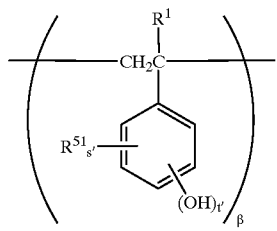
(21)

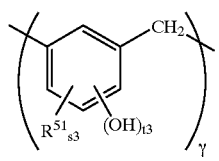
(22)

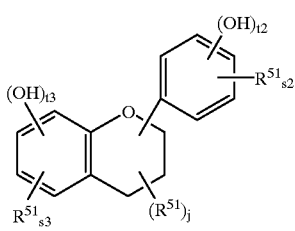
(23)

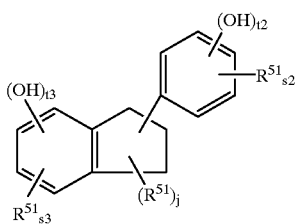
(24)

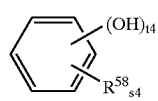
(25)

In the formulae, $R^1$ is a hydrogen atom or methyl group. $R^{51}$ and $R^{52}$ are independently a hydrogen atom or normal or branched alkyl or alkenyl group having 1 to 8 carbon atoms. $R^{53}$ is a hydrogen atom, normal or branched alkyl or alkenyl group having 1 to 8 carbon atoms, or $—(R^{57})_h—COOR'$ wherein R' is a hydrogen atom or $—R^{57}—COOH$. $R^{54}$ is a group $—(CH_2)_i—$ wherein i is 2 to 10, arylene group having 6 to 10 carbon atoms, carbonyl group, sulfonyl group, oxygen atom or sulfur atom. $R^{55}$ is an alkylene group having 1 to 10 carbon atoms, arylene group having 6 to 10 carbon atoms, carbonyl group, sulfonyl group, oxygen atom or sulfur atom. $R^{56}$ is a hydrogen atom, normal or branched alkyl group having 1 to 8 carbon atoms, alkenyl group, hydroxyl-substituted phenyl group or hydroxyl-substituted naphthyl group. $R^{57}$ is a normal or branched alkylene group having 1 to 10 carbon atoms. $R^{58}$ is a hydrogen atom, normal or branched alkyl or alkenyl group having 1 to 8 carbon atoms, or $—R^{57}—COOH$. Letter j is an integer of 0 to 5, h is 0 or 1, and s1, t1, s2, t2, s3, t3, s4, and t4 are numbers satisfying s1+t1=8, s2+t2=5, s3+t3=4, and s4+t4=6 such that at least one hydroxyl group is attached to each phenyl skeleton. β is such a number that the compound of formula (17) may have a weight average molecular weight of 1,000 to 5,000. γ is such a number that the compound of formula (18) may have a weight average molecular weight of 1,000 to 10,000.

Class II

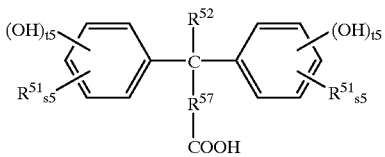
(26)

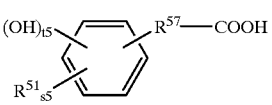
(27)

In the formulae, $R^{51}$, $R^{52}$, and $R^{57}$ are as defined above, and s5 and t5 are numbers satisfying s5≧0, t5≧0, and s5+t5+t5=5.

Exemplary of component (E) are compounds of the following formulae VIII-1 to VIII-14 and IX-1 to IX-6.

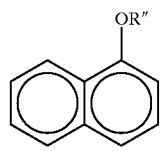
(VIII-1)

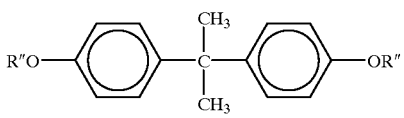
(VIII-2)

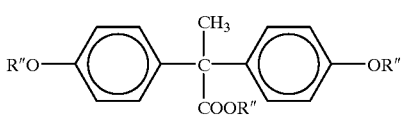
(VIII-3)

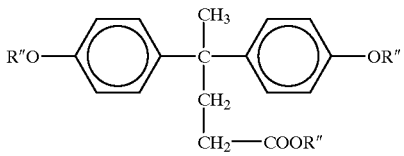
(VIII-4)

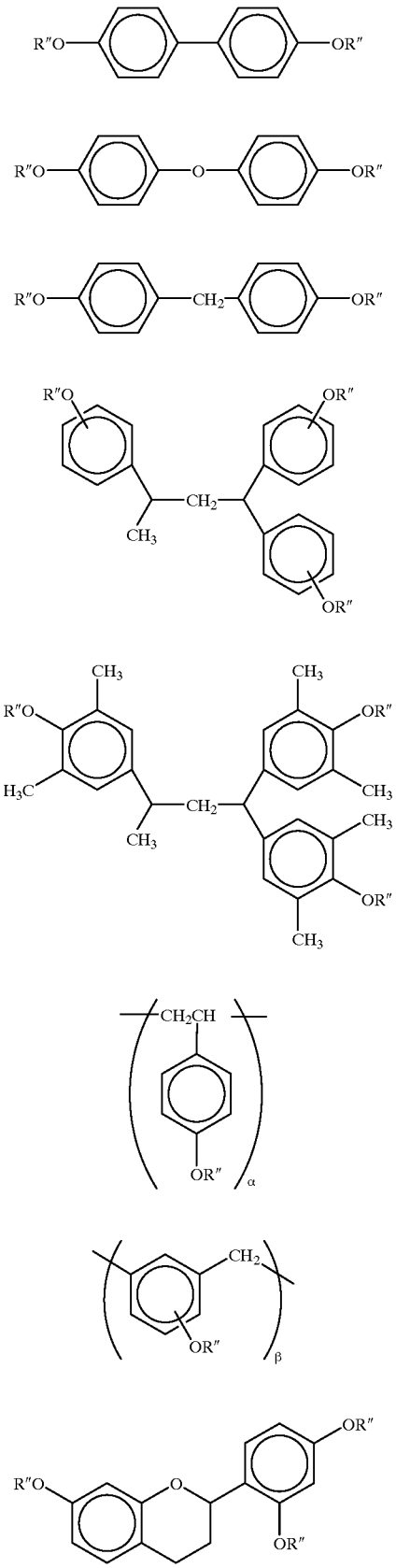

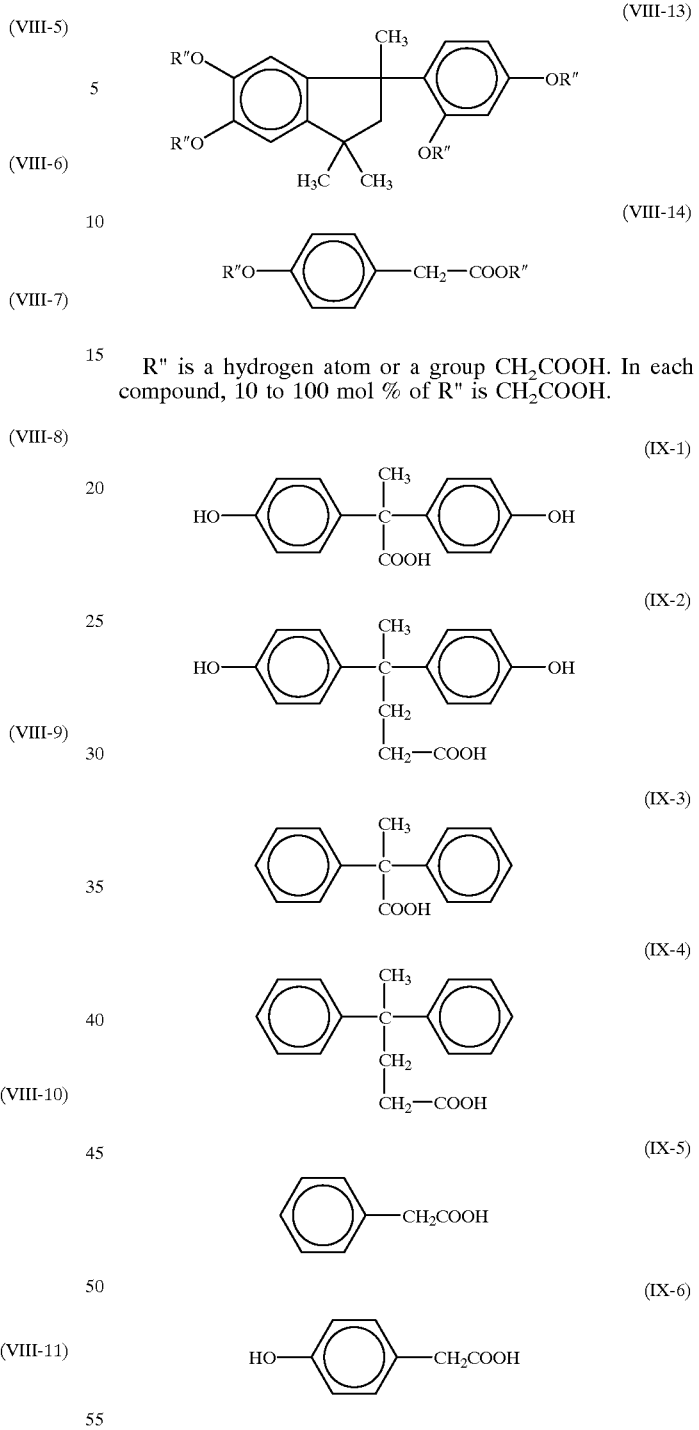

R″ is a hydrogen atom or a group CH$_2$COOH. In each compound, 10 to 100 mol % of R″ is CH$_2$COOH.

The aromatic compounds having a group ≡C—COOH in a molecule may be used alone or in admixture of two or more. It is preferably blended in the resist composition in an amount of 0.1 to 5 parts, preferably 1 to 3 parts by weight per 100 parts by weight of the base resin. Less than 0.1 part of the aromatic compound would be less effective for improving footing and PED on a nitride film substrate whereas more than 5 parts would adversely affect resolution.

In the resist composition of the invention, a UV absorber may be added as component (H). It is a compound having a molar absorptivity of up to 10,000 at a wavelength of 248 nm. Blending of the UV absorber enables to design and control a resist having an appropriate transmittance for substrates having different reflectance.

Exemplary UV absorbers are fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrobenzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (28) and (29); fused heterocyclic derivatives such as thioxanthen-9-one, thianthrene, dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)-benzophenone; and squalic acid derivatives such as squalic acid and dimethyl squalate.

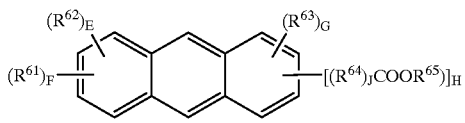

(28)

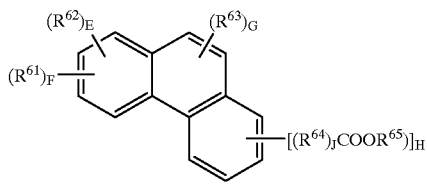

(29)

In formulae (28) and (29), $R^{61}$ to $R^{63}$ are independently hydrogen or a normal or branched alkyl, normal or branched alkoxy, normal or branched alkoxyalkyl, normal or branched alkenyl or aryl group. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{65}$ is an acid labile group. Letter J is equal to 0 or 1, E, F and G are 0 or integers of 1 to 9, H is a positive integer of 1 to 10 satisfying E+F+G+H≦10.

More particularly, $R^{61}$ to $R^{63}$ in formulae (28) and (29) are independently hydrogen or a normal or branched alkyl, normal or branched alkoxy, normal or branched alkoxyalkyl, normal or branched alkenyl or aryl group. The normal or branched alkyl groups are preferably those having 1 to 10 carbon atoms, for example, methyl, ethyl, n-propyl, isopropyl, n-butyl, sec-butyl, tert-butyl, hexyl, cyclohexyl and adamantly groups, with the methyl, ethyl, isopropyl and tert-butyl groups being especially preferred. The normal or branched alkoxy groups are preferably those having 1 to 8 carbon atoms, for example, methoxy, ethoxy, propoxy, isopropoxy, n-butoxy, sec-butoxy, tert-butoxy, hexyloxy, and cyclohexyloxy groups, with the methoxy, ethoxy, isopropoxy, and tert-butoxy groups being especially preferred. The normal or branched alkoxyalkyl groups are preferably those having 2 to 10 carbon atoms, for example, methoxymethyl, ethoxypropyl, propoxyethyl, and tert-butoxyethyl groups, with the methoxymethyl, methoxyethyl, ethoxypropyl and propoxyethyl groups being especially preferred. The normal or branched alkenyl groups are preferably those having 2 to 4 carbon atoms, for example, vinyl, propenyl, allyl, and butenyl groups. The aryl groups are preferably those having 6 to 14 carbon atoms, for example, phenyl, xylyl, toluyl, and cumenyl groups.

$R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Letter J is equal to 0 or 1. Where J=0, the —$R^{64}$— linkage is a valence bond. The substituted or unsubstituted divalent aliphatic hydrocarbon groups which may contain an oxygen atom are preferably those having 1 to 10 carbon atoms, for example, methylene, ethylene, n-propylene, isopropylene, n-butylene, sec-butylene, —$CH_2O$—, —$CH_2CH_2O$—, and —$CH_2OCH_2$— groups, with the methylene, ethylene, —$CH_2O$—, and —$CH_2CH_2O$— being especially preferred. The substituted or unsubstituted divalent alicyclic hydrocarbon groups which may contain an oxygen atom are preferably those having 5 to 10 carbon atoms, for example, 1,4-cyclohexylene, 2-oxacyclohexan-1,4-ylene, and 2-thiacyclohexan-1,4-ylene. The substituted or unsubstituted divalent aromatic hydrocarbon groups which may contain an oxygen atom include those having 6 to 14 carbon atoms, for example, o-phenylene, p-phenylene, 1,2-xylen-3,6-ylene, toluen-2,5-ylene, and 1-cumen-2,5-ylene groups, and arylalkylene groups having 6 to 14 carbon atoms, for example, —$CH_2Ph$—, —$CH_2PhCH_2$—, —$OCH_2Ph$—, and —$OCH_2PhCH_2O$— groups wherein Ph is phenylene.

$R^{65}$ is an acid labile group. The term acid labile group used herein is a carboxyl group which is replaced by at least one functional group decomposable in the presence of acid. The acid labile group is not particularly limited as long as it is decomposed in the presence of acid to release a functional group exhibiting alkali solubility. Preferred are groups of the following general formulae (30a), (30b), and (30c).

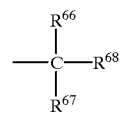

(30a)

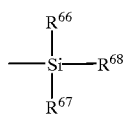

(30b)

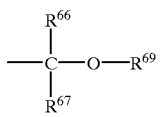

(30c)

In the formulae, $R^{66}$ to $R^{69}$ are independently hydrogen or a normal or branched alkyl, normal or branched alkoxy, normal or branched alkoxyalkyl, normal or branched alkenyl or aryl group, which may contain a carbonyl group in their chain. It is excluded that all of $R^{66}$ to $R^{69}$ are hydrogen. Alternatively, $R^{66}$ and $R^6$, taken together, may form a ring. $R^{69}$ is a normal or branched alkyl, normal or branched alkoxyalkyl, normal or branched alkenyl or aryl group, which may contain a carbonyl group in their chain. Alternatively, $R^{69}$ and $R^{66}$, taken together, may form a ring.

Examples of the normal or branched alkyl, normal or branched alkoxy, normal or branched alkoxyalkyl, normal or branched alkenyl, and aryl groups are as exemplified for $R^{61}$ to $R^{13}$.

The ring that $R^{66}$ forms with $R^{67}$ in formula (30a) includes those rings of 4 to 10 carbon atoms, for example, cyclohexylidene, cyclopentylidene, 3-oxycyclohexylidene, 3-oxo-4-oxacyclohexylidene, and 4-methylcyclohexylidene. The ring that $R^{66}$ forms with $R^{67}$ in formula (30b) includes those rings of 3 to 9 carbon atoms, for example, 1-silacyclohexylidene, 1-silacyclopentylidene, 3-oxo-1-silacyclopentylidene, and 4-methyl-1-silacyclopentylidene. The ring that $R^{69}$ forms with $R^{66}$ in formula (30c) includes those rings of 4 to 10 carbon atoms, for example, 2-oxacyclohexylidene, 2-oxacyclopentylidene, and 2-oxa-4-methylcyclohexylidene.

Examples of the group of formula (30a) include tertiary alkyl groups of 4 to 10 carbon atoms, such as tert-amyl, 1,1-dimethylethyl, 1,1-dimethylbutyl, 1-ethyl-1-methylpropyl, and 1,1-diethylpropyl, and 3-oxoalkyl groups such as 1,1-dimethyl-3-oxobutyl, 3-oxocyclohexyl, and 1-methyl-3-oxo-4-oxacyclohexyl groups.

Examples of the group of formula (30b) include trialkylsilyl groups of 3 to 10 carbon atoms, such as trimethylsilyl, ethyldimethylsilyl, dimethylpropylsilyl, diethylmethylsilyl, and triethylsilyl groups.

Examples of the group of formula (30c) include groups of 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-iso-butoxyethyl, 1-tert-pentoxyethyl, 1-cyclohexyloxyethyl, 1-(2'-n-butoxyethoxy)ethyl, 1-(2'-ethylhexyl)oxyethyl, 1-(4'-acetoxymethylcyclohexylmethyloxy)ethyl, 1-{4'(tert-butoxy carbonyloxymethyl)cyclohexylmethyloxy}ethyl, 2-methoxy-2-propyl, 1-ethoxyprbpyl, dimethoxymethyl, diethoxymethyl, tetrahydrofuranyl, and tetrahydropyranyl groups.

In formulae (28) and (29), E, F and G are 0 or integers of 1 to 9, H is a positive integer of 1 to 10 satisfying E+F+G+H≦10.

Preferred examples of the compounds of formulae (28) and (29) are compounds of the general formulae (31a) to (31j) shown below.

(31a)
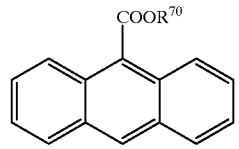

(31b)
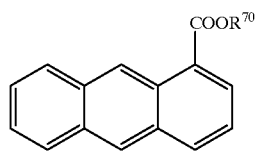

(31c)
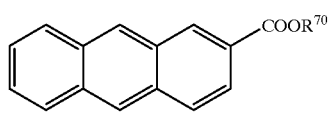

(31d)
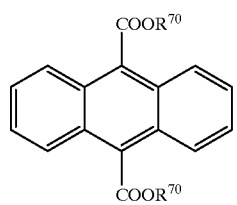

(31e)
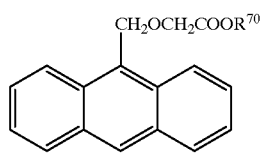

(31f)
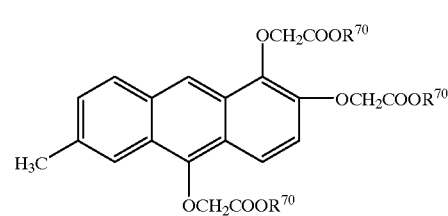

(31g)
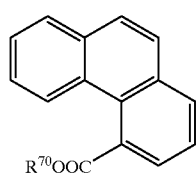

(31h)
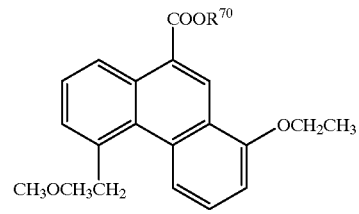

(31i)
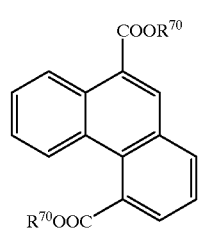

(31j)
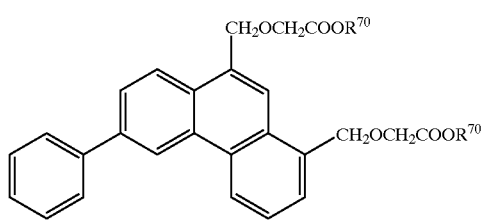

In the formulae, $R^{70}$ is an acid labile group.

Other useful UV absorbers are diaryl sulfoxide derivatives such as bis(4-hydroxyphenyl) sulfoxide, bis(4-tertbutoxyphenyl) sulfoxide, bis(4-tert-butoxy-carbonyloxyphenyl) sulfoxide, and bis[4—(1-ethoxyethoxy)-phenyl] sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl] sulfone; diazo compounds such as benzoquinonediazide, naphthoquinonediazide, anthraquinonediazide, diazofluorene, diazotetralone, and diazophenanthrone; and quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone.

Preferred UV absorbers are tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds between naphthoquinone-1,2-diazide-5-sulfonic acid chloride and 2,3,4-trihydroxybenzophenone.

The amount of UV absorber (H) blended is preferably 0 to 10 parts, more preferably 0.5 to 10 parts, most preferably 1 to 5 parts by weight per 100 parts by weight of the base resin.

In the resist composition of the invention, an acetylene alcohol derivative may be blended as component (I) for improving shelf stability. The acetylene alcohol derivative used herein is preferably selected from compounds of the following general formulae (32) and (33).

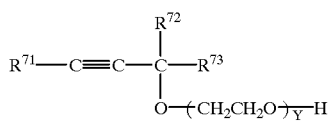

(32)

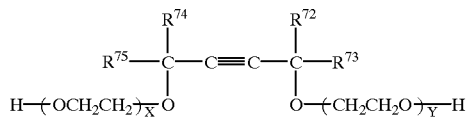

(33)

In formulae (32) and (33), $R^{71}$, $R^{72}$, $R^{73}$, $R^{74}$, and $R^{75}$ each are hydrogen or a normal, branched or cyclic alkyl group having 1 to 8 carbon atoms, X and Y are 0 or positive numbers satisfying $0 \leq X \leq 30$, $0 \leq Y \leq 30$, and $0 \leq X+Y \leq 40$.

Useful acetylene alcohol derivatives are commercially available from Air Products and Chemicals Inc. under the trade name of Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485.

The acetylene alcohol derivative is preferably added in an amount of 0.01 to 2%, more preferably 0.02 to 1% by weight based on the resist composition. Less than 0.01% by weight of the acetylene alcohol derivative would be ineffective for improving coating and shelf stability whereas more than 2% by weight would result in a resist composition with low resolution.

The resist composition of the invention may further contain various additives, for example, a surface-active agent for facilitating coating. The amounts of such optional additives blended are conventional insofar as the objects of the invention are not impaired. Nonionic surfactants are preferred. Examples of the surfactant include perfluoroalkyl polyoxyethylene ethanols, fluorinated alkyl esters, perfluoroalkylamine oxides, and fluorinated organosiloxane compounds. Useful surfactants are commercially available under the trade name of Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nihon Ink Industry K.K., and X-70-092 and X-70-093 from Shin-Etsu Chemical Co., Ltd. Preferred surfactants are Florade FC-430 from Sumitomo 3M K.K. and X-70–093 from Shin-Etsu Chemical Co., Ltd.

Any well-known lithography may be used to form a resist pattern from a positive resist composition of the invention. For example, the resist composition is spin coated onto a silicon wafer and prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation having a wavelength of up to 300 nm such as deep-UV, excimer laser light, and X-ray or electron beam in an exposure dose of about 1 to 200 mJ/cm², preferably about 10 to 100 mJ/cm². The film is further baked on a hot plate at 60 to 150° C. for 1 to 5 minutes, preferably 80 to 120° C. for 1 to 3 minutes (post-exposure baking= PEB). Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired positive resist pattern is formed on the substrate.

The chemically amplified positive resist composition of the invention is best suited for fine patterning with actinic radiation, especially radiation having a wavelength of 254 to 193 nm such as deep-UV, excimer laser light, and X-ray and electron beam. Outside the range, a failure to provide the desired pattern can occur.

The chemically amplified positive resist composition of the invention is sensitive to actinic radiation, has improved sensitivity, resolution and plasma etching resistance, and produces a heat resistant resist pattern in a reproducible manner. The pattern is unlikely to overhang and dimensional control is improved. By blending an acetylene alcohol derivative, the resist composition is improved in storage stability. Owing to these advantages, the chemically amplified positive resist composition of the invention provides a resist material having less absorption at the exposure wavelength of a KrF excimer laser. A fine pattern having a wall perpendicular to the substrate is easily formed. Thus the composition is suitable as a fine patterning material for the manufacture of ultra-LSIs.

EXAMPLE

Examples of the present invention are given below by way of illustration and not by way of limitation.
Synthesis Example 1
In a 2-liter flask, 100 grams of polyhydroxystyrene was dissolved in 1,000 ml of dimethylformamide and a catalytic amount of p-toluenesulfonic acid was added thereto. With stirring at 20° C., 30 grams of ethyl vinyl ether and 2 grams of triethylene glycol divinyl ether were added to the flask. After reaction for one hour, the reaction solution was neutralized with conc. aqueous ammonia and added dropwise to liters of water, yielding white solids. The solids were collected by filtration, dissolved in 500 ml of acetone, and added dropwise to 10 liters of water. After filtration, the solids were dried in vacuum. The thus obtained polymer which had a rational formula (Polym.1) was analyzed by $^1$H-NMR to find that the hydrogen atom of a hydroxyl group of polyhydroxystyrene was ethoxyethylated 27% and crosslinked 3%.

Synthesis Example 2

In a 2-liter flask, 100 grams of polyhydroxystyrene was dissolved in 1,000 ml of dimethylformamide and a catalytic amount of p-toluenesulfonic acid was added thereto. With stirring at 20° C., 30 grams of ethyl vinyl ether and 2 grams of 1,4-di(vinyloxymethyl), cyclohexane were added to the flask. After reaction for one hour, the reaction solution was neutralized with conc. aqueous ammonia and added dropwise to liters of water, yielding white solids. The solids were collected by filtration, dissolved in 500 ml of acetone, and added dropwise to 10 liters of water. After filtration, the solids were dried in vacuum. The thus obtained polymer was analyzed by $^1$H-NMR to find that the hydrogen atom of a hydroxyl group of polyhydroxystyrene was ethoxyethylated 27% and crosslinked 3%.

Next, 50 grams of the partially crosslinked ethoxyethylated polyhydroxystyrene was dissolved in 500 ml of pyridine. With stirring at 45° C., 7 grams of di-tert-butyl dicarbonate was added to the solution. After reaction for one hour, the reaction solution was added dropwise to 3 liters of water, yielding white solids. The solids were collected by filtration, dissolved in 50 ml of acetone, and added dropwise to 2 liters of water. After filtration, the solids were dried in vacuum. The thus obtained polymer which had the structure of a rational formula (Polym.2) was analyzed by $^1$H-NMR to find that 27% of the hydrogen atom of a hydroxyl group of polyhydroxystyrene was ethoxyethylated and 8% of the hydrogen atom of a hydroxyl group was replaced by tert-butoxycarbonyl.

Synthesis Example 3

In a 2-liter flask, 50 grams of polyhydroxystyrene was dissolved in 500 ml of dimethylformamide and a catalytic amount of p-toluenesulfonic acid was added thereto. With stirring at 20° C., 27 grams of ethyl vinyl ether and 3 grams of 1,4-di(vinyloxymethyl)cyclohexane were added to the flask. After reaction for one hour, the reaction solution was neutralized with conc. aqueous ammonia and added dropwise to 10 liters of water, yielding white solids. The solids were collected by filtration, dissolved in 500 ml of acetone, and added dropwise to 10 liters of water. After filtration, the solids were dried in vacuum. The thus obtained polymer which had a rational formula (Polym.3) was analyzed by $^1$H-NMR to find that the hydrogen atom of a hydroxyl group of polyhydroxystyrene was ethoxyethylated 24% and crosslinked 10%.

Synthesis Examples 4–7

Polymers represented by rational formulae (Polym.4) to (Polym.7) were obtained by the same procedure as in Synthesis Examples 1 to 3.

Synthesis Example 8

In a 2-liter flask, 100 grams of polyhydroxystyrene was dissolved in 900 grams of tetrahydrofuran and 3.9 grams of methanesulfonic acid was added thereto. With stirring at 30° C., 28.2 grams of ethyl 1-propenyl ether was added to the flask and reaction was continued for 3 hours. Thereafter 3.8 grams of 1,4-butane diol divinyl ether was added. After reaction for ½ hour, the reaction solution was neutralized with conc. aqueous ammonia. The reaction solution was solvent exchanged with ethyl acetate. Using a separatory funnel together with pure water and a small amount of acetone, the solution was purified 6 times. The solution was solvent exchanged again with acetone and added dropwise to 20 liters of water, yielding white solids. The solids were collected by filtration, washed 2 times with pure water, collected by filtration, and dried in vacuum. The thus obtained polymer which had the structure of a rational formula (Polym.8) was analyzed by $^1$H-NMR to find that 26% of the hydrogen atom of a hydroxyl group of polyhydroxystyrene was replaced by ethoxypropoxy and 5.5% crosslinked.

Synthesis Example 9

In a 2-liter flask, 100 grams of polyhydroxystyrene was dissolved in 900 grams of tetrahydrofuran and 3.9 grams of methanesulfonic acid was added thereto. with stirring at 30° C., 20.0 grams of ethyl 1-propenyl ether was added to the flask and reaction was continued for 3 hours. Thereafter 3.8 grams of 1,4-butane diol divinyl ether was added. After reaction for ½ hour, the reaction solution was neutralized with conc. aqueous ammonia. The reaction solution was solvent exchanged with ethyl acetate. Using a separatory funnel together with pure water and a small amount of acetone, the solution was purified 6 times. The solution was solvent exchanged again with acetone and added dropwise to 20 liters of water, yielding white solids. The solids were collected by filtration, washed 2 times with pure water, collected by filtration, and dried in vacuum.

Next, 50 grams of the partially crosslinked, ethoxypropoxy-substituted polyhydroxystyrene was dissolved in 300 grams of pyridine. With stirring at 40° C., 4.5 grams of di-tert-butyl dicarbonate was added to the solution. After reaction for one hour, the reaction solution was added dropwise to 10 liters of water, yielding white solids. The solids were collected by filtration, dissolved in 200 ml of acetone, and added dropwise to 2 liters of water. After filtration, the solids were dried in vacuum. The thus obtained polymer which had a rational formula (Polym.9) was analyzed by $^1$H-NMR to find that the hydrogen atom of a hydroxyl group of polyhydroxystyrene was replaced 21% by ethoxypropoxy and 5% by tert-butoxycarbonyl and crosslinked 5.5%.

Synthesis Example 10

In a 2-liter flask, 100 grams of polyhydroxystyrene was dissolved in 900 grams of tetrahydrofuran and 3.9 grams of methanesulfonic acid was added thereto. With stirring at 30° C., 24.0 grams of ethyl vinyl ether was added to the flask and reaction was continued for one hour. Thereafter 3.8 grams of 1,4-butane diol divinyl ether was added. After reaction for ½ hour, the reaction solution was neutralized with conc. aqueous ammonia. The reaction solution was solvent exchanged with ethyl acetate. Using a separatory funnel together with pure water, the solution was purified 6 times. The solution was solvent exchanged again with acetone and added dropwise to 20 liters of water, yielding white solids. The solids were collected by filtration, washed 2 times with pure water, collected by filtration, and dried in vacuum. The thus obtained polymer which had the structure of a rational formula (Polym.10) was analyzed by $^1$H-NMR to find that the hydrogen atom of a hydroxyl group of polyhydroxystyrene was ethoxyethylated 31% and crosslinked 5.5%.

Synthesis Example 11

In a 2-liter flask, 100 grams of polyhydroxystyrene was dissolved in 900 grams of tetrahydrofuran and 3.9 grams of methanesulfonic acid was added thereto. With stirring at 30° C., 16.4 grams of ethyl vinyl ether was added to the flask and reaction was continued for one hour. Thereafter 3.8 grams of 1,4-butane diol divinyl ether was added. After reaction for ½ hour, the reaction solution was neutralized with conc. aqueous ammonia. The reaction solution was solvent exchanged with ethyl acetate. Using a separatory funnel together with pure water and a small amount of acetone, the solution was purified 6 times. The solution was solvent exchanged again with acetone and added dropwise to 20 liters of water, yielding white solids. The solids were collected by filtration, washed 2 times with pure water, collected by filtration, and dried in vacuum.

Next, 50 grams of the partially crosslinked, ethoxyethoxy-substituted polyhydroxystyrene was dissolved in 300 grams of pyridine. With stirring at 40° C., 4.5 grams of di-tert-butyl dicarbonate was added to the solution. After reaction for one hour, the reaction solution was added dropwise to 10 liters of water, yielding white solids. The solids were collected by filtration, dissolved in 200 ml of acetone, and added dropwise to 2 liters of water. After filtration, the solids were dried in vacuum. The thus obtained polymer which had the structure of a rational formula (Polym.11) was analyzed by $^1$H-NMR to find that the hydrogen atom of a hydroxyl group of polyhydroxystyrene was replaced 18.0% by ethoxyethoxy and 5% by tert-butoxycarbonyl and crosslinked 5.5%.

Synthesis Example 12

A polymer represented by a rational formula (Polym.12) was obtained by the same procedure as in Synthesis Example 11 except that ethyl vinyl ether was omitted.

Synthesis Example 13

A polymer represented by a rational formula (Polym.13) was obtained by the same procedure as in Synthesis Example 11 except that poly(3,4-dihydroxystyrene) and alkenyl ether compound (I-22) were used.

Synthesis Example 14

A polymer represented by a rational formula (Polym.14) was obtained by the same procedure as in Synthesis Example 9 except that alkenyl ether compound (II-1) was used.

The rational formulae representing the structure of the above-synthesized polymers are given below. In the following formulae, R' represents a crosslinking group crosslinking the following unit $U_1$ or $U_2$ within a molecule or between molecules, and (R') shows that a crosslinking group R' is bonded.

(Polym.1~12)

$U_1$

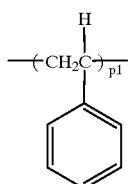

$U_2$

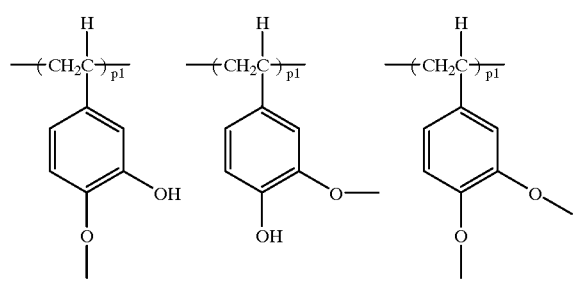

Polym. 1

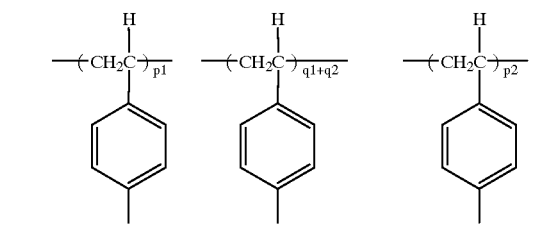

Polym. 2

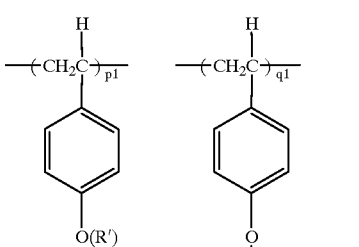

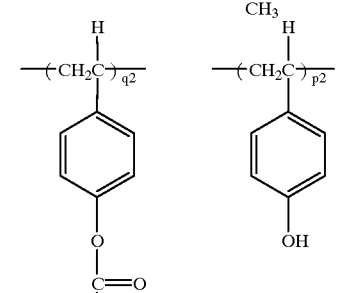

Polym. 3

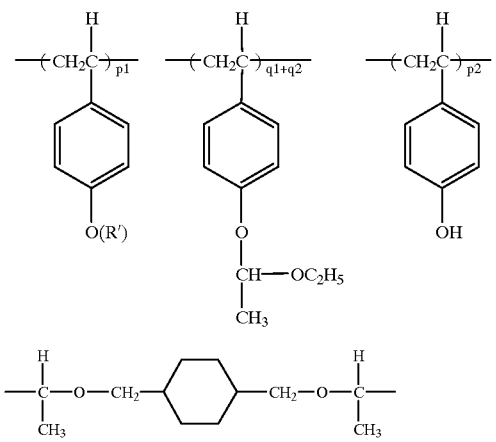

Polym. 4
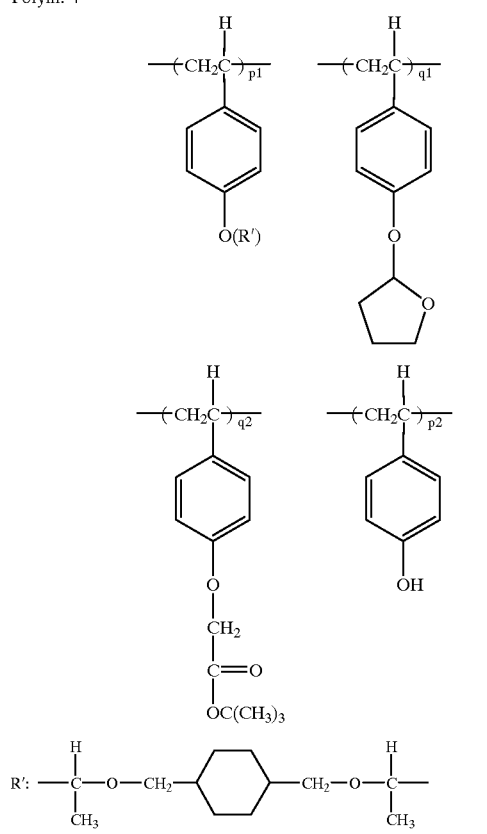
Polym. 5
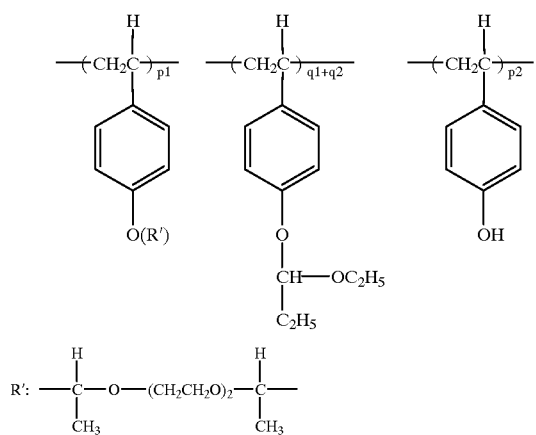
Polym. 6
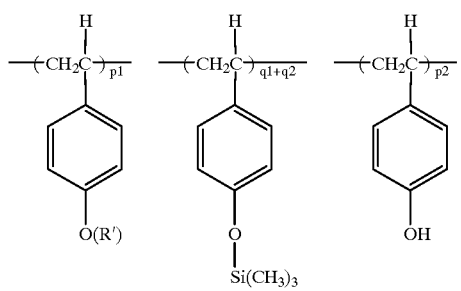
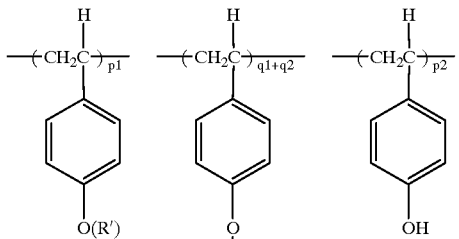
Polym. 7
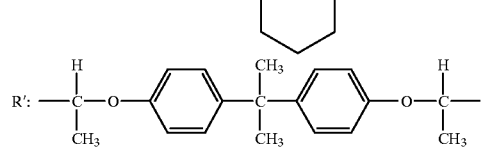
Polym. 8
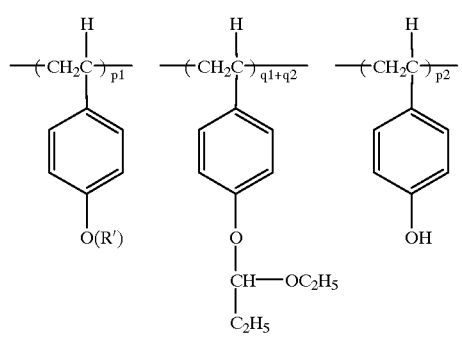
Polym. 9
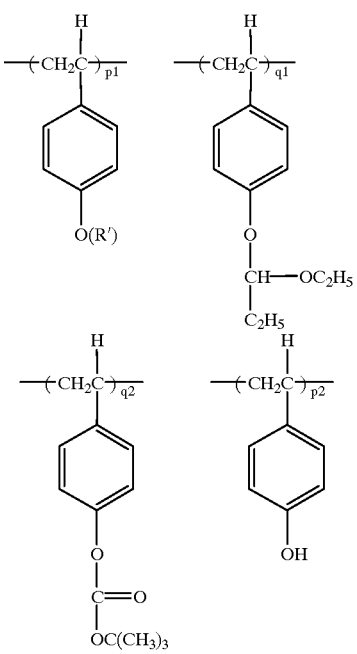

-continued
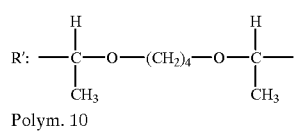
Polym. 10
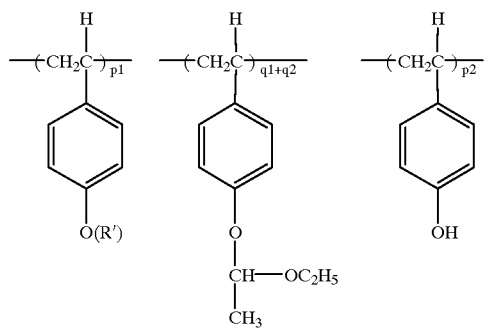
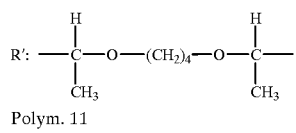
Polym. 11
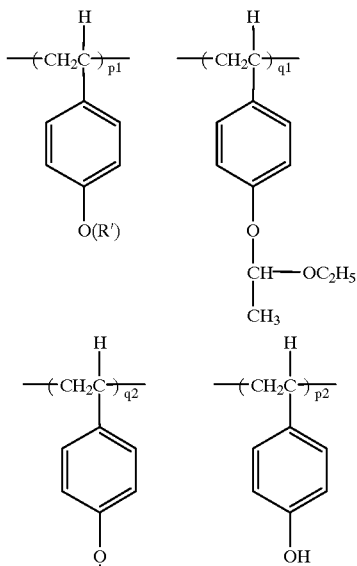
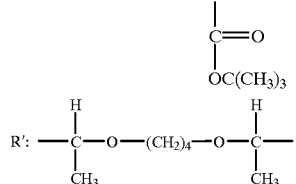
Polym. 12
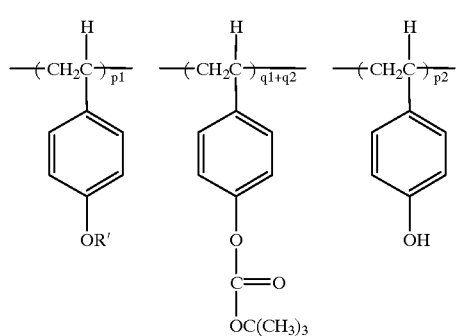
-continued
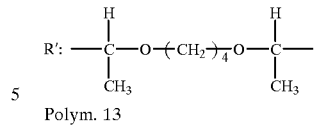
Polym. 13
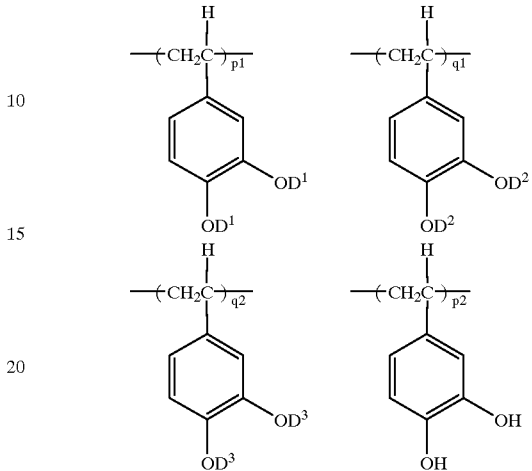
$D^1$ = H or (R')
$D^2$ = H or —CH(C$_2$H$_5$)—OC$_2$H$_5$
$D^3$ = H or —C(O)—OC(CH$_3$)$_3$
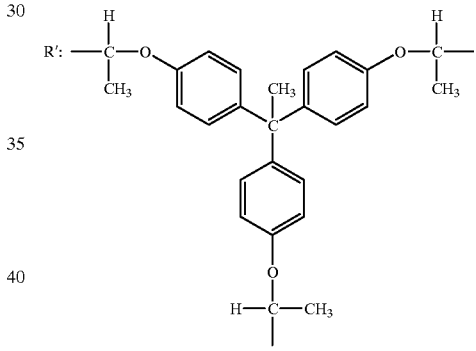
Note that at least one $D^1$ is R, at least one $D^2$ is —CH(C$_2$H$_5$)—OC$_2$H$_5$, and at least one $D^3$ is —C(O)—OC(CH$_3$)$_3$.
Polym. 14
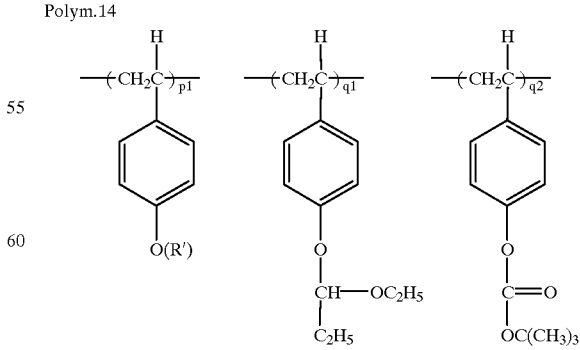

-continued

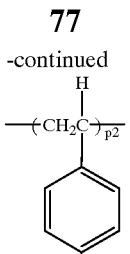

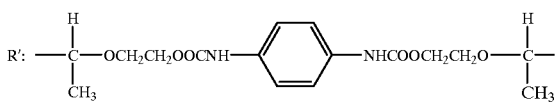

TABLE 1

| Synthesis Example | Compositional ratio (molar ratio) | | | | PHS* Mw | PHS* Mw/Mn | Polymer Mw |
|---|---|---|---|---|---|---|---|
| | p1 | q1 | q2 | p2 | | | |
| 1 (polym. 1) | 3 | | 27 | 70 | 11,000 | 1.05 | 22,000 |
| 2 (Polym. 2) | 3 | 27 | 8 | 62 | 11,000 | 1.05 | 23,000 |
| 3 (Polym. 3) | 10 | | 24 | 66 | 5,000 | 1.05 | 12,000 |
| 4 (Polym. 4) | 7 | 10 | 5 | 78 | 5,000 | 1.05 | 12,000 |
| 5 (Polym. 5) | 4 | | 35 | 61 | 11,000 | 1.42 | 24,000 |
| 6 (Polym. 6) | 7 | | 25 | 68 | 13,000 | 1.15 | 30,000 |
| 7 (Polym. 7) | 10 | | 20 | 70 | 3,000 | 1.10 | 8,000 |
| 8 (Polym. 8) | 5.5 | | 26 | 68.5 | 11,000 | 1.05 | 22,000 |
| 9 (Polym. 9) | 5.5 | 21 | 5 | 68.5 | 11,000 | 1.05 | 24,000 |
| 10 (Polym. 10) | 5.5 | | 31 | 63.5 | 11,000 | 1.05 | 25,000 |
| 11 (Polym. 11) | 5.5 | 18 | 5 | 71.5 | 11,000 | 1.05 | 24,000 |
| 12 (Polym. 12) | 4 | | 18 | 78 | 10,000 | 1.08 | 23,000 |
| 13 (Polym. 13) | 4 | 20 | 4 | 72 | 10,000 | 1.20 | 25,000 |
| 14 (Polym. 14) | 2 | 21 | 5 | 71 | 10,000 | 1.30 | 27,000 |

*PHS: polyhydroxystyrene

Examples 1–27 & Comparative Example 1–5

Liquid resist compositions were prepared by dissolving a base resin designated (Polym.1) to (Polym.14), a photoacid generator designated PAG.1 to PAG.12, a dissolution controller designated DRR.1 to DRR.4, a basic compound as shown in Tables 2 and 3, an aromatic compound having a group ≡C—COOH within a molecule designated ACC.1 and ACC.2, and a UV absorber designated DYE.1 and DYE.2 in a solvent in accordance with the formulation shown in Tables 2 and 3. If necessary, 0.1 part of a surfactant Florade FC-430 by Sumitomo 3M K.K. was added for facilitating film formation.

For comparison purposes, liquid resist compositions were similarly prepared in accordance with the formulation shown in Table 4 using a base resin designated (Polym.15) to (Polym.18).

Each of the compositions was passed through a 0.1-μm Teflon® filter. The liquid resist composition was then spin coated onto a silicon wafer. With the silicon wafer rested on a hot plate ate at 100° C., the coating was pre-baked for 90 seconds. The film was 0.55 μm thick. The film was exposed to light by means of an excimer laser stepper model NSR-2005EX (manufactured by Nikon K.K., numerical aperture NA =0.5) through a mask having a desired pattern, baked at 110° C. for 90 seconds, and developed with an aqueous solution of 2.38% tetramethylammonium hydroxide for 60 seconds, obtaining a positive pattern.

The resulting resist pattern was evaluated as follows. First, a sensitivity (Eth value) was determined. Provided that the exposure dose with which the top and bottom of a 0.24-μm line-and-space pattern were resolved at 1:1 was the optimum exposure dose (sensitivity Eop), the minimum line width of a line-and-space pattern which was recognized separate at this exposure dose was the resolution of a test resist. The resolution was also determined under the same conditions except that the post-exposure delay (PED) time from exposure to heat treatment was 2 hours. The profile of the resist pattern resolved was observed under a scanning electron microscope.

In a heat resistance test, each resist pattern was heated on a hot plate ate at 130° C. for 10 minutes to observe any change of pattern shape before and after heating. The resist pattern was rated "O" (passed) for no change of pattern shape before and after heating and "X" (rejected) when the pattern was degraded by sagging after heating.

Tables 2 and 4 show the formulation of resist compositions. The test results of Examples and Comparative Examples are shown in Tables 5 and 6, respectively.

(PAG. 1)

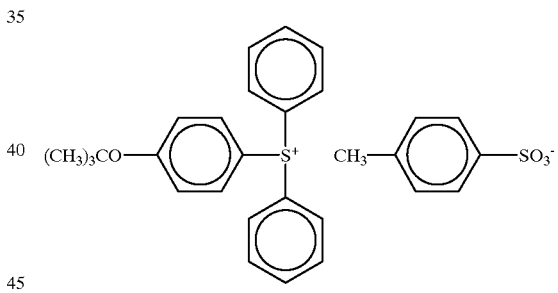

(PAG. 2)

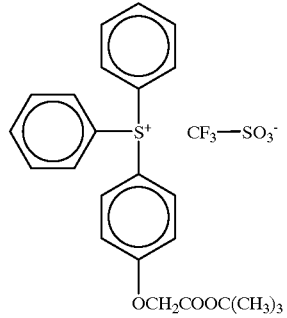

(PAG. 3)

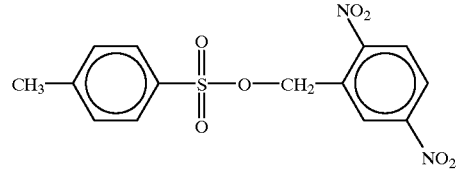

(PAG. 4)
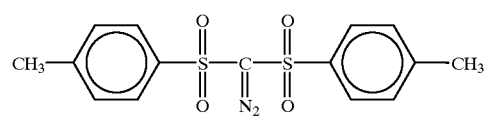
(PAG. 5)
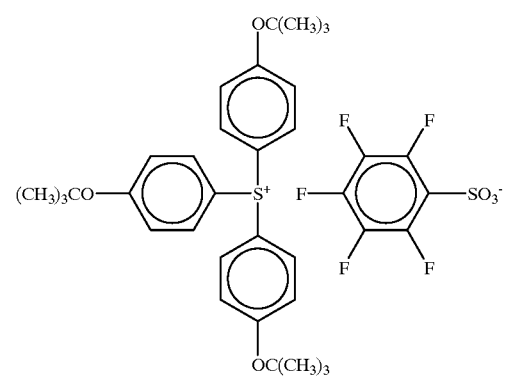
(PAG. 6)
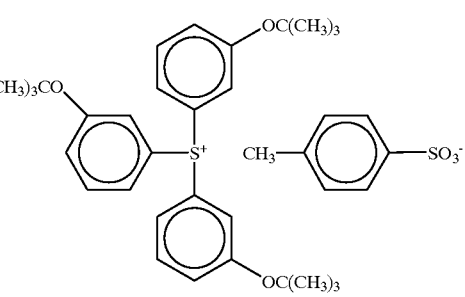
(PAG. 7)
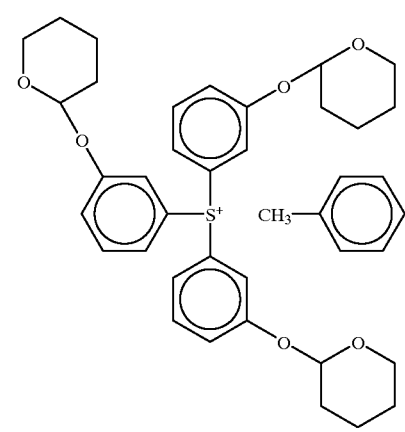
(PAG. 8)
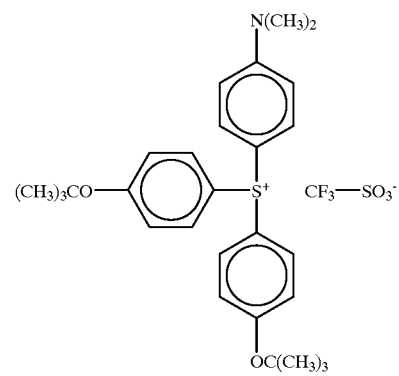
(PAG. 9)
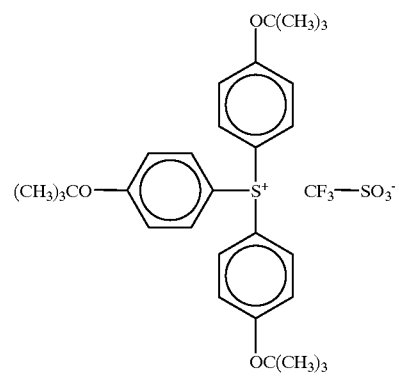
(PAG. 10)
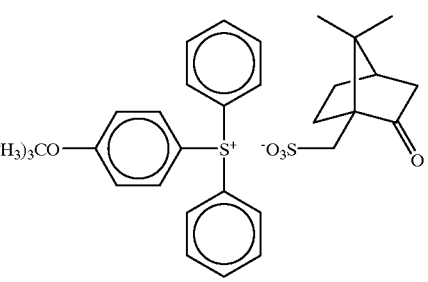
(PAG. 12)
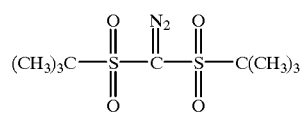
(PAG. 13)
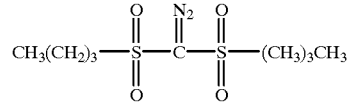
(DRR. 1)
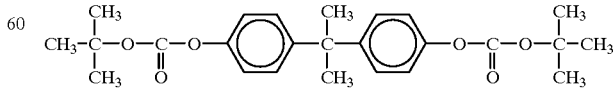

(DRR. 2)
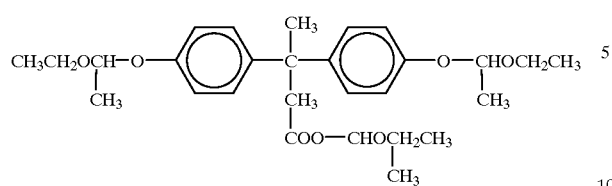
(DRR. 3)
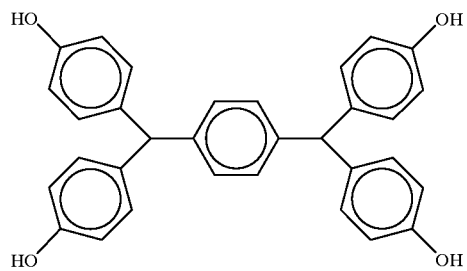
acid labile group:
tert-butoxycarbonyl
average substitution:
50%
(DRR. 4)
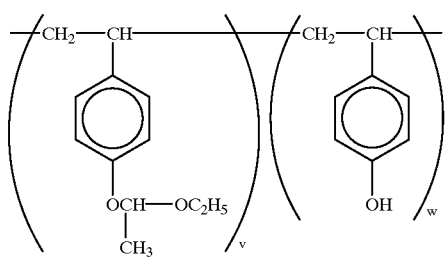
$v/(v+w) = 0.09$
weight average
molecular weight:
3,000
ACC. 1
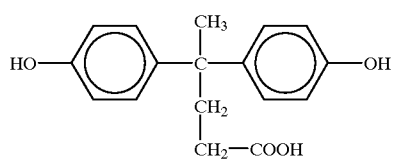
ACC. 2
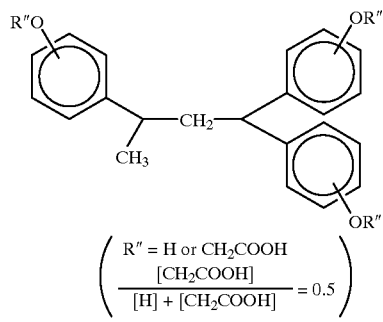
$$\left( R'' = H \text{ or } CH_2COOH \quad \frac{[CH_2COOH]}{[H] + [CH_2COOH]} = 0.5 \right)$$
DYE. 1
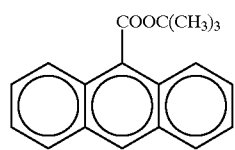
DYE. 2
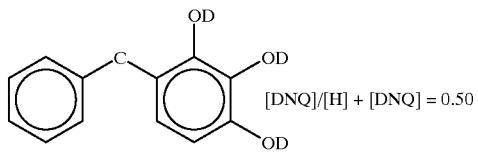
$[DNQ]/[H] + [DNQ] = 0.50$
D = H or
(DNQ)
Polym. 15
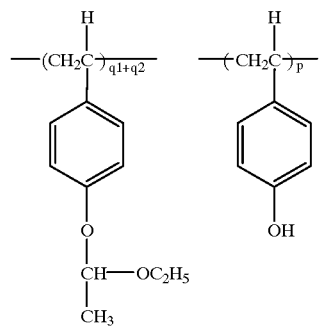
Mw = 12,000
Mw/Mn = 2.0
q1 + q2/(q1 + q2 + p) = 0.35
Polym. 16
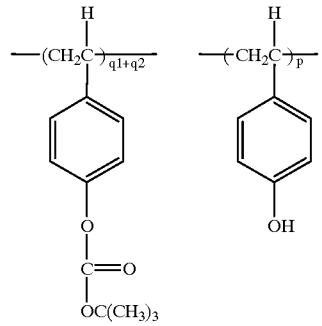
Mw = 15,000
Mw/Mn = 1.5
q1 + q2/(q1 + q2 + p) = 0.20
Polym. 17
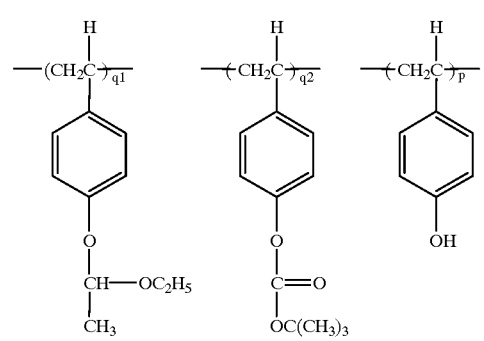
Mw = 12,000
Mw/Mn = 1.1
q1/(q1 + q2 + p) = 0.08

-continued

Polym. 18

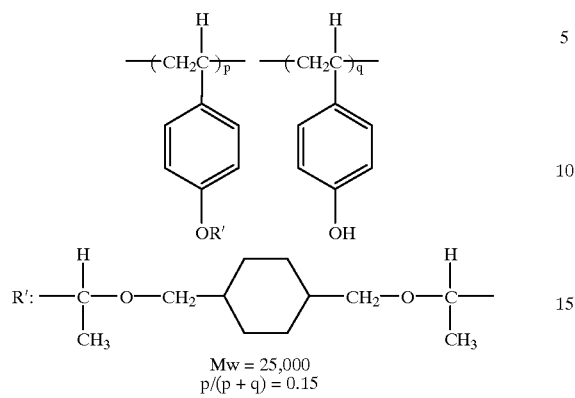

Mw = 25,000
p/(p + q) = 0.15

TABLE 2

| No. | Base resin | Photoacid generator | Dissolution controller | Basic compound | Other additive | Organic solvent |
|---|---|---|---|---|---|---|
| E1 | Polym. 1 (80) | PAG. 1 (3) | — | N,N-diethylethanolamine (0.1) | ACC. 1 (0.2) | PGMEA (530) |
| E2 | Polym. 2 (80) | PAG. 2 (3) | — | N,N-diethylethanolamine (0.1) | ACC. 1 (0.2) | PGMEA (530) |
| E3 | Polym. 3 (80) | PAG. 3 (3) | — | N-methylpyrrolidone (0.1) | ACC. 1 (0.2) | DGLM (300) |
| E4 | Polym. 4 (80) | PAG. 4 (3) | — | triethanolamine (0.1) | ACC. 1 (0.2) | PGMEA (530) |
| E5 | Polym. 5 (80) | PAG. 5 (3) | — | 2-hydroxypyridine (0.11) | ACC. 1 (0.2) | PGMEA (530) |
| E6 | Polym. 6 (80) | PAG. 6 (3) | DRR. 1 (16) | N,N,N',N'-tetramethyl-ethylenediamine (0.09) | ACC. 1 (0.2) | PGMEA (530) |
| E7 | Polym. 7 (80) | PAG. 1 (3.5) PAG. 8 (0.5) | DRR. 3 (16) | triethanolamine (0.09) | ACC. 1 (0.2) | EIPA (580) |
| E8 | Polym. 8 (80) | PAG. 1 (1) PAG. 11 (2) | — | triethanolamine (0.1) piperidine ethanol (0.05) | ACC. 1 (0.2) | PGMEA (530) |
| E9 | Polym. 9 (80) | PAG. 1 (1) PAG. 12 (2) | — | triethanolamine (0.1) 1,8-diazabicycloundecene (0.05) | ACC. 1 (0.5) | PGMEA (530) |
| E10 | Polym. 10 (80) | PAG. 9 (2) PAG. 7 (1) | DRR.2 (8) | N-methylpyrrolidone (0.1) | ACC. 1 (0.2) | EL/BA (510) |
| E11 | Polym. 11 (80) | PAG. 9 (2) PAG. 10 (1) | DRR. 4 (8) | N,N-dimethylacetamide (5.0) | ACC. 1 (0.2) | EL/BA (510) |
| E12 | Polym. 10 (50) Polym. 12 (30) | PAG. 1 (4) | — | tributylamine (0.03) N,N-dimethylacetamide (5.0) | ACC. 1 (0.2) | PGMEA (530) |
| E13 | Polym. 10 (40) Polym. 13 (40) | PAG. 1 (4) | DRR. 2 (4) | 2-hydroxypyridine (0.11) | ACC. 2 (2) | PGMEA (530) |

TABLE 3

| No. | Base resin | Photoacid generator | Dissolution controller | Basic compound | Other additive | Organic solvent |
|---|---|---|---|---|---|---|
| | | | Resist composition (pbw in parentheses) | | | |
| E14 | Polym. 9 (35) Polym. 15 (45) | PAG. 9 (4) | — | triethanolamine (0.1) | ACC. 1 (1) | PGMEA (530) |
| E15 | Polym. 8 (80) | PAG. 1 (1) PAG. 11 (2) | — | triethanolamine (0.05) | ACC. 1 (0.2) DYE. 1 (1.2) | PGMEA (530) |
| E16 | Polym. 9 (80) | PAG. 1 (1) PAG. 11 (2) | — | piperidine ethanol (0.05) | ACC. 1 (0.2) DYE. 2 (4) | PGMEA (530) |
| E17 | Polym. 10 (80) | PAG. 1 (1) PAG. 12 (2) | — | triethanolamine (0.05) | ACC. 1 (0.2) DYE. 1 (1.2) | PGMEA (530) |
| E18 | Polym. 11 (80) | PAG. 1 (1) PAG. 12 (2) | — | piperidine ethanol (0.05) | ACC. 1 (0.2) DYE. 2 (4) | PGMEA (530) |
| E19 | Polym. 1 (80) | PAG. 1 (2) | DRR. 1 (4) DRR. 3 (4) | N-methylpyrrolidone (0.05) | ACC. 1 (0.2) | PGMEA/EP (530) |
| E20 | Polym. 1 (80) | PAG. 1 (2) | DRR. 2 (4) DRR. 4 (4) | N-methylpyrrolidone (0.05) | ACC. 1 (0.2) | PGMEA/CH (530) |
| E21 | Polym. 2 (80) | PAG. 1 (2) | — | N-methylpyrrolidone (0.05) | ACC. 1 (0.2) | PGMEA (530) |
| E22 | Polym. 2 (80) | PAG. 1 (2) | — | N-methylpyrrolidone (0.05) | ACC. 1 (0.2) | PGMEA (530) |
| E23 | Polym. 12 (80) | PAG. 1 (1.5) | — | triethanolamine (0.08) | ACC. 1 (0.2) | PGMEA/EL (530) |
| E24 | Polym. 13 (80) | PAG. 1 (1.5) | — | triethanolamine (0.08) | ACC. 1 (0.2) | PGMEA/EL (530) |
| E25 | Polym. 14 (80) | PAG. 2 (4) | — | N,N-dimethylacetamide (1.0) | ACC. 1 (2) | PGMEA/EL (530) |
| E26 | Polym. 8 (40) Polym. 17 (40) | PAG. 1(1) PAG. 4(2) PAG. 11 (2) | — | triethanolamine (0.3) | ACC. 1 (1) | PGMEA/EL (530) |
| E27 | Polym. 8 (80) | PAG. 4 (0.5) PAG. 11 (2) | — | triethanolamine (0.1) | ACC. 1 (1) | PGMEA/EL (530) |

TABLE 4

| No. | Base resin | Photoacid generator | Dissolution controller | Basic compound | Other additive | Organic solvent |
|---|---|---|---|---|---|---|
| | | | Resist composition (pbw in parentheses) | | | |
| CE1 | Polym. 15 (80) | PAG. 1 (2) | — | N-methylpyrrolidone (0.05) | — | PGMEA (530) |
| CE2 | Polym. 16 (80) | PAG. 1 (2) | — | N-methylpyrrolidone (0.05) | — | PGMEA (530) |
| CE3 | Polym. 17 (80) | PAG. 1 (2) | — | N-methylpyrrolidone (0.05) | — | PGMEA (530) |
| CE4 | Polym. 18 (80) | PAG. 1 (2) | — | N-methylpyrrolidone (0.05) | — | PGMEA (530) |
| CE5 | Poly. 9 (80) | PAG. 1 (1) PAG. 12 (2) | — | triethanolamine (0.1) 1,8-diazabicycloundecene (0.05) | — | PGMEA (530) |

Note:
The abbreviations under the heading of "solvent" have the following meaning.
DGLM: 2-methoxy ethyl ether
EIPA: 1-ethoxy-2-propanol

TABLE 4-continued

| | | | Resist composition (pbw in parentheses) | | | |
|---|---|---|---|---|---|---|
| No. | Base resin | Photoacid generator | Dissolution controller | Basic compound | Other additive | Organic solvent |

EL/BA: a 85%/15% by weight mixture of ethyl lactate and butyl acetate
PGMEA: propylene glycol monomethyl ether acetate
PGMEA/EP: a 90%/10% by weight mixture of propylene glycol monomethyl ether acetate and ethyl pyruvate
PGMEA/CH: a 90%/10% by weight mixture of propylene glycol monomethyl ether acetate and cyclohexanone
PGMEA/EL: a 70%/30% by weight mixture of propylene glycol monomethyl ether acetate and ethyl lactate

TABLE 5

| | Sensitivity Eop (mJ/cm$^2$) | Resolution ($\mu$m) | | Profile | Heat resistance |
|---|---|---|---|---|---|
| Example | | No PED | PED 2 hr. | no PED/PED 2 hr. | |
| 1 | 24.0 | 0.20 | 0.20 | rectangular | ○ |
| 2 | 28.0 | 0.20 | 0.20 | rectangular | ○ |
| 3 | 32.0 | 0.20 | 0.20 | rectangular | ○ |
| 4 | 30.0 | 0.18 | 0.18 | rectangular | ○ |
| 5 | 35.0 | 0.18 | 0.18 | rectangular | ○ |
| 6 | 25.0 | 0.18 | 0.18 | rectangular | ○ |
| 7 | 18.0 | 0.18 | 0.18 | rectangular | ○ |
| 8 | 31.0 | 0.18 | 0.18 | rectangular | ○ |
| 9 | 30.0 | 0.18 | 0.18 | rectangular | ○ |
| 10 | 26.0 | 0.18 | 0.18 | rectangular | ○ |
| 11 | 20.0 | 0.18 | 0.18 | rectangular | ○ |
| 12 | 24.0 | 0.18 | 0.18 | rectangular | ○ |
| 13 | 25.0 | 0.18 | 0.18 | rectangular | ○ |
| 14 | 22.0 | 0.18 | 0.18 | rectangular | ○ |
| 15 | 23.0 | 0.20 | 0.20 | sl. forward tapered | ○ |
| 16 | 24.0 | 0.20 | 0.20 | sl. forward tapered | ○ |
| 17 | 23.0 | 0.20 | 0.20 | sl. forward tapered | ○ |
| 18 | 24.0 | 0.20 | 0.20 | sl. forward tapered | ○ |
| 19 | 19.0 | 0.18 | 0.18 | rectangular | ○ |
| 20 | 20.0 | 0.18 | 0.18 | rectangular | ○ |
| 21 | 20.0 | 0.16 | 0.18 | rectangular | ○ |
| 22 | 21.0 | 0.18 | 0.18 | rectangular | ○ |
| 23 | 28.0 | 0.20 | 0.20 | rectangular | ○ |
| 24 | 30.0 | 0.20 | 0.20 | rectangular | ○ |
| 25 | 50.0 | 0.20 | 0.20 | rectangular | ○ |
| 26 | 24.0 | 0.18 | 0.18 | rectangular | ○ |
| 27 | 23.0 | 0.18 | 0.18 | rectangular | ○ |

TABLE 6

| Comparative Example | Sensitivity Eop (mJ/cm$^2$) | Resolution ($\mu$m) | | Profile no PED/ PED 2 hr. | Heat resistance |
|---|---|---|---|---|---|
| | | No PED | PED 2 hr. | | |
| 1 | 20.0 | 0.22 | 0.20 | rectangular/ reverse tapered | X |
| 2 | 22.0 | 0.22 | not resolved | rectangular/ not resolved | X |
| 3 | 21.0 | 0.22 | 0.26 | rectangular/ T-top | X |
| 4 | 17.0 | 0.24 | 0.20 | rectangular/ reverse tapered | ○ |
| 5 | 30.0 | 0.18 | 0.24 | rectangular/ reverse tapered | ○ |

Additionally, Surfynol 82 of the structural formula shown below was added to the resist compositions of Examples 21 to 24 in an amount of 0.05% by weight of the composition. The Surfynol-containing compositions and the resist compositions of Comparative Examples 6 to 9 were allowed to stand and observed whether or not particles (foreign matter) increased as a rating of storage stability. The test was an accelerated test of storage at 40° C. for one month. Using a counter KL-20A (Rion K.K.) for counting the number of particles in liquid, particles having a particle size of 0.3 $\mu$m were monitored. The results are shown in Table 7.

Surfynol 104

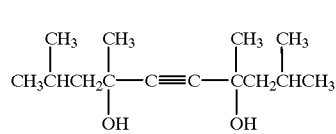

TABLE 7

| | Count of particles per ml | |
|---|---|---|
| | Immediately after | after 1 month |
| Example | | |
| 21 | 5 | 26 |
| 22 | 6 | 33 |
| 23 | 6 | 13 |
| 24 | 4 | 10 |
| Comparative Example | | |
| 6 | 5 | 7 |
| 7 | 5 | 6 |
| 8 | 6 | 6 |
| 9 | 4 | 5 |

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A polymer having at least one acid labile group and crosslinked within a molecule and/or between molecules with a crosslinking group having a C—O—C linkage, the polymer having a weight average molecular weight of 1,000 to 500,000,
    said polymer having recurring units of the following general formula (3),
    said crosslinking being through a mechanism by which hydrogen atoms are eliminated from phenolic hydroxyl groups represented by R to leave oxygen atoms which are connected by a crosslinking group having a C—O—C linkage of the following general formula (4a) or (4b), the amount of said acid labile group and said crosslinking group combined is on the average more than 0 mol % to 80 mol % of the entire hydrogen atoms of phenolic hydroxyl groups in formula (3), (3)

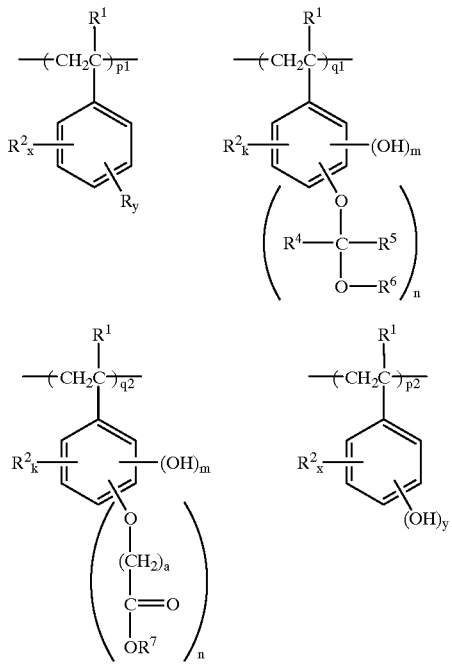

wherein R is a hydroxyl group or $OR^3$ group, at least one of R groups is a hydroxyl group, $R^1$ is a hydrogen atom or methyl group, $R^2$ is a normal, branched or cyclic alkyl group having 1 to 8 carbon atoms, $R^3$ is an acid labile group, $R^4$ and $R^5$ each are a hydrogen atom or normal, branched or cyclic alkyl group having 1 to 8 carbon atoms, $R^6$ is a monovalent hydrocarbon group of 1 to 18 carbon atoms which may have a hetero atom, or $R^4$ and $R^5$, $R^4$ and $R^6$, and/or $R^5$ and $R^6$, taken together, may form a ring, with the proviso that $R^4$, $R^5$ and $R^6$ each are a normal or branched alkylene having 1 to 8 carbon atoms when they form a ring, $R^7$ is a tertiary alkyl group having 4 to 12 carbon atoms, letters p1 and p2 each are a positive number, q1 is a positive number, q2 is 0 or a positive number, satisfying $0<p1/(p1+q1+p2)\leq 0.8$, $0<q1/(p1+q1+q2+p2)\leq 0.8$, $0\leq q2/(p1+q1+q2+p2)\leq 0.8$, and $p1+q1+q2+p2=1$, a is 0 or a positive integer of 1 to 6, letter x is 0 or a positive integer and y is a positive integer satisfying $x+y\leq 5$, letter k is 0 or a positive integer, m is 0 or a positive integer, and n is 0 or a positive integer satisfying $k+m+n\leq 5$, (4a)

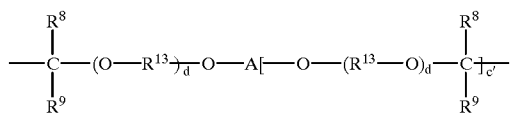

-continued (4b)

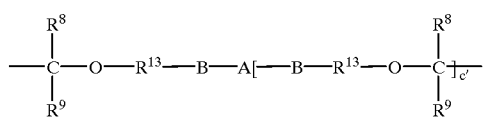

wherein $R^8$ and $R^9$ each are a hydrogen atom or normal, branched or cyclic alkyl group having 1 to 8 carbon atoms, or $R^8$ and $R^9$, taken together, may form a ring, with the proviso that $R^8$ and $R^9$ each are a normal or branched alkylene group having 1 to 8 carbon atoms when they form a ring, $R^{13}$ is a normal or branched alkylene group having 1 to 10 carbon atoms, A is a c-valent aliphatic saturated hydrocarbon, alicyclic saturated hydrocarbon, aromatic hydrocarbon or heterocyclic group having 1 to 50 carbon atoms, which may have an intervening hetero atom and in which some of the hydrogen atoms attached to carbon atoms may be replaced by hydroxyl groups, carboxyl groups, carbonyl groups or fluorine atoms, B is —CO—O—, —NHCO—O— or —NHCONH—, letter c is an integer of 2 to 8, c' is an integer of 1 to 7, and d is 0 or an integer of 1 to 10, $R^4$ being different from $R^8$ and $R^9$, and $R^5$ being identical with or different from $R^8$ and $R^9$.

2. The polymer of claim 1, wherein $R^4$ is an ethyl group and $R^8$ is a methyl group.

3. The polymer of claim 1, wherein $R^5$ and $R^9$ each are a hydrogen atom.

4. The polymer of claim 1, wherein $R^4$ is connected with $R^5$ to form a hydropyranyl group with the carbon atom to which $R^4$ and $R^5$ are connected, and $R^8$ is a methyl group.

5. A chemically amplified positive resist composition comprising (A) an organic solvent, (B) a base resin in the form of a polymer having at least one acid labile group and crosslinked within a molecule and/or between molecules with a crosslinking group having a C—O—C linkage, the polymer having a weight average molecular weight of 1,000 to 500,000, and (C) a photoacid generator, said base resin being a polymer having recurring units of the following general formula (3), said crosslinking of the base resin being by a mechanism wherein hydrogen atoms are eliminated from phenolic hydroxyl groups represented by R to leave oxygen atoms which are connected by a crosslinking group having a C—O—C linkage of the following general formula (4a) or (4b), the amount of said acid labile group and said crosslinking group combined is on the average more than 0 mol % to 80 mol % of the entire hydrogen atoms of phenolic hydroxyl groups in formula (3),

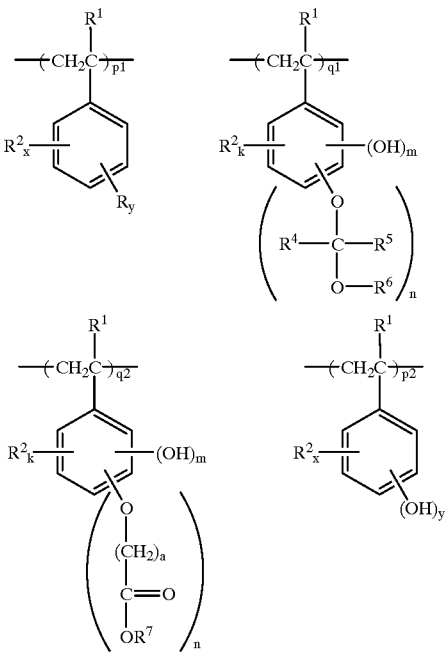

(3)

wherein R is a hydroxyl group or $OR^3$ group, at least one of R groups is a hydroxyl group, $R^1$ is a hydrogen atom or methyl group, $R^2$ is a normal, branched or cyclic alkyl group having 1 to 8 carbon atoms, $R^3$ is a n acid labile group, $R^4$ and $R^5$ each are a hydrogen atom or normal, branched or cyclic alkyl group having 1 to 8 carbon atoms, $R^6$ is a monovalent hydrocarbon group of 1 to 18 carbon atoms which may have a hetero atom, or $R^4$ and $R^5$, $R^4$ and $R^6$, and/or $R^5$ and $R^6$, taken together, may form a ring, with the proviso that $R^4$, $R^5$ and $R^6$ each are a normal or branched alkylene having 1 to 8 carbon atoms when they form a ring, $R^7$ is a tertiary alkyl group having 4 to 12 carbon atoms, letters p1 and p2 each are a positive number, q1 is a positive number, q2 is 0 or a positive number, satisfying $0<p1/(p1+q1+q2+p2)\leq0.8, 0<q1/(p1+q1+q2+p2)\leq0.8, 0\leq q2/(p1+q1+q2+p2)\leq0.8$, and $p1+q1+q2+p2=1$, a is 0 or a positive integer of 1 to 6, letter x is 0 or a positive integer and y is a positive integer satisfying $x+y\leq5$, letter k is 0 or a positive integer, m is 0 or a positive integer, and n is 0 or a positive integer satisfying $k+m+n\leq5$,

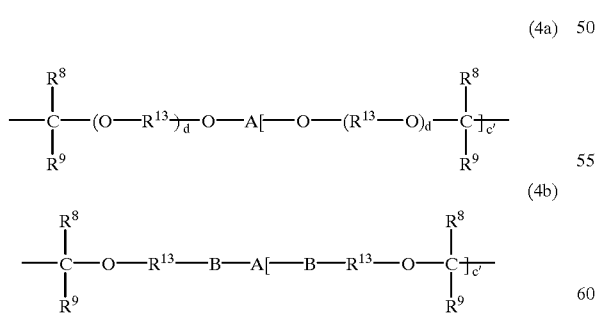

wherein $R^8$ and $R^9$ each are a hydrogen atom or normal, branched or cyclic alkyl group having 1 to 8 carbon atoms, or $R^8$ and $R^9$, taken together, may form a ring, with the proviso that $R^8$ and $R^9$ each are a normal or branched alkylene group having 1 to 8 carbon atoms when they form a ring, $R^{13}$ is a normal or branched alkylene group having 1 to 10 carbon atoms, A is a c-valent aliphatic saturated hydrocarbon, alicyclic saturated hydrocarbon, aromatic hydrocarbon or heterocyclic group having 1 to 50 carbon atoms, which may have an intervening hetero atom and in which some of the hydrogen atoms attached to carbon atoms may be replaced by hydroxyl groups, carboxyl groups, carbonyl groups or fluorine atoms, B is —CO—O—, —NHCO—O— or —NHCONH—, letter c is an integer of 2 to 8, c' is an integer of 1 to 7, and d is 0 or an integer of 1 to 10, $R^4$ being different from $R^8$ and $R^9$, and $R^5$ being identical with or different from $R^8$ and $R^9$.

6. The resist composition of claim 5, wherein $R^4$ is an ethyl group and $R^8$ is a methyl group.

7. The resist composition of claim 6, wherein $R^1$ and $R^9$ each are a hydrogen atom.

8. The resist composition of claim 5, wherein $R^4$ is connected with $R^5$ to form a hydropyranyl group with the carbon atom to which $R^4$ and $R^5$ are connected, and $R^8$ is a methyl group.

9. The resist composition of claim 5, wherein component (C) is an onium salt, a diazomethane derivative or a mixture thereof.

10. The resist composition of claim 5 which contains 200 to 1000 parts by weight of the solvent (A), 100 parts by weight of the base resin (B), and 0.5 to 15 parts by weight of the photoacid generator (C).

11. The resist composition of claim 5 which further comprises (D) a basic compound.

12. The resist composition of claim 11, wherein the basic compound is a primary, secondary and tertiary aliphatic amine, hybrid amine, aromatic amine, heterocyclic amine, carboxyl-bearing nitrogenous compound, sulfonyl-bearing nitrogenous compound, hydroxyl-bearing nitrogenous compound, hydroxyphenyl-bearing nitrogenous compound, alcoholic nitrogenous compound, amide derivative or imide derivative.

13. The resist composition of claim 5 which further comprises (F) another base resin in the form of a polymer having recurring units of the following general formula (1), wherein the hydrogen atom of a phenolic hydroxyl group is partially replaced by at least one acid labile group in an average proportion of more than 0 mol % to 80 mol % of the entire phenolic hydroxyl groups, the polymer having a weight average molecular weight of 3,000 to 300,000,

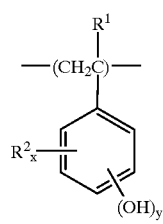

(1)

wherein $R^1$ is a hydrogen atom or methyl group, $R^2$ is a normal, branched or cyclic alkyl group having 1 to 8 carbon atoms, letter x is 0 or a positive integer, and y is a positive integer satisfying $x+y\leq5$.

14. The resist composition of claim 13, wherein component (F) is a polymer having recurring units represented by the following general formula (10) and having a weight average molecular weight of 3,000 to 300,000, (10)

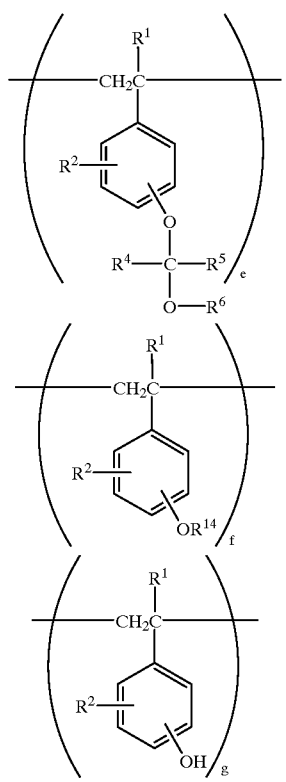

wherein $R^1$, $R^2$, $R^4$, $R^5$, and $R^6$ are as defined above, $R^{14}$ is an acid labile group different from —$CR^4R^5OR^6$, letters e and f each are 0 or a positive number, g is a positive number satisfying e+f+g=1, $0 \leq e/(e+f+g) \leq 0.5$ and $0.4 \leq g/(e+f+g) \leq 0.9$.

15. The resist composition of claim 5 which further comprises (G) a dissolution controller.

16. The resist composition of claim 5 which further comprises (H) a UV absorber.

17. The resist composition of claim 5 which further comprises (I) an acetylene alcohol derivative.

18. A method for forming a resist pattern comprising the steps of:

(i) applying a chemically amplified positive resist composition according to claim 5 onto a substrate, (ii) heat treating the coated film and then exposing it to actinic radiation having a wavelength of up to 300 nm or electron beams through a photo mask, and (iii) developing it with a developer after optionally heat treating the exposed film.

* * * * *